US008417531B2

(12) United States Patent
Kim et al.

(10) Patent No.: US 8,417,531 B2
(45) Date of Patent: Apr. 9, 2013

(54) METHODS AND APPARATUSES FOR ENCODING AND DECODING OBJECT-BASED AUDIO SIGNALS

(75) Inventors: Dong Soo Kim, Seoul (KR); Hee Suk Pang, Seoul (KR); Jae Hyun Lim, Seoul (KR); Sung Yong Yoon, Seoul (KR); Hyun Kook Lee, Kyunggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/026,190

(22) Filed: Feb. 11, 2011

(65) Prior Publication Data

US 2011/0200197 A1 Aug. 18, 2011

Related U.S. Application Data

(63) Continuation of application No. 12/438,938, filed as application No. PCT/KR2008/000885 on Feb. 14, 2008.

(60) Provisional application No. 60/948,373, filed on Jul. 6, 2007, provisional application No. 60/947,620, filed on Jul. 2, 2007, provisional application No. 60/924,027, filed on Apr. 27, 2007, provisional application No. 60/907, 689, filed on Apr. 13, 2007, provisional application No. 60/903,818, filed on Feb. 28, 2007, provisional application No. 60/901,642, filed on Feb. 16, 2007, provisional application No. 60/901,089, filed on Feb. 14, 2007.

(51) Int. Cl.

| | |
|---|---|
| ***G10L 19/00*** | (2006.01) |
| ***G10L 19/14*** | (2006.01) |
| ***H04R 5/00*** | (2006.01) |
| ***H03G 3/00*** | (2006.01) |
| ***H03G 5/00*** | (2006.01) |

(52) U.S. Cl.
USPC ................ 704/500; 381/17; 381/61; 381/98; 704/205

(58) Field of Classification Search ........................ None
See application file for complete search history.

(56) References Cited

U.S. PATENT DOCUMENTS

| | | |
|---|---|---|
| 3,882,280 A | 5/1975 | Goutmann |
| 5,247,597 A | 9/1993 | Blacha et al. |

(Continued)

FOREIGN PATENT DOCUMENTS

| | | |
|---|---|---|
| CA | 2 572 989 | 1/2006 |
| CN | 101506875 | 8/2009 |

(Continued)

OTHER PUBLICATIONS

Notice of Allowance, Korean Appln. No. 10-2009-7001828, dated Jun. 27, 2011, 3 pages with English translation.

(Continued)

*Primary Examiner* — Brian Albertalli
(74) *Attorney, Agent, or Firm* — Fish & Richardson P.C.

(57) ABSTRACT

An audio decoding method and apparatus and an audio encoding method and apparatus which can efficiently process object-based audio signals are provided. The audio decoding method includes receiving a downmix signal and object-based side information, the downmix signal comprising at least two downmix channel signals; extracting gain information from the object-based side information and generating modification information for modifying the downmix channel signals on a channel-by-channel basis based on the gain information; and modifying the downmix channel signals by applying the modification information to the downmix channel signals.

7 Claims, 33 Drawing Sheets

U.S. PATENT DOCUMENTS

| | | | |
|---|---|---|---|
| 5,956,674 | A | 9/1999 | Smyth et al. |
| 6,849,794 | B1 | 2/2005 | Lau et al. |
| 7,672,744 | B2 | 3/2010 | Oh et al. |
| 2002/0041557 | A1 | 4/2002 | Heo |
| 2002/0061188 | A1 | 5/2002 | Heo |
| 2002/0064373 | A1 | 5/2002 | Heo |
| 2003/0167173 | A1 | 9/2003 | Levy et al. |
| 2004/0138895 | A1 | 7/2004 | Lokhoff et al. |
| 2004/0170393 | A1 | 9/2004 | Heo |
| 2005/0120870 | A1 | 6/2005 | Ludwig |
| 2006/0002572 | A1 | 1/2006 | Smithers et al. |
| 2006/0167695 | A1 | 7/2006 | Spille et al. |
| 2008/0049943 | A1 | 2/2008 | Faller et al. |
| 2008/0269929 | A1 | 10/2008 | Oh et al. |
| 2009/0067634 | A1 | 3/2009 | Oh et al. |
| 2009/0125313 | A1 | 5/2009 | Hellmuth et al. |
| 2009/0125314 | A1 | 5/2009 | Hellmuth et al. |
| 2010/0094631 | A1 | 4/2010 | Engdegard et al. |
| 2010/0174548 | A1 | 7/2010 | Beack et al. |
| 2011/0013790 | A1 | 1/2011 | Hilpert et al. |
| 2011/0022402 | A1 | 1/2011 | Engdegard et al. |

FOREIGN PATENT DOCUMENTS

| | | |
|---|---|---|
| CN | 101529504 | 9/2009 |
| EP | 0 857 375 | 8/1998 |
| EP | 1 278 184 | 1/2003 |
| EP | 1691348 | 8/2006 |
| EP | 2038878 | 3/2009 |
| EP | 2082397 | 7/2009 |
| EP | 2100297 | 9/2009 |
| JP | 16-064363 | 2/2004 |
| JP | 2009-518725 | 5/2009 |
| KR | 10-2004-0101256 | 12/2004 |
| KR | 10-2007-0011100 | 1/2007 |
| RU | 2185024 | 7/2002 |
| RU | 2221329 | 1/2004 |
| RU | 2224302 | 2/2004 |
| RU | 2004133032 | 4/2005 |
| RU | 2005104123 | 7/2005 |
| TW | 384467 | 3/2000 |
| TW | 412719 | 11/2000 |
| TW | 591606 | 6/2004 |
| TW | I231471 | 4/2005 |
| TW | I237806 | 8/2005 |
| WO | 03/090208 | 10/2003 |
| WO | 2004080125 | 9/2004 |
| WO | 2006/016735 | 2/2006 |
| WO | 2006/048203 | 5/2006 |
| WO | 2006/060279 | 6/2006 |
| WO | 2006/089684 | 8/2006 |
| WO | 2007004828 | 1/2007 |
| WO | 2007004830 | 1/2007 |
| WO | 2007/089131 | 8/2007 |
| WO | WO 2007/091870 | 8/2007 |
| WO | 2007/128523 | 11/2007 |
| WO | WO 2008/00362 | 1/2008 |
| WO | 2008/039038 | 4/2008 |

OTHER PUBLICATIONS

Office Action, U.S. Appl. No. 12/438,928, dated Oct. 27, 2011, 7 pages.

Office Action, U.S. Appl. No. 12/438,929, dated Oct. 26, 2011, 17 pages.

Aoki et al., "Audio Metadata in Radio Broadcasting," AES 25th International Conference, London, United Kingdom, 2004, Jun. 17-19, 10 pages.

Office Action, U.S Appl. No. 13/026,172, dated Dec. 8, 2011, 14 pages.

Breebaart, J. et al., "MPEG Spatial Audio Coding/MPEG Surround: Overview and Current Status", Audio Engineering Society Convention Paper, Oct. 2005, New York, 17 pages.

Breebaart, J. et al., "Multi-Channel Goes Mobile: MPEG Surround Binaural Rendering", AES 29$^{th}$ International Conference, Sep. 2006, 13 pages.

"Concepts of Object-Oriented Spatial Audio Coding", (Jul. 21, 2006), 8 pages.

"Draft Call for Proposals on Spacial Audio Object Coding" ITU Study Group 16—Video Coding Experts Group—ISO/IEC MPEG & ITU-T VCEG (ISO/IEC JTC1/SC29/WG11 and ITU-T SG16 Q6), No. N8639, Oct. 27, 2006, XP030015133 (16 pages).

Engdegard J et al: "Spatial Audio Object Coding (SAOC)—The Upcoming MPEG Standard on Parametric Object Based Audio Coding" 124th AES Convention, Audio Engineering Society, Paper 7377, May 17, 2008 ~ May 20, 2008, pp. 1-15, XP002541458.

Supp. European Search Report for Application No. EP 07 83 3115, dated Jul. 24, 2009, 5 pages.

Supp. European Search Report for Application No. EP 07 83 3116, dated Jul. 28, 2009, 6 pages.

European Search Report for Application No. 08712511, dated Dec. 17, 2009, 9 pages.

Office Action, Canadian Appln. No. 2645913, dated Dec. 31, 2010, 3 pages.

Notice of Allowance, Russian Application No. 2008140142, mailed Jun. 8, 2010, 15 pages (with English translation).

Faller, C., "Coding of Spatial Audio Compatible with Different Playback Formats", Audio Engineering Society Convention Paper, 117$^{th}$ Convention, Oct. 2004, SF, 12 pages.

Faller, C. and Baumgarte, F., (2003) Binaural Cue Coding—Part II: Schemes and Applications, IEEE Transactions on Speech and Audio Processing, 11(6):520-531.

Herre J et al: "The Reference Model Architecture, for Mpeg Spatial Audio Coding" Audio Engineering Society Convention Paper, New York, NY, US May 28, 2005, pp. 1-13, XP009059973.

Herre, J. and Disch, S., (2007) "New Concepts in Parametric Coding of Spatial Audio: From Sac to Saoc", IEEE pp. 1894-1897.

International Search REPort based on International Application No. PCT/KR2007/004800, dated Jan. 16, 2008, 3 pages.

International Search REPort based on International Application No. PCT/KR2007/004803, dated Jan. 25, 2008, 3 pages.

International Search REPort based on International Application No. PCT/KR2007/004801, dated Jan. 28, 2008, 3 pages.

International Search REPort based on International Application No. PCT/KR2007/005969, dated Mar. 31, 2008, 3 pages.

International Search REPort based on International Application No. PCT/KR2008/000883 dated Jun. 18, 2008, 6 pages.

Joint Video Team: "Concepts of Object-Oriented Spatial Audio Coding" Joint Video Team (JVT) of ISO/IEC MPEG & ITU-T VCEG (ISO/IEC JTC1/SC29/WG11 and ITU-T SG16 Q6), No. N8329, Jul. 21, 2006, XP030014821.

Moon, H., et al., "A Multi-Channel Audio Compression Method with Virtual Source Location Information for MPEG-4 SAC", IEEE Transactiosn on Consumer Electronics, 2005, 7 pages.

Office Action for European App. Ser. No. 08 712 512.6, dated Oct. 12, 2010, 6 pages.

Russian Notice of Allowance for Application 2008140170 dated Jan. 19, 2010, 5 pages.

EP SN 08712513.4, EP Search Report dated Sep. 14, 2010, (4) pages.

Scheirer E. et al., "Audio BIFS: Describing Audio Scenes with the MPEG-4 Multimedia Standard", IEEE Transactions on Multimedia, vol. 1, No. 3, Sep. 1999, 14 pages.

Supplementary European Search Report, dated Oct. 19, 2009, corresponding to European Application No. EP 07834266.4, 7 pages.

Villemoes et al., (2006) "MPEG Surround: The Forthcoming ISO Standard for Spatial Audio Coding", Proceedings of the International AES Conference pp. 1-18.

Office Action, Chinese Appln. No. 200880000382.0, dated Apr. 26, 2011, 13 pages with English translation.

Engdegard et al., "Proposed SAOC Working Draft Document," MPEG Meeting, International Organisation for Standardisation, (Motion Picture Expert Group or ISO/IEC JTC1/SC29/WG11), No. M14989, Shenzhen, China, Oct. 22-26, 2007, 82 pages.

European Office Action, European Appln No. 08712511.8, dated Aug. 7, 2012, 5 pages.
"Call for Proposals on Spatial Audio Object Coding," MPEG Meeting, International Organisation for Standardisation, (Motion Picture Expert Group or ISO/IEC JTC1/SC29/WG11), No. N8853, Marrakech, Morocco, Jan. 15-19, 2007, 18 pages.
Faller, "Parametric Joint-Coding of Audio Sources," Convention Paper, AES 120th Convention, Paris, France, May 20-23, 2006, pp. 1-12.
Yang et al., "High-Fidelity Multichannel Audio Coding With Karhunen-Loève Transform," IEEE Transactions on Speech and Audio Processing, Jul. 2003, vol. 11, No. 4, pp. 365-380.
Office Action in Taiwan Application No. 97105206, dated Aug. 27, 2012, 6 pages.
European Office Action in Application No. 08712513, dated Aug. 28, 2012, 5 pages.
"Draft Spatial Audio Object Coding Evaluation Procedures and Criterion", 79. MPEG Meeting;Jan. 15, 2007-Jan. 19, 2007; Marrakech; (Motion Picture Expert Group or ISO/IEC JTC1/SC29/WG11), No. N8854, Jan. 19, 2007, XP030015348.
Jonas Engdegard et al: "CT/Fraunhofer IIS/Phillips Submission to the SAOC CfP", 81. MPEG Metting; Jun. 2, 2007-Jun. 6, 2007; Lausanne; (Motion Picture Expert Group or ISO/IEC JTC1/SC29/WG11), No. M14696, Jun. 27, 2007, XP030043316.
Anonymous: "WD on ISO/IEC 23003-2:200x, SAOC text and reference software", 82. MPEG Meeting; Oct. 22, 2007-Oct. 26, 2007; Shenzhen; (Motion PictureExpert Group or ISO/IEC JTC1/SC29/WG11), No. N9517, Nov. 29, 2007, XP030016012.

METHODS AND APPARATUSES FOR ENCODING AND DECODING OBJECT-BASED AUDIO SIGNALS

CROSS-REFERENCE TO RELATED APPLICATIONS

This application is a continuation of, and claims priority to, pending U.S. application Ser. No. 12/438,938, filed Sep. 22, 2009, entitled "Methods and Apparatuses for Encoding and Decoding Object-Based Audio Signals," which is a U.S. national phase application under 35 U.S.C. §371(c) of International Application No. PCT/KR2008/000885, filed Feb. 14, 2008, which claims the benefit of U.S. Provisional Application No. 60/901,089, filed Feb. 14, 2007, U.S. Provisional Application No. 60/901,642, filed Feb. 16, 2007, U.S. Provisional Application No. 60/903,818, filed Feb. 28, 2007, U.S. Provisional Application No. 60/907,689, filed Apr. 13, 2007, U.S. Provisional Application No. 60/924,027, filed Apr. 27, 2007, U.S. Provisional Application No. 60/947,620, filed Jul. 2, 2007, and U.S. Provisional Application No. 60/948,373, filed Jul. 6, 2007, the entire disclosures of each of which are incorporated herein by reference.

TECHNICAL FIELD

The present invention relates to an audio encoding method and apparatus and an audio decoding method and apparatus in which object-based audio signals can be effectively processed by performing encoding and decoding operations.

BACKGROUND ART

In general, in multi-channel audio encoding and decoding techniques, a number of channel signals of a multi-channel signal are downmixed into fewer channel signals, side information regarding the original channel signals is transmitted, and a multi-channel signal having as many channels as the original multi-channel signal is restored.

Object-based audio encoding and decoding techniques are basically similar to multi-channel audio encoding and decoding techniques in terms of downmixing several sound sources into fewer sound source signals and transmitting side information regarding the original sound sources. However, in object-based audio encoding and decoding techniques, object signals, which are basic elements (e.g., the sound of a musical instrument or a human voice) of a channel signal, are treated the same as channel signals in multi-channel audio encoding and decoding techniques and can thus be coded.

In other words, in object-based audio encoding and decoding techniques, object signals are deemed entities to be coded. In this regard, object-based audio encoding and decoding techniques are different from multi-channel audio encoding and decoding techniques in which a multi-channel audio coding operation is performed simply based on inter-channel information regardless of the number of elements of a channel signal to be coded.

DISCLOSURE

Technical Problem

The present invention provides an audio encoding method and apparatus and an audio decoding method and apparatus in which audio signals can be encoded or decoded so that the audio signals can be applied to various environments.

Technical Solution

According to an aspect of the present invention, there is provided an audio decoding method including receiving a downmix signal and object-based side information, the downmix signal including at least two downmix channel signals; extracting gain information from the object-based side information and generating modification information for modifying the downmix channel signals on a channel-by-channel basis based on the gain information; and modifying the downmix channel signals by applying the modification information to the downmix channel signals.

According to another aspect of the present invention, there is provided an audio encoding method including: generating a downmix signal by downmixing an object signal, the downmix signal including at least two downmix channel signals; extracting object-related information regarding the object signal and generating object-based side information based on the object-related information; and inserting gain information for modifying the downmix channel signals on a channel-by-channel basis into the object-based side information.

According to another aspect of the present invention, there is provided an audio decoding apparatus including: a demultiplexer configured to extract a downmix signal and object-based side information from an input audio signal, the downmix signal including at least two downmix channel signals; and a transcoder configured to generate modification information for modifying the downmix channel signals on a channel-by-channel basis based on gain information extracted from the object-based side information and modifies the downmix channel signals by applying the modification information to the downmix channel signals.

According to another aspect of the present invention, there is provided a computer-readable recording medium having recorded thereon a computer program for executing an audio decoding method, the audio decoding method including receiving a downmix signal and object-based side information, the downmix signal including at least two downmix channel signals; extracting gain information from the object-based side information and generating modification information for modifying the downmix channel signals on a channel-by-channel basis based on the gain information; and modifying the downmix channel signals by applying the modification information to the downmix channel signals.

According to another aspect of the present invention, there is provided a computer-readable recording medium having recorded thereon a computer program for executing an audio encoding method, the audio encoding method including: generating a downmix signal by downmixing an object signal, the downmix signal including at least two downmix channel signals; extracting object-related information regarding the object signal and generating object-based side information based on the object-related information; and inserting gain information for modifying the downmix channel signals on a channel-by-channel basis into the object-based side information

BEST MODE

The present invention will hereinafter be described in detail with reference to the accompanying drawings in which exemplary embodiments of the invention are shown.

An audio encoding method and apparatus and an audio decoding method and apparatus according to the present invention may be applied to object-based audio processing operations, but the present invention is not restricted to this. In other words, the audio encoding method and apparatus and the audio decoding method and apparatus may be applied to various signal processing operations other than object-based audio processing operations.

Figure 1:
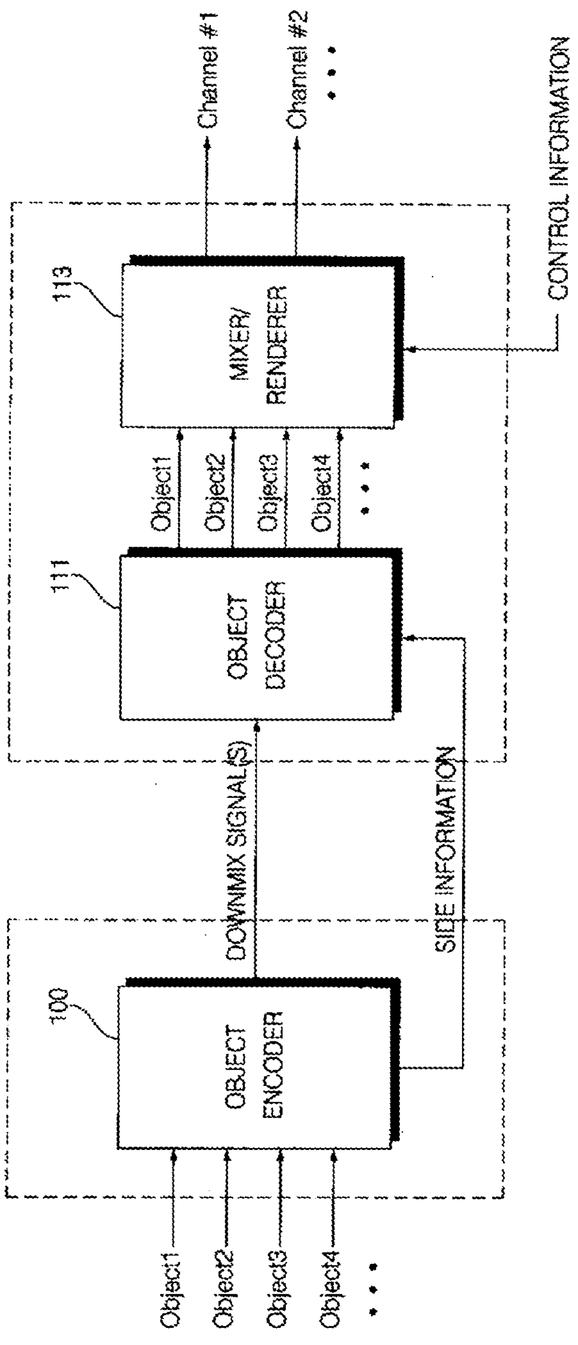
FIG. 1 illustrates a block diagram of a typical object-based audio encoding/decoding system.

FIG. 1 illustrates a block diagram of a typical object-based audio encoding/decoding system. In general, audio signals input to an object-based audio encoding apparatus do not correspond to channels of a multi-channel signal but are independent object signals. In this regard, an object-based audio encoding apparatus is differentiated from a multi-channel audio encoding apparatus to which channel signals of a multi-channel signal are input.

For example, channel signals such as a front left channel signal and a front right channel signal of a 5.1-channel signal may be input to a multi-channel audio signal, whereas object signals such as a human voice or the sound of a musical instrument (e.g., the sound of a violin or a piano) which are smaller entities than channel signals may be input to an object-based audio encoding apparatus.

Referring to FIG. 1, the object-based audio encoding/decoding system includes an object-based audio encoding apparatus and an object-based audio decoding apparatus. The object-based audio encoding apparatus includes an object encoder 100, and the object-based audio decoding apparatus includes an object decoder 111 and a mixer/renderer 113.

The object encoder 100 receives N object signals, and generates an object-based downmix signal with one or more channels and side information including a number of pieces of information extracted from the N object signals such as energy difference information, phase difference information, and correlation information. The side information and the object-based downmix signal are incorporated into a single bitstream, and the bitstream is transmitted to the object-based decoding apparatus.

The side information may include a flag indicating whether to perform channel-based audio coding or object-based audio coding, and thus, it may be determined whether to perform channel-based audio coding or object-based audio coding based on the flag of the side information. The side information may also include energy information, grouping information, silent period information, downmix gain information and delay information regarding object signals.

The side information and the object-based downmix signal may be incorporated into a single bitstream, and the single bitstream may be transmitted to the object-based audio decoding apparatus.

The object decoder 111 receives the object-based downmix signal and the side information from the object-based audio encoding apparatus, and restores object signals having similar properties to those of the N object signals based on the object-based downmix signal and the side information. The object signals generated by the object decoder 111 have not yet been allocated to any position in a multi-channel space. Thus, the mixer/renderer 113 allocates each of the object signals generated by the object decoder 111 to a predetermined position in a multi-channel space and determines the levels of the object signals so that the object signals so that the object signals can be reproduced from respective corresponding positions designated by the mixer/renderer 113 with respective corresponding levels determined by the mixer/renderer 113. Control information regarding each of the object signals generated by the object decoder 111 may vary over time, and thus, the spatial positions and the levels of the object signals generated by the object decoder 111 may vary according to the control information.

Figure 2:
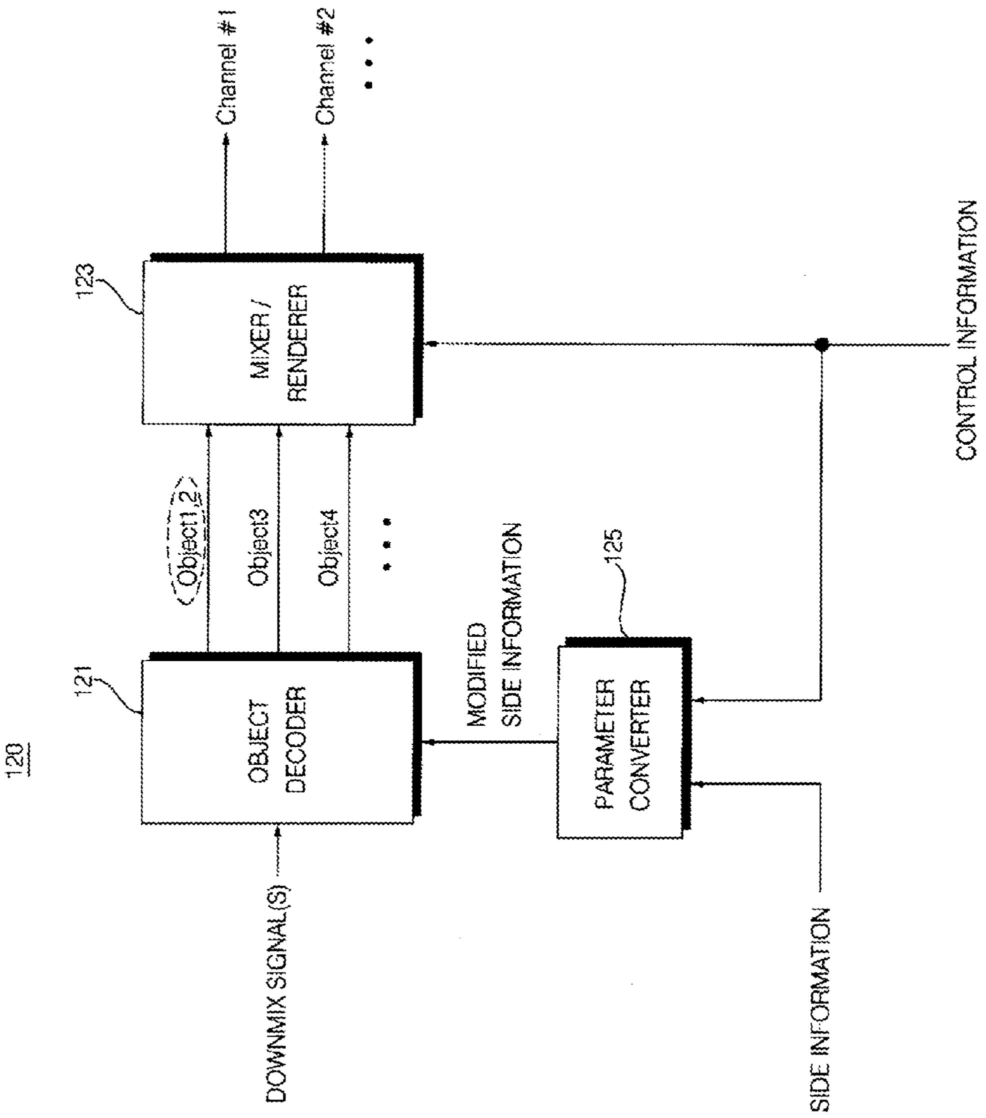
FIG. 2 illustrates a block diagram of an audio decoding apparatus according to a first embodiment of the present invention.

FIG. 2 illustrates a block diagram of an audio decoding apparatus 120 according to a first embodiment of the present invention. Referring to FIG. 2, the audio decoding apparatus 120 may be able to perform adaptive decoding by analyzing control information.

Referring to FIG. 2, the audio decoding apparatus 120 includes an object decoder 121, a mixer/renderer 123, and a parameter converter 125. The audio decoding apparatus 120 may also include a demultiplexer (not shown) which extracts a downmix signal and side information from a bitstream input thereto, and this will apply to all audio decoding apparatuses according to other embodiments of the present invention.

The object decoder 121 generates a number of object signals based on a downmix signal and modified side information provided by the parameter converter 125. The mixer/renderer 123 allocates each of the object signals generated by the object decoder 121 to a predetermined position in a multi-channel space and determines the levels of the object signals generated by the object decoder 121 according to control information. The parameter converter 125 generates the modified side information by combining the side information and the control information. Then, the parameter converter 125 transmits the modified side information to the object decoder 121.

The object decoder 121 may be able to perform adaptive decoding by analyzing the control information in the modified side information.

For example, if the control information indicates that a first object signal and a second object signal are allocated to the same position in a multi-channel space and have the same level, a typical audio decoding apparatus may decode the first and second object signals separately, and then arrange them in a multi-channel space through a mixing/rendering operation.

On the other hand, the object decoder 121 of the audio decoding apparatus 120 learns from the control information in the modified side information that the first and second object signals are allocated to the same position in a multi-channel space and have the same level as if they were a single sound source. Accordingly, the object decoder 121 decodes the first and second object signals by treating them as a single sound source without decoding them separately. As a result, the complexity of decoding decreases. In addition, due to a decrease in the number of sound sources that need to be processed, the complexity of mixing/rendering also decreases.

The audio decoding apparatus 120 may be effectively used when the number of object signals is greater than the number of output channels because a plurality of object signals are highly likely to be allocated to the same spatial position.

Alternatively, the audio decoding apparatus 120 may be used when the first object signal and the second object signal are allocated to the same position in a multi-channel space but have different levels. In this case, the audio decoding apparatus 120 decode the first and second object signals by treating the first and second object signals as a single signal, instead of decoding the first and second object signals separately and transmitting the decoded first and second object signals to the mixer/renderer 123. More specifically, the object decoder 121 may obtain information regarding the difference between the levels of the first and second object signals from the control information in the modified side information, and decode the first and second object signals based on the obtained information. As a result, even if the first and second object signals have different levels, the first and second object signals can be decoded as if they were a single sound source.

Still alternatively, the object decoder 121 may adjust the levels of the object signals generated by the object decoder 121 according to the control information. Then, the object decoder 121 may decode the object signals whose levels are adjusted. Accordingly, the mixer/renderer 123 does not need to adjust the levels of the decoded object signals provided by the object decoder 121 but simply arranges the decoded object signals provided by the object decoder 121 in a multi-channel space. In short, since the object decoder 121 adjusts the levels of the object signals generated by the object decoder 121 according to the control information, the mixer/renderer 123 can readily arrange the object signals generated by the object decoder 121 in a multi-channel space without the need to additionally adjust the levels of the object signals generated by the object decoder 121. Therefore, it is possible to reduce the complexity of mixing/rendering.

According to the embodiment of FIG. 2, the object decoder of the audio decoding apparatus 120 can adaptively perform a decoding operation through the analysis of the control information, thereby reducing the complexity of decoding and the complexity of mixing/rendering. A combination of the above-described methods performed by the audio decoding apparatus 120 may be used.

Figure 3:
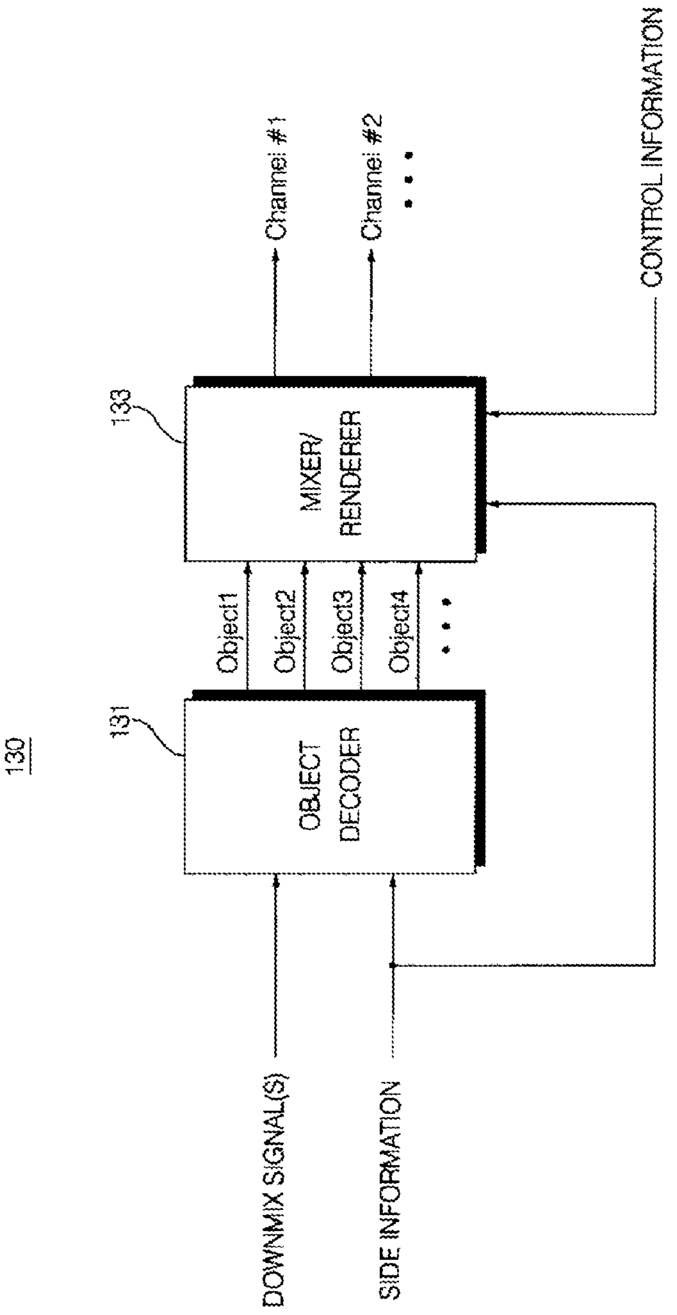
FIG. 3 illustrates a block diagram of an audio decoding apparatus according to a second embodiment of the present invention.

FIG. 3 illustrates a block diagram of an audio decoding apparatus 130 according to a second embodiment of the present invention. Referring to FIG. 3, the audio decoding apparatus 130 includes an object decoder 131 and a mixer/renderer 133. The audio decoding apparatus 130 is characterized by providing side information not only to the object decoder 131 but also to the mixer/renderer 133.

The audio decoding apparatus 130 may effectively perform a decoding operation even when there is an object signal corresponding to a silent period. For example, second through fourth object signals may correspond to a music play period during which a musical instrument is played, and a first object signal may correspond to a mute period during which only background music is played, and a first object signal may correspond to a silent period during which an accompaniment is played. In this case, information indicating which of a plurality of object signals corresponds to a silent period may be included in side information, and the side information may be provided to the mixer/renderer 133 as well as to the object decoder 131.

The object decoder 131 may minimize the complexity of decoding by not decoding an object signal corresponding to a silent period. The object decoder 131 sets an object signal corresponding to a value of 0 and transmits the level of the object signal to the mixer/renderer 133. In general, object signals having a value of 0 are treated the same as object signals having a value, other than 0, and are thus subjected to a mixing/rendering operation.

On the other hand, the audio decoding apparatus 130 transmits side information including information indicating which of a plurality of object signals corresponds to a silent period to the mixer/renderer 133 and can thus prevent an object signal corresponding to a silent period from being subjected to a mixing/rendering operation performed by the mixer/renderer 133. Therefore, the audio decoding apparatus 130 can prevent an unnecessary increase in the complexity of mixing/rendering.

Figure 4:
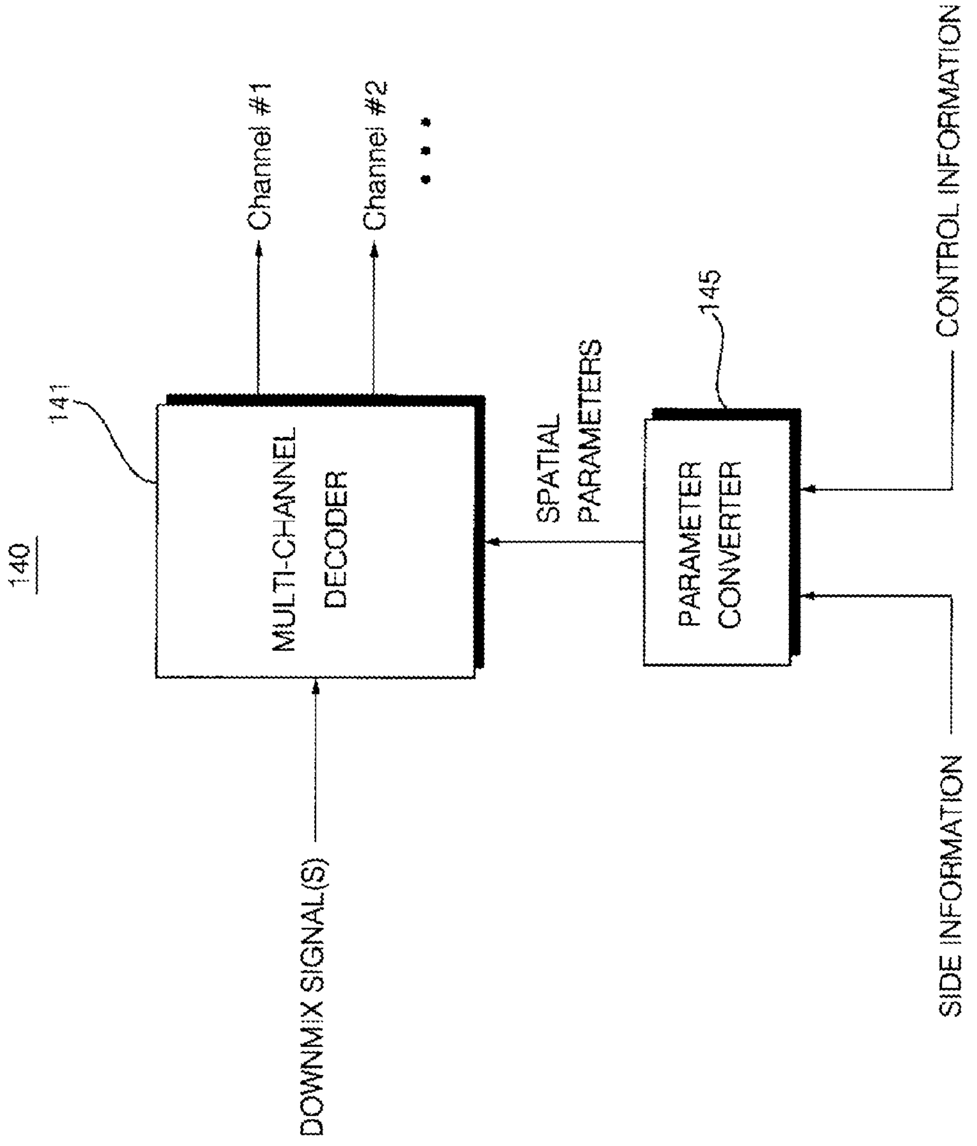
FIG. 4 illustrates a block diagram of an audio decoding apparatus according to a third embodiment of the present invention.

FIG. 4 illustrates a block diagram of an audio decoding apparatus 140 according to a third embodiment of the present invention. Referring to FIG. 4, the audio decoding apparatus 140 uses a multi-channel decoder 141, instead of an object decoder and a mixer/renderer, and decodes a number of object signals after the object signals are appropriately arranged in a multi-channel space.

More specifically, the audio decoding apparatus 140 includes the multi-channel decoder 141 and a parameter converter 145. The multi-channel decoder 141 generates a multi-channel signal whose object signals have already been arranged in a multi-channel space based on a down-mix signal and spatial parameter information, which is channel-based parameter information provided by the parameter converter 145. The parameter converter 145 analyzes side information and control information transmitted by an audio encoding apparatus (not shown), and generates the spatial parameter information based on the result of the analysis. More specifically, the parameter converter 145 generates the spatial parameter information by combining the side information and the control information which includes playback setup information and mixing information. That is, the parameter conversion 145 performs the conversion of the combination of the side information and the control information to spatial data corresponding to a One-To-Two (OTT) box or a Two-To-Three (TTT) box.

The audio decoding apparatus 140 may perform a multi-channel decoding operation into which an object-based decoding operation and a mixing/rendering operation are incorporated and may thus skip the decoding of each object signal. Therefore, it is possible to reduce the complexity of decoding and/or mixing/rendering.

For example, when there are 10 object signals and a multi-channel signal obtained based on the 10 object signals is to be reproduced by a 5.1 channel speaker system, a typical object-based audio decoding apparatus generates decoded signals respectively corresponding the 10 object signals based on a down-mix signal and side information and then generates a 5.1 channel signal by appropriately arranging the 10 object signals in a multi-channel space so that the object signals can become suitable for a 5.1 channel speaker environment. However, it is inefficient to generate 10 object signals during the generation of a 5.1 channel signal, and this problem becomes more severe as the difference between the number of object signals and the number of channels of a multi-channel signal to be generated increases.

On the other hand, in the embodiment of FIG. 4, the audio decoding apparatus 140 generates spatial parameter information suitable for a 5.1-channel signal based on side information and control information, and provides the spatial parameter information and a downmix signal to the multi-channel decoder 141. Then, the multi-channel decoder 141 generates a 5.1 channel signal based on the spatial parameter information and the downmix signal. In other words, when the number of channels to be output is 5.1 channels, the audio decoding apparatus 140 can readily generate a 5.1-channel signal based on a downmix signal without the need to generate 10 object signals and is thus more efficient than a conventional audio decoding apparatus in terms of complexity.

The audio decoding apparatus 140 is deemed efficient when the amount of computation required to calculates spatial parameter information corresponding to each of an OTT box and a TTT box through the analysis of side information and control information transmitted by an audio encoding apparatus is less than the amount of computation required to perform a mixing/rendering operation after the decoding of each object signal.

The audio decoding apparatus 140 may be obtained simply by adding a module for generating spatial parameter information through the analysis of side information and control information to a typical multi-channel audio decoding apparatus, and may thus maintain the compatibility with a typical multi-channel audio decoding apparatus. Also, the audio decoding apparatus 140 can improve the quality of sound using existing tools of a typical multi-channel audio decoding apparatus such as an envelope shaper, a a sub-band temporal processing (STP) tool, and a decorrelator. Given all this, it is concluded that all the advantages of a typical multi-channel audio decoding method can be readily applied to an object-audio decoding method.

Spatial parameter information transmitted to the multi-channel decoder 141 by the parameter converter 145 may have been compressed so as to be suitable for being transmitted. Alternatively, the spatial parameter information may have the same format as that of data transmitted by a typical multi-channel encoding apparatus. That is, the spatial parameter information may have been subjected to a Huffman decoding operation or a pilot decoding operation and may thus be transmitted to each module as uncompressed spatial cue data. The former is suitable for transmitting the spatial parameter information to a multi-channel audio decoding apparatus in a remote place, and the later is convenient because there is no need for a multi-channel audio decoding apparatus to convert compressed spatial cue data into uncompressed spatial cue data that can readily be used in a decoding operation.

The configuration of spatial parameter information based on the analysis of side information and control information may cause a delay. In order to compensate for such delay, an additional buffer may be provided for a downmix signal so that a delay between the downmix signal and a bitstream can be compensated for. Alternatively, an additional buffer may be provided for spatial parameter information obtained from control information so that a delay between the spatial parameter information and a bitstream can be compensated for. These methods, however, are inconvenient because of the requirement to provide an additional buffer. Alternatively, side information may be transmitted ahead of a downmix signal in consideration of the possibility of occurrence of a delay between a downmix signal and spatial parameter information. In this case, spatial parameter information obtained by combining the side information and control information does not need to be adjusted but can readily be used.

If a plurality of object signals of a downmix signal have different levels, an arbitrary downmix gain (ADG) module which can directly compensate for the downmix signal may determine the relative levels of the object signals, and each of the object signals may be allocated to a predetermined position in a multi-channel space using spatial cue data such as channel level difference (CLD) information, inter-channel correlation (ICC) information, and channel prediction coefficient (CPC) information.

For example, if control information indicates that a predetermined object signal is to be allocated to a predetermined position in a multi-channel space and has a higher level than other object signals, a typical multi-channel decoder may calculate the difference between the energies of channels of a downmix signal, and divide the downmix signal into a number of output channels based on the results of the calculation. However, a typical multi-channel decoder cannot increase or reduce the volume of a certain sound in a downmix signal. In other words, a typical multi-channel decoder simply distributes a downmix signal to a number of output channels and thus cannot increase or reduce the volume of a sound in the downmix signal.

It is relatively easy to allocate each of a number of object signals of a downmix signal generated by an object encoder to a predetermined position in a multi-channel space according to control information. However, special techniques are required to increase or reduce the amplitude of a predetermined object signal. In other words, if a downmix signal generated by an object encoder is used as is, it is difficult to reduce the amplitude of each object signal of the downmix signal.

Figure 5:
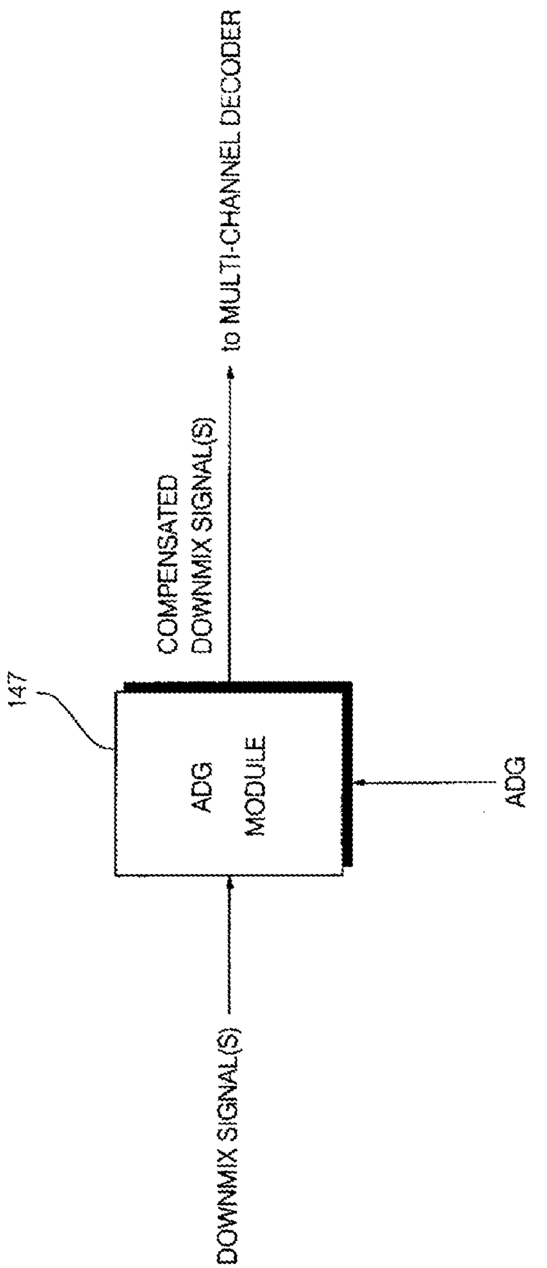
FIG. 5 illustrates a block diagram of an arbitrary downmix gain (ADG) module that can be used in the audio decoding apparatus illustrated in FIG. 4.

Therefore, according to an embodiment of the present invention, the relative amplitudes of object signals may be varied according to control information by using an ADG module 147 illustrated in FIG. 5. The ADG module 147 may be installed in the multi-channel decoder 141 or may be separate from the multi-channel decoder 141.

If the relative amplitudes of object signals of a downmix signal are appropriately adjusted using the ADG module 147, it is possible to perform object decoding using a typical multi-channel decoder. If a downmix signal generated by an object encoder is a mono or stereo signal or a multi-channel signal with three or more channels, the downmix signal may be processed by the ADG module 147. If a downmix signal generated by an object encoder has two or more channels and a predetermined object signal that needs to be adjusted by the ADG module 147 only exists in one of the channels of the downmix signal, the ADG module 147 may be applied only to the channel including the predetermined object signal, instead of being applied to all the channels of the downmix signal. A downmix signal processed by the ADG module 147 in the above-described manner may be readily processed using a typical multi-channel decoder without the need to modify the structure of the multi-channel decoder.

Even when a final output signal is not a multi-channel signal that can be reproduced by a multi-channel speaker but is a binaural signal, the ADG module 147 may be used to adjust the relative amplitudes of object signals of the final output signal.

Alternatively to the use of the ADG module 147, gain information specifying a gain value to be applied to each object signal may be included in control information during the generation of a number of object signals. For this, the structure of a typical multi-channel decoder may be modified. Even though requiring a modification to the structure of an existing multi-channel decoder, this method is convenient in terms of reducing the complexity of decoding by applying a gain value to each object signal during a decoding operation without the need to calculate ADG and to compensate for each object signal.

The ADG module 147 may be used not only for adjusting the levels of object signals but also for modifying spectrum information of a certain object signal. More specifically, the ADG module 147 may be used not only to increase or lower the level of a certain object signal and but also to modify spectrum information of the certain object signal such as amplifying a high- or low-pitch portion of the certain object signal. It is impossible to modify spectrum information without the use of the ADG module 147.

Figure 6:
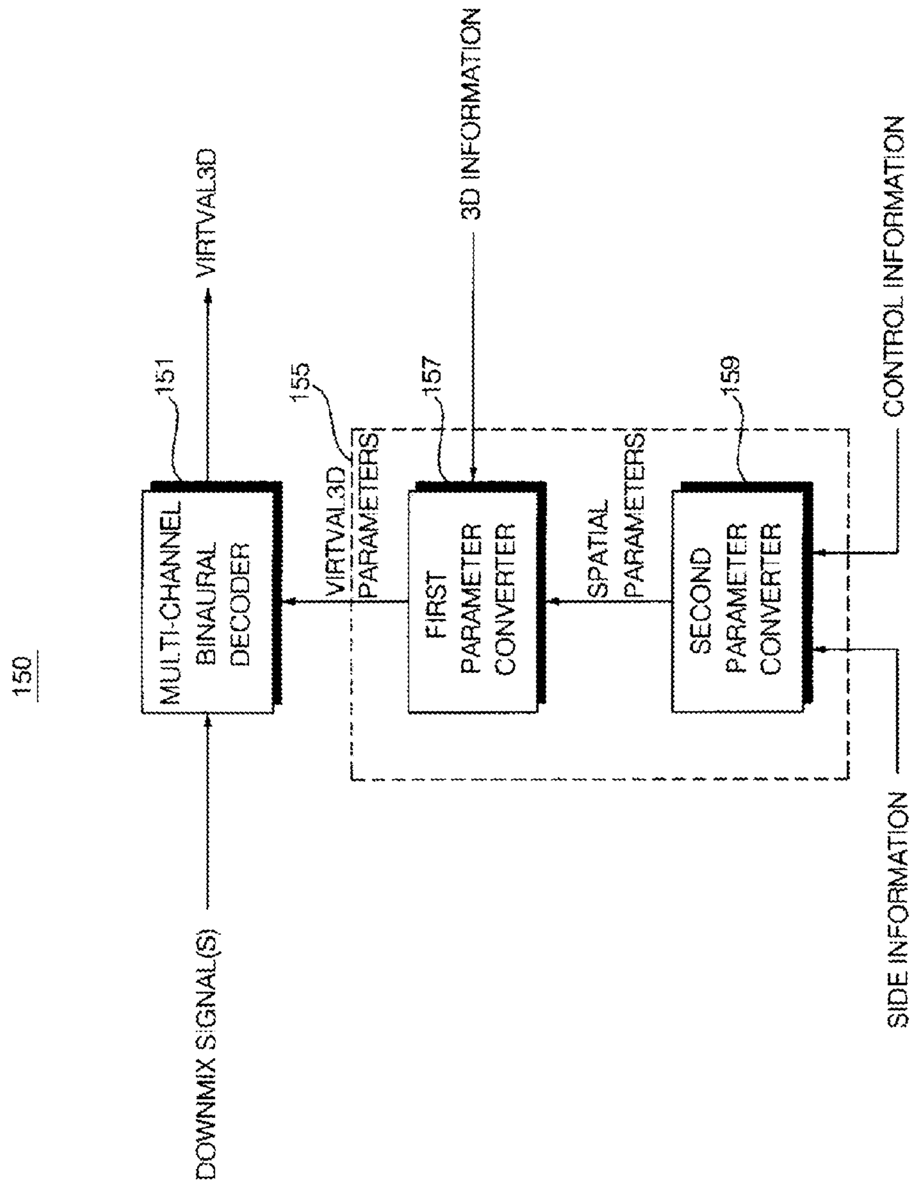
FIG. 6 illustrates a block diagram of an audio decoding apparatus according to a fourth embodiment of the present invention.

FIG. 6 illustrates a block diagram of an audio decoding apparatus 150 according to a fourth embodiment of the present invention. Referring to FIG. 6, the audio decoding apparatus 150 includes a multi-channel binaural decoder 151, a first parameter converter 157, and a second parameter converter 159.

The second parameter converter 159 analyzes side information and control information, which is provided by an audio encoding apparatus, and configures spatial parameter information based on the result of the analysis. The first parameter converter 157 configures virtual three-dimensional (3D) parameter information, which can be used by the multi-channel binaural decoder 151, by adding three-dimensional (3D) information such as head-related transfer function (HRTF) parameters to the spatial parameter information. The multi-channel binaural decoder 151 generates a binaural signal by applying the binaural parameter information to a downmix signal.

The first parameter converter 157 and the second parameter converter 159 may be replaced by a single module, i.e., a parameter conversion module 155 which receives the side information, the control information, and 3D information and configures the binaural parameter information based on the side information, the control information, and the HRTF parameters.

Conventionally, in order to generate a binaural signal for the playback of a downmix signal including 10 object signals with a headphone, an object signal must generate 10 decoded signals respectively corresponding to the 10 object signals based on the downmix signal and side information. Thereafter, a mixer/renderer allocates each of the 10 object signals to a predetermined position in a multi-channel space with reference to control information so as to suit a 5-channel speaker environment. Thereafter, the mixer/renderer generates a 5-channel signal that can be reproduced by a 5-channel speaker. Thereafter, the mixer/renderer applies 3D information to the 5-channel signal, thereby generating a 2-channel signal. In short, the above-mentioned conventional audio decoding method includes reproducing 10 object signals, converting the 10 object signals into a 5-channel signal, and generating a 2-channel signal based on the 5-channel signal, and is thus inefficient.

On the other hand, the audio decoding apparatus 150 can readily generate a binaural signal that can be reproduced using a headphone based on object signals. In addition, the audio decoding apparatus 150 configures spatial parameter information through the analysis of side information and control information, and can thus generate a binaural signal using a typical multi-channel binaural decoder. Moreover, the audio decoding apparatus 150 still can use a typical multi-channel binaural decoder even when being equipped with an incorporated parameter converter which receives side information, control information, and HRTF parameters and configures binaural parameter information based on the side information, the control information, and the HRTF parameters.

Figure 7:
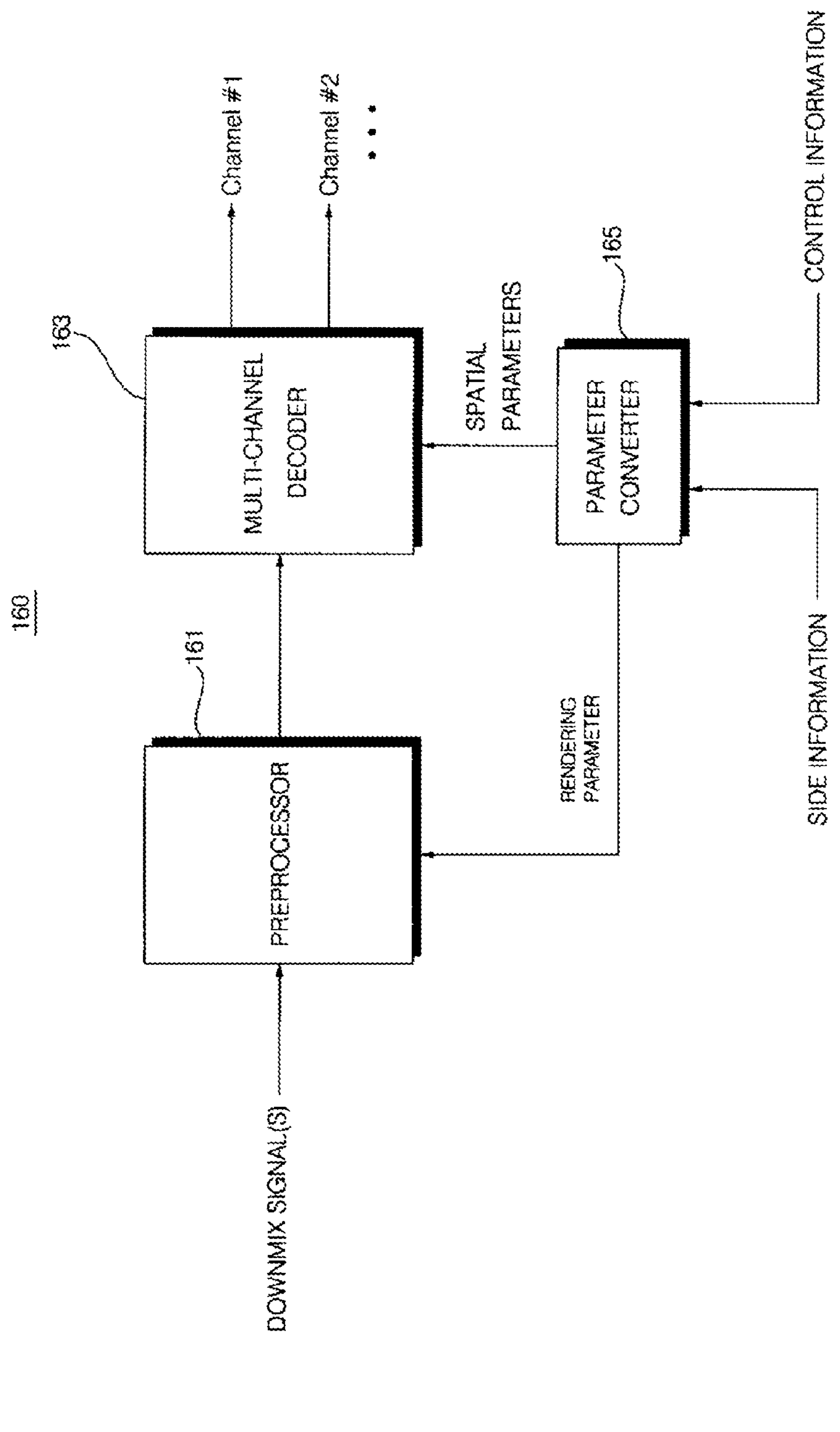
FIG. 7 illustrates a block diagram of an audio decoding apparatus according to a fifth embodiment of the present invention.

FIG. 7 illustrates a block diagram of an audio decoding apparatus 160 according to a fifth embodiment of the present invention. Referring to FIG. 7, the audio decoding apparatus 160 includes a preprocessor 161, a multi-channel decoder 163, and a parameter converter 165.

The parameter converter 165 generates spatial parameter information, which can be used by the multi-channel decoder 163, and parameter information, which can be used by the preprocessor 161. The preprocessor 161 performs a pre-processing operation on a downmix signal, and transmits a downmix signal resulting from the pre-processing operation to the multi-channel decoder 163. The multi-channel decoder 163 performs a decoding operation on the downmix signal transmitted by the preprocessor 161, thereby outputting a stereo signal, a binaural stereo signal or a multi-channel signal. Examples of the pre-processing operation performed by the preprocessor 161 include the modification or conversion of a downmix signal in a time domain or a frequency domain using filtering.

If a downmix signal input to the audio decoding apparatus 160 is a stereo signal, the downmix signal may have be subjected to downmix preprocessing performed by the preprocessor 161 before being input to the multi-channel decoder 163 because the multi-channel decoder 163 cannot map an object signal corresponding to a left channel of a stereo downmix signal to a right channel of a multi-channel signal through decoding. Therefore, in order to shift an object signal belonging to a left channel of a stereo downmix signal to a right channel, the stereo downmix signal may need to be preprocessed by the preprocessor 161, and the preprocessed downmix signal may be input to the multi-channel decoder 163.

The preprocessing of a stereo downmix signal may be performed based on preprocessing information obtained from side information and from control information.

Figure 8:
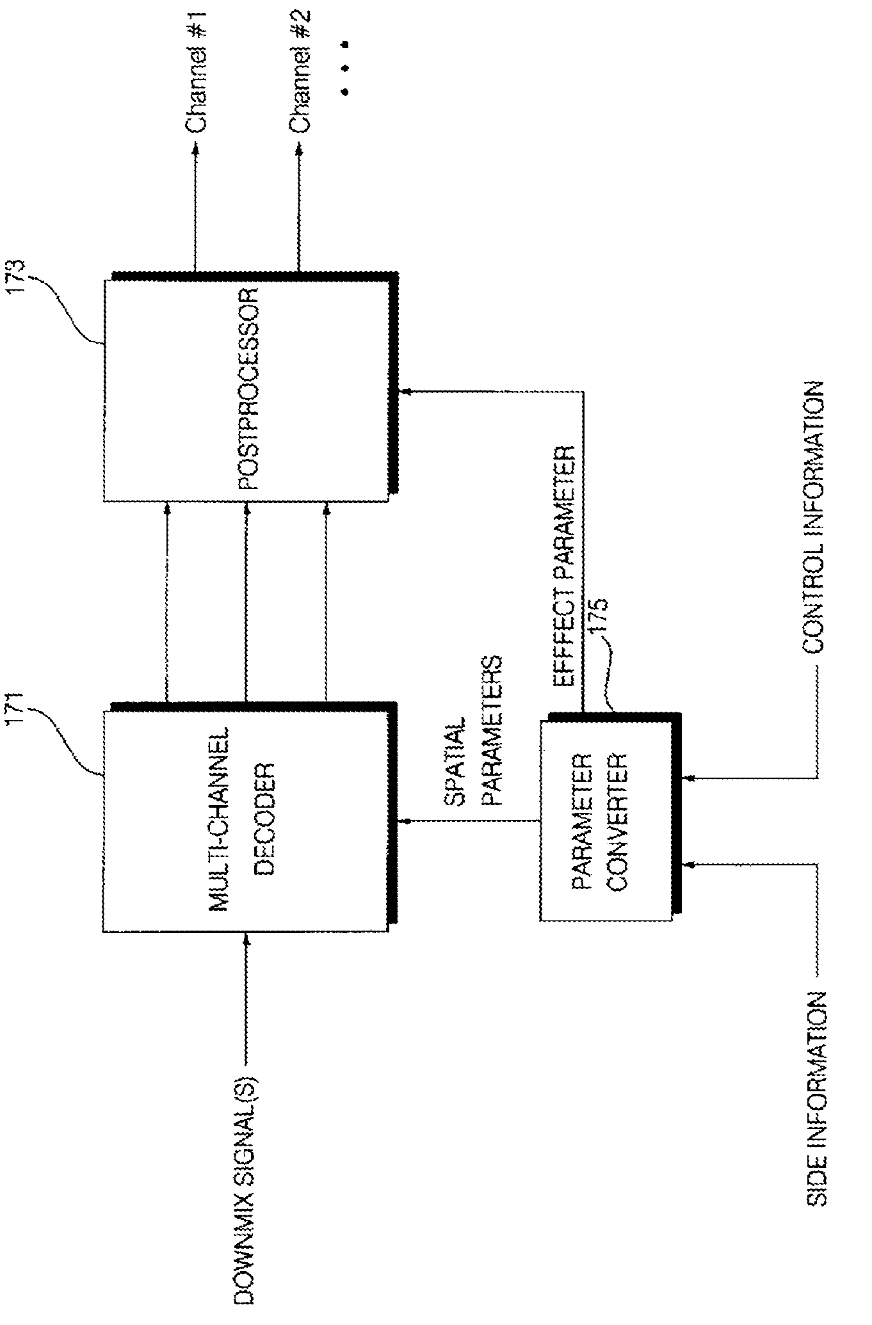
FIG. 8 illustrates a block diagram of an audio decoding apparatus according to a sixth embodiment of the present invention

FIG. 8 illustrates a block diagram of an audio decoding apparatus 170 according to a sixth embodiment of the present invention. Referring to FIG. 8, the audio decoding apparatus 170 includes a multi-channel decoder 171, a postprocessor 173, and a parameter converter 175.

The parameter converter 175 generates spatial parameter information, which can be used by the multi-channel decoder 163, and parameter information, which can be used by the postprocessor 173. The postprocessor 173 performs a post-processing operation on a signal output by the multi-channel decoder 173. Examples of the signal output by the multi-channel decoder 173 include a stereo signal, a binaural stereo signal and a multi-channel signal.

Examples of the post-processing operation performed by the post processor 173 include the modification and conversion of each channel or all channels of an output signal. For example, if side information includes fundamental frequency information regarding a predetermined object signal, the postprocessor 173 may remove harmonic components from the predetermined object signal with reference to the fundamental frequency information. A multi-channel audio decoding method may not be efficient enough to be used in a karaoke system. However, if fundamental frequency information regarding vocal object signals is included in side information and harmonic components of the vocal object signals are removed during a post-processing operation, it is possible to realize a high-performance karaoke system by using the embodiment of FIG. 8. The embodiment of FIG. 8 may also be applied to object signals, other than vocal object signals. For example, it is possible to remove the sound of a predetermined musical instrument by using the embodiment of FIG. 8. Also, it is possible to amplify predetermined harmonic components using fundamental frequency information regarding object signals by using the embodiment of FIG. 8. In short, post-processing parameters may enable the application of various effects such as the insertion of a reverberation effect, the addition of noise, and the amplification of a low-pitch portion that cannot be performed by the multi-channel decoder 171.

The postprocessor 173 may directly apply an additional effect to a downmix signal or add a downmix signal to which an effect has already been applied the output of the multi-channel decoder 171. The postprocessor 173 may change the spectrum of an object or modify a downmix signal whenever necessary. If it is not appropriate to directly perform an effect processing operation such as reverberation on a downmix signal and to transmit a signal obtained by the effect processing operation to the multi-channel decoder 171, the preprocessor 173 may simply add the signal obtained by the effect processing operation to the output of the multi-channel decoder 171, instead of directly performing effect processing on the downmix signal and transmitting the result of effect processing to the multi-channel decoder 171.

Figure 9:
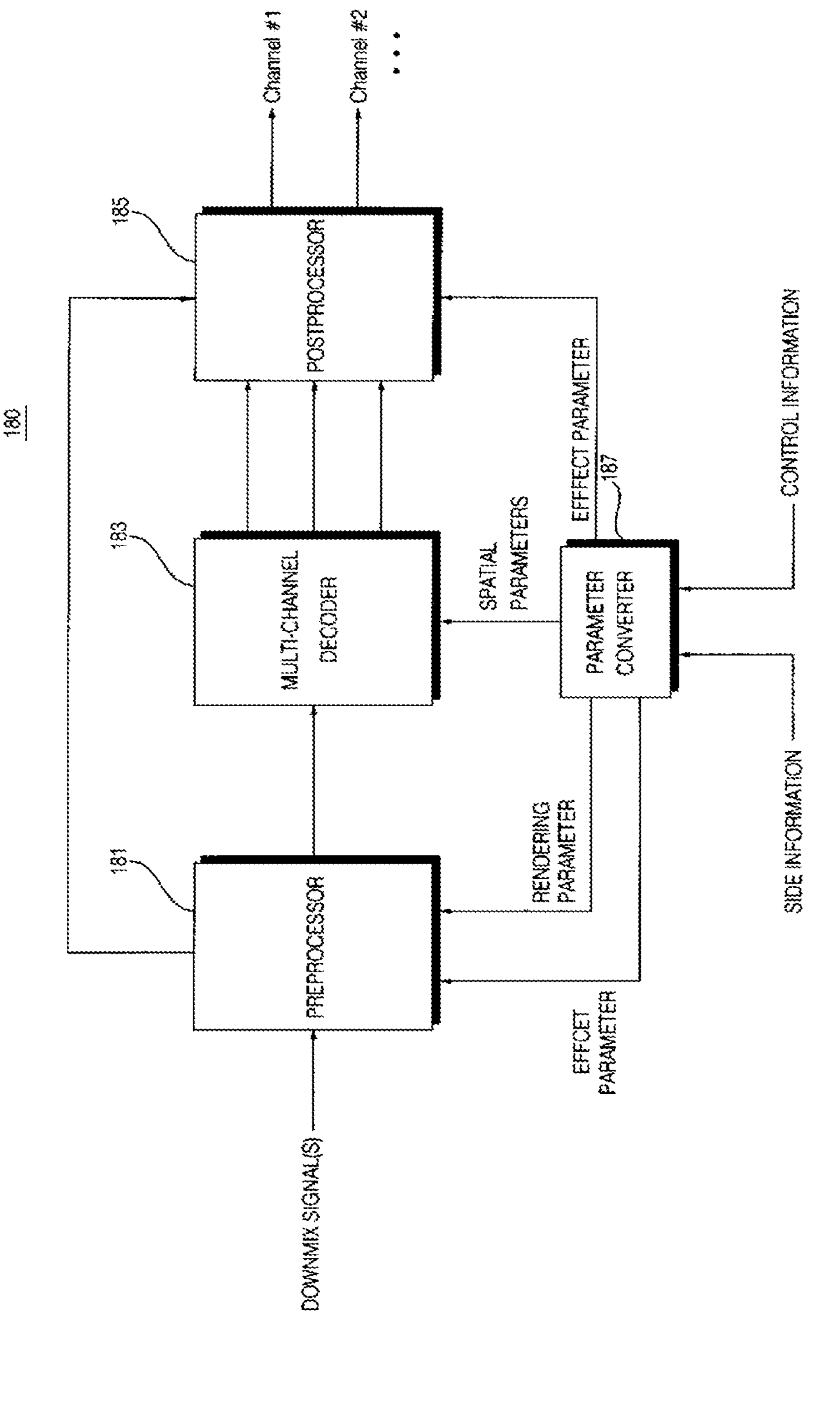
FIG. 9 illustrates a block diagram of an audio decoding apparatus according to a seventh embodiment of the present invention

FIG. 9 illustrates a block diagram of an audio decoding apparatus 180 according to a seventh embodiment of the present invention. Referring to FIG. 9, the audio decoding apparatus 180 includes a preprocessor 181, a multi-channel decoder 183, a postprocessor 185, and a parameter converter 187.

The description of the preprocessor 161 directly applies to the preprocessor 181. The postprocessor 185 may be used to add the output of the preprocessor 181 and the output of the multi-channel decoder 185 and thus to provide a final signal. In this case, the postprocessor 185 simply serves an adder for adding signals. An effect parameter may be provided to whichever of the preprocessor 181 and the postprocessor 185 performs the application of an effect. In addition, the addition of a signal obtained by applying an effect to a downmix signal to the output of the multi-channel decoder 183 and the application of an effect to the output of the multi-channel decoder 185 may be performed at the same time.

The preprocessors 161 and 181 of FIGS. 7 and 9 may perform rendering on a downmix signal according to control information provided by a user. In addition, the preprocessors 161 and 181 of FIGS. 7 and 9 may increase or reduce the levels of object signals and alter the spectra of object signals. In this case, the preprocessors 161 and 181 of FIGS. 7 and 9 may perform the functions of an ADG module.

The rendering of an object signal according to direction information of the object signal, the adjustment of the level of the object signal and the alteration of the spectrum of the object signal may be performed at the same time. In addition, some of the rendering of an object signal according to direction information of the object signal, the adjustment of the level of the object signal and the alteration of the spectrum of the object signal may be performed by using the preprocessor 161 or 181, and whichever of the rendering of an object signal according to direction information of the object signal, the adjustment of the level of the object signal and the alteration of the spectrum of the object signal is not performed by the preprocessor 161 or 181 may be performed by using an ADG module. For example, it is not efficient to alter the spectrum of an object signal by using an ADG module, which uses a quantization level interval and a parameter band interval. In this case, the preprocessor 161 or 181 may be used to minutely alter the spectrum of an object signal on a frequency-by-frequency basis, and an ADG module may be used to adjust the level of the object signal.

Figure 10:
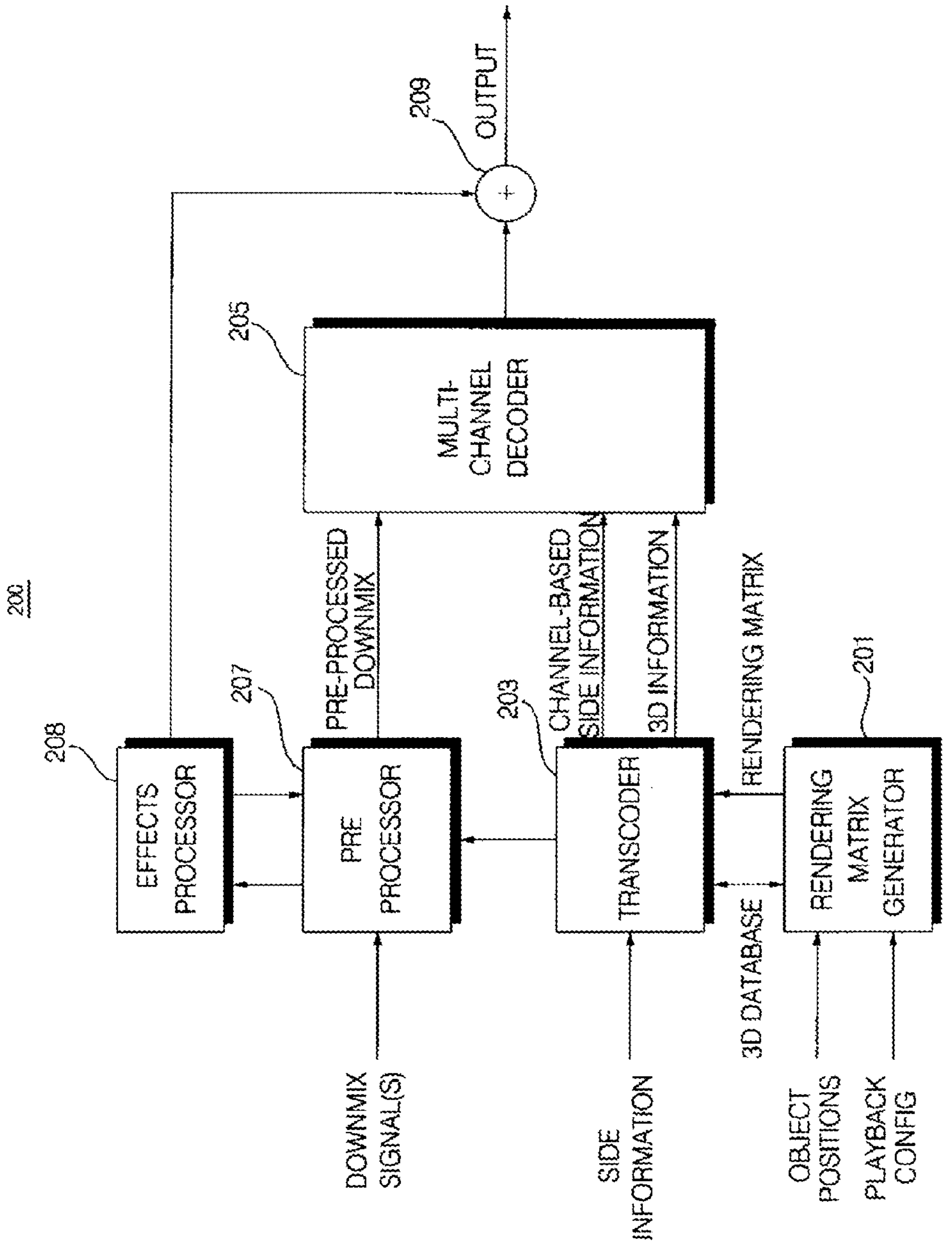
FIG. 10 illustrates a block diagram of an audio decoding apparatus according to an eighth embodiment of the present invention

FIG. 10 illustrates a block diagram of an audio decoding apparatus according to an eight embodiment of the present invention. Referring to FIG. 10, the audio decoding apparatus 200 includes a rendering matrix generator 201, a transcoder 203, a multi-channel decoder 205, a preprocessor 207, an effect processor 208, and an adder 209.

The rendering matrix generator 201 generates a rendering matrix, which represents object position information regarding the positions of object signals and playback configuration information regarding the levels of the object signals, and provides the rendering matrix to the transcoder 203. The rendering matrix generator 201 generates 3D information such as an HRTF coefficient based on the object position information. An HRTF is a transfer function which describes the transmission of sound waves between a sound source at an arbitrary position and the eardrum, and returns a value that varies according to the direction and altitude of the sound source. If a signal with no directivity is filtered using the HRTF, the signal may be heard as if it were reproduced from a certain direction.

The object position information and the playback configuration information, which is received by the rendering matrix generator 201, may vary over time and may be provided by an end user.

The transcoder 203 generates channel-based side information based on object-based side information, the rendering matrix and 3D information, and provides the multi-channel decoder 209 with the channel-based side information and 3D information necessary for the multi-channel decoder 209. That is, the transcoder 203 transmits channel-based side information regarding M channels, which is obtained from object-based parameter information regarding N object signals, and 3D information of each of the N object signals to the multi-channel decoder 205.

The multi-channel decoder 205 generates a multi-channel audio signal based on a downmix signal and the channel-based side information provided by the transcoder 203, and performs 3D rendering on the multi-channel audio signal according to 3D information, thereby generating a 3D multi-channel signal. The rendering matrix generator 201 may include a 3D information database (not shown).

If there is the need to preprocess a downmix signal before the input of the downmix signal to the multi-channel decoder 205, the transcoder 203 transmits information regarding preprocessing to the preprocessor 207. The object-based side information includes information regarding all object signals, and the rendering matrix includes the object position information and the playback configuration information. The transcoder 203 may generate channel-based side information based on the object-based side information and the rendering matrix, and then generates the channel-based side information necessary for mixing and reproducing the object signals according to the channel information. Thereafter, the transcoder 203 transmits the channel-based side information to the multi-channel decoder 205.

The channel-based side information and the 3D information provided by the transcoder 205 may include frame indexes. Thus, the multi-channel decoder 205 may synchronize the channel-based side information and the 3D information by using the frame indexes, and may thus be able to apply the 3D information only to certain frames of a bitstream. In addition, even if the 3D information is updated, it is possible to easily synchronize the channel-based side information and the updated 3D information by using the frame indexes. That is, the frame indexes may be included in the channel-based side information and the 3D information, respectively, in order for the multi-channel decoder 205 to synchronize the channel-based side information and the 3D information.

The preprocessor 207 may perform preprocessing on an input downmix signal, if necessary, before the input downmix signal is input to the multi-channel decoder 205. As described above, if the input downmix signal is a stereo signal and there is the need to play back an object signal belonging to a left channel from a right channel, the downmix signal may have be subjected to preprocessing performed by the preprocessor 207 before being input to the multi-channel decoder 205 because the multi-channel decoder 205 cannot shift an object signal from one channel to another. Information necessary for preprocessing the input downmix signal may be provided to the preprocessor 207 by the transcoder 205. A downmix signal obtained by preprocessing performed by the preprocessor 207 may be transmitted to the multi-channel decoder 205.

The effect processor 208 and the adder 209 may directly apply an additional effect to a downmix signal or add a downmix signal to which an effect has already been applied to the output of the multi-channel decoder 205. The effect processor 208 may change the spectrum of an object or modify a downmix signal whenever necessary. If it is not appropriate to directly perform an effect processing operation such as reverberation on a downmix signal and to transmit a signal obtained by the effect processing operation to the multi-channel decoder 205, the effect processor 208 may simply add the signal obtained by the effect processing operation to the output of the multi-channel decoder 205, instead of directly performing effect processing on the downmix signal and transmitting the result of effect processing to the multi-channel decoder 205.

A rendering matrix generated by the rendering matrix generator 201 will hereinafter be described in detail.

A rendering matrix is a matrix that represents the positions and the playback configuration of object signals. That is, if there are N object signals and M channels, a rendering matrix may indicate how the N object signals are mapped to the M channels in various manners.

More specifically, when N object signals are mapped to M channels, an N*M rendering matrix may be established. In this case, the rendering matrix includes N rows, which respectively represent the N object signals, and M columns, which respectively represent M channels. Each of M coefficients in each of the N rows may be a real number or an integer indicating the ratio of part of an object signal allocated to a corresponding channel to the whole object signal.

More specifically, the M coefficients in each of the N rows of the N*M rendering matrix may be real numbers. Then, if the sum of M coefficients in a row of the N*M rendering matrix is equal to a predefined reference value, for example, 1, it may be determined that the level of an object signal has not been varied. If the sum of the M coefficients is less than 1, it is determined that the level of the object signal has been reduced. If the sum of the M coefficients is greater than 1, it is determined that the level of the object signal has been increased. The predefined reference value may be a numerical value, other than 1. The amount by which the level of the object signal is varied may be restricted to the range of 12 dB. For example, if the predefined reference value is 1 and the sum of the M coefficients is 1.5, it may be determined that the level of the object signal has been increased by 12 dB. If the predefined reference value is 1 and the sum of the M coefficients is 0.5, it is determined that that the level of the object signal has been reduced by 12 dB. If the predefined reference value is 1 and the sum of the M coefficients is 0.5 to 1.5, it is determined that the object signal has been varied by a predetermined amount between −12 dB and +12 dB, and the predetermined amount may be linearly determined according to the sum of the M coefficients.

The M coefficients in each of the N rows of the N*M rendering matrix may be integers. Then, if the sum of M coefficients in a row of the N*M rendering matrix is equal to a predefined reference value, for example, 10, 20, 30 or 100, it may be determined that the level of an object signal has not been varied. If the sum of the M coefficients is less than the predefined reference value, it may be determined that the level of the object signal has not been reduced. If the sum of the M coefficients is greater than the predefined reference value, it may be determined that the level of the object signal has not been increased. The amount by which the level of the object signal is varied may be restricted to the range of, for example, 12 dB. The amount by which the sum of the M coefficients is discrepant from the predefined reference value may represent the amount (unit: dB) by which the level of the object signal has been varied. For example, if the sum of the M coefficients is one greater than the predefined reference value, it may be determined that the level of the object signal has been increased by 2 dB. Therefore, if the predefined reference value is 20 and the sum of the M coefficients is 23, it may be determined that the level of the object signal has been increased by 6 dB. If the predefined reference value is 20 and the sum of the M coefficients is 15, it may be determined that the level of the object signal has been reduced by 10 dB.

For example, if there are six object signals and five channels (i.e., front left (FL), front right (FR), center (C), rear left (RL) and rear right (RR) channels), a 6*5 rendering matrix having six rows respectively corresponding to the six object signals and five columns respectively corresponding to the five channels may be established. The coefficients of the 6*5 rendering matrix may be integers indicating the ratio at which each of the six object signals is distributed among the five channels. The 6*5 rendering matrix may have a reference value of 10. Thus, if the sum of five coefficients in any one of the six rows of the 6*5 rendering matrix is equal to 10, it may be determined that the level of a corresponding object signal has not been varied. The amount by which the sum of the five coefficients in any one of the six rows of the 6*5 rendering matrix is discrepant from the reference value represents the amount by which the level of a corresponding object signal has been varied. For example, if the sum of the five coefficients in any one of the six rows of the 6*5 rendering matrix is discrepant from the reference value by 1, it may be determined that the level of a corresponding object signal has been varied by 2 dB. The 6*5 rendering matrix may be represented by Equation (1):

$$\begin{bmatrix} 3 & 1 & 2 & 2 & 2 \\ 2 & 4 & 3 & 1 & 2 \\ 0 & 0 & 12 & 0 & 0 \\ 7 & 0 & 0 & 0 & 0 \\ 2 & 2 & 2 & 2 & 2 \\ 2 & 1 & 1 & 2 & 1 \end{bmatrix} \quad \text{[Equation 1]}$$

Referring to the 6*5 rendering matrix of Equation (1), the first row corresponds to the first object signal and represents the ratio at which the first object signal is distributed among FL, FR, C, RL and RR channels. Since the first coefficient of the first row has a greatest integer value of 3 and the sum of the coefficients of the first row is 10, it is determined that the first object signal is mainly distributed to the FL channel, and that the level of the first object signal has not been varied. Since the second coefficient of the second row, which corresponds to the second object signal, has a greatest integer value of 4 and the sum of the coefficients of the second row is 12, it is determined that the second object signal is mainly distributed to the FR channel, and that the level of the second object signal has been increased by 4 dB. Since the third coefficient of the third row, which corresponds to the third object signal, has a greatest integer value of 12 and the sum of the coefficients of the third row is 12, it is determined that the third object signal is distributed only to the C channel, and that the level of the third object signal has been increased by 4 dB. Since all the coefficients of the fifth row, which corresponds to the fifth object signal, has the same integer value of 2 and the sum of the coefficients of the fifth row is 10, it is determined that the fifth object signal is evenly distributed among the FL, FR, C, RL and RR channels, and that the level of the fifth object signal has not been varied.

Alternatively, when N object signals are mapped to M channels, an N*(M+1) rendering matrix may be established. An N*(M+1) rendering matrix is very similar to an N*M rendering matrix. More specifically, in an (N*(M+1) rendering matrix, like in an N*M rendering matrix, first through M-th coefficients in each of N rows represent the ratio at which a corresponding object signal distributed among FL, FR, C, RL and RR channels. However, an (N*(M+1) rendering matrix, unlike an N*M rendering matrix, has an additional column (i.e., an (M+1)-th column) for representing the levels of object signals.

An N*(M+1) rendering matrix, unlike an N*M rendering matrix, indicates how an object signal is distributed among M channels and whether the level of the object signal has been varied separately. Thus, by using an N*(M+1) rendering matrix, it is possible to easily obtain information regarding a variation, if any, in the level of an object signal without a requirement of additional computation. Since an N*(M+1) rendering matrix is almost the same as an N*M rendering matrix, an N*(M+1) rendering matrix can be easily converted into an N*M rendering matrix or vice versa without a requirement of additional information.

Still alternatively, when N object signals are mapped to M channels, an N*2 rendering matrix may be established. The N*2 rendering matrix has a first column indicating the angular positions of object signals and a second column indicating a variation, if any, in the level of each of the object signals. The N*2 rendering matrix may represent the angular positions of object signals at regular intervals of 1 or 3 degrees within the range of 0-360 degrees. An object signal that is evenly distributed among all directions may be represented by a predefined value, rather than by an angle.

An N*2 rendering matrix may be converted into an N*3 rendering matrix which can indicate not only the 2D directions of object signals but also the 3D directions of the object signals. More specifically, a second column of an N*3 rendering matrix may be used to indicate the 3D directions of object signals. A third column of an N*3 rendering matrix indicates a variation, if any, in the level of each object signal using the same method used by an N*M rendering matrix. If a final playback mode of an object decoder is binaural stereo, the rendering matrix generator 201 may transmit 3D information indicating the position of each object signal or an index corresponding to the 3D information. In the latter case, the transcoder 203 may need to have 3D information corresponding to an index transmitted by the rendering matrix generator 201. In addition, if 3D information indicating the position of each object signal is received from the rendering matrix generator 201, the transcoder 203 may be able to calculate 3D information that can be used by the multi-channel decoder 205 based on the received 3D information, a rendering matrix, and object-based side information.

A rendering matrix and 3D information may adaptively vary in real time according to a modification made to object position information and playback configuration information by an end user. Therefore, information regarding whether the rendering matrix and the 3D information is updated and updates, if any, in the rendering matrix and the 3D information may be transmitted to the transcoder 203 at regular intervals of time, for example, at intervals of 0.5 sec. Then, if updates in the rendering matrix and the 3D information are detected, the transcoder 203 may perform linear conversion on the received updates and an existing rendering matrix and existing 3D information, assuming that the rendering matrix and the 3D information linearly vary over time.

If object position information and playback configuration information has not been modified by an end user since the transmission of a rendering matrix and 3D information to the transcoder 203, information indicating that the rendering matrix and the 3D information has not been varied may be transmitted to the transcoder 203. On the other hand, if the object position information and the playback configuration information has been modified by an end user since the transmission of the rendering matrix and the 3D information to the transcoder 203, information indicating that the rendering matrix and the 3D information has been varied and updates in the rendering matrix and the 3D information may be transmitted to the transcoder 203. More specifically, updates in the rendering matrix and updates in the 3D information may be separately transmitted to the transcoder 203. Alternatively, updates in the rendering matrix and/or updates in the 3D information may be collectively represented by a predefined representative value. Then, the predefined representative value may be transmitted to the transcoder 203 along with information indicating that the predefined representative value corresponds to updates in the rendering matrix or updates in the 3D information. In this manner, it is possible to easily notify the transcoder 203 whether or not a rendering matrix and 3D information have been updated.

An N*M rendering matrix, like the one indicated by Equation (1), may also include an additional column for representing 3D direction information of object signals. In this case, the additional column may represent 3D direction information of object signals as angles in the range of −90 to +90 degrees. The additional column may be provided not only to an N+M matrix but also to an N*(M+1) rendering matrix and an N*2 matrix. 3D direction information of object signals may not be necessary for use in a normal decoding mode of a multi-channel decoder. Instead, 3D direction information of object signals may be necessary for use in a binaural mode of a multi-channel decoder. 3D direction information of object signals may be transmitted along with a rendering matrix. Alternatively, 3D direction information of object signals may be transmitted along with 3D information. 3D direction information of object signals dose not affect channel-based side information but affects 3D information during a binaural-mode decoding operation.

Information regarding the spatial positions and the levels of object signals may be provided as a rendering matrix. Alternatively, information regarding the spatial positions and the levels of object signals may be represented as modifications to the spectra of the object signal such as intensifying low-pitch parts or high-pitch parts of the object signals. In this case, information regarding the modifications to the spectra of the object signals may be transmitted as level variations in each parameter band, which is used in a multi-channel codec. If an end user controls modifications to the spectra of object signals, information regarding the modifications to the spectra of the object signals may be transmitted as a spectrum matrix separately from a rendering matrix. The spectrum matrix may have as many rows as there are object signals and have as many columns as there are parameters. Each coefficient of the spectrum matrix indicates information regarding the adjustment of the level of each parameter band.

Thereafter, the operation of the transcoder 203 will hereinafter be described in detail. The transcoder 203 generates channel-based side information for the multi-channel decoder 205 based on object-based side information, rendering matrix information and 3D information and transmits the channel-based side information to the multi-channel decoder 205. In addition, the transcoder 203 generates 3D information for the multi-channel decoder 205 and transmits the 3D information to the multi-channel decoder 205. If an input downmix signal needs to be preprocessed before being input to the multi-channel decoder 205, the transcoder 203 may transmit information regarding the input downmix signal.

The transcoder 203 may receive object-based side information indicating how a plurality of object signals are included in an input downmix signal. The object-based side information may indicate how a plurality of object signals are included in an input downmix signal by using an OTT box and a TTT box and using CLD, ICC and CPC information. The object-based side information may provide descriptions of various methods that can be performed by an object encoder for indicating information regarding each of a plurality of object signals, and may thus be able to indicate how the object signals are included in side information.

In the case of a TTT box of a multi-channel codec, L, C and R signals may be downmixed or upmixed into L and R signals. In this case, the C signal may share a little bit of both the L and R signals. However, this rarely happens in the case of downmixing or upmixing object signals. Therefore, an OTT box is widely used to perform upmixing or downmixing for object coding. Even if a C signal includes an independent signal component, rather than parts of L and R signals, a TTT box may be used to perform upmixing or downmixing for object coding.

Figure 11:
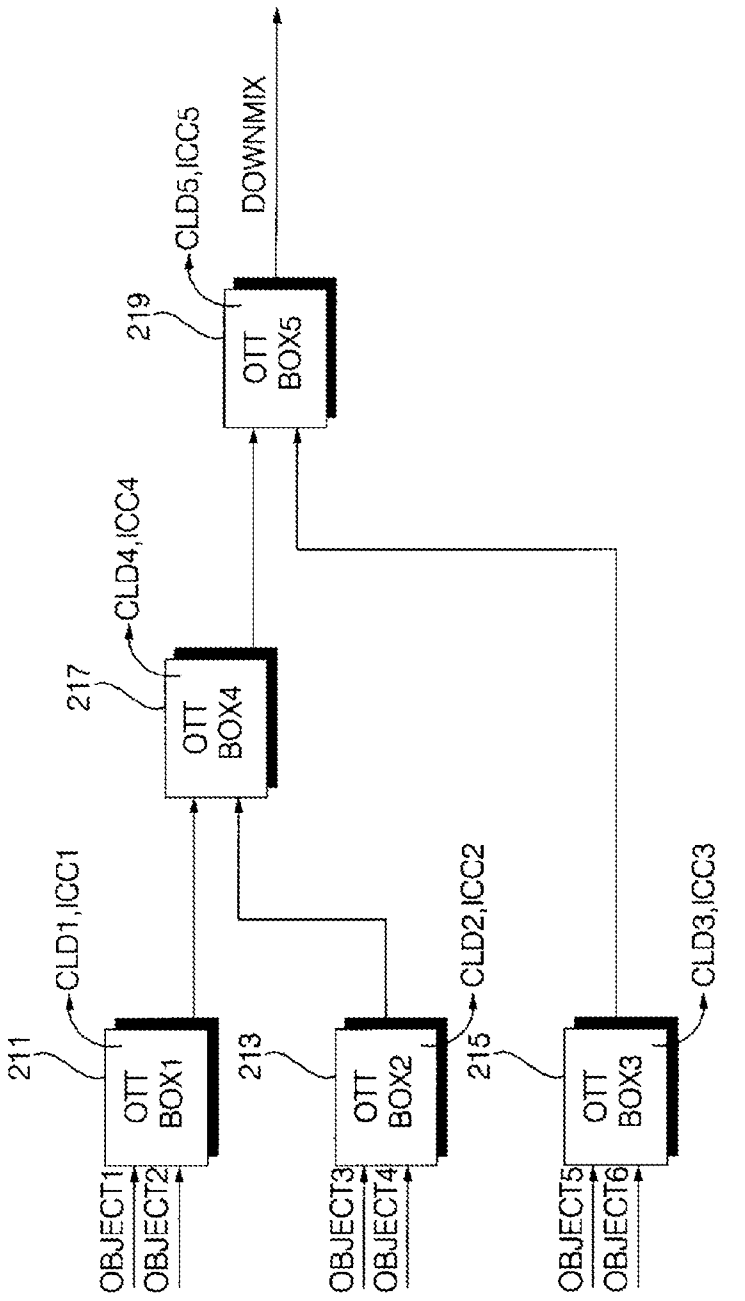
FIGS. 11 and 12 illustrate diagrams for explaining a transcoder operation.

For example, if there are six object signals, the six object signals may be converted into a downmix signal by an OTT box, and information regarding each of the object signals may be obtained by using an OTT box, as illustrated in FIG. 11.

Referring to FIG. 11, six object signals may be represented by one downmix signal and information (such as CLD and ICC information) provided by a total of five OTT boxes 211, 213, 215, 217 and 219. The structure illustrated in FIG. 11 may be altered in various manners. That is, referring to FIG. 11, the first OTT box 211 may receive two of the six object signals. In addition, the way in which the OTT boxes 211, 213, 215, 217 and 219 are hierarchically connected may be freely varied. Therefore, side information may include hierarchical structure information indicating how the OTT boxes 211, 213, 215, 217 and 219 are hierarchically connected and input position information indicating to which OTT box each object signal is input. If the OTT boxes 211, 213, 215, 217 and 219 form an arbitrary tree structure, a method used in a multi-channel codec for representing an arbitrary tree structure may be used to indicate such hierarchical structure information. In addition, such input position information may be indicated in various manners.

Side information may also include information regarding a mute period of each object signal during. In this case, the tree structure of the OTT boxes 211, 213, 215, 217 and 219 may adaptively vary over time. For example, referring to FIG. 11, when the first object signal OBJECT1 is mute, information regarding the first OTT box 211 is unnecessary, and only the second object signal OBJECT2 may be input to the fourth OTT box 217. Then, the tree structure of the OTT boxes 211, 213, 215, 217 and 219 may vary accordingly. Thus, information regarding a variation, if any, in the tree structure of the OTT boxes 211, 213, 215, 217 and 219 may be included in side information.

If a predetermined object signal is mute, information indicating that an OTT box corresponding to the predetermined object signal is not in use and information indicating that no cues from the OTT box are available may be provided. In this manner, it is possible to reduce the size of side information by not including information regarding OTT boxes or TTT boxes that are not in use in side information. Even if a tree structure of a plurality of OTT or TTT boxes is modified, it is possible to easily determine which of the OTT or TTT boxes are turned on or off based on information indicating what object signals are mute. Therefore, there is no need to frequently transmit information regarding modifications, if any, to the tree structure of the OTT or TTT boxes. Instead, information indicating what object signal is mute may be transmitted. Then, a decoder may easily determine what part of the tree structure of the OTT or TTT boxes needs to be modified. Therefore, it is possible to minimize the size of information that needs to be transmitted to a decoder. In addition, it is possible to easily transmit cues regarding object signals to a decoder.

Figure 12:
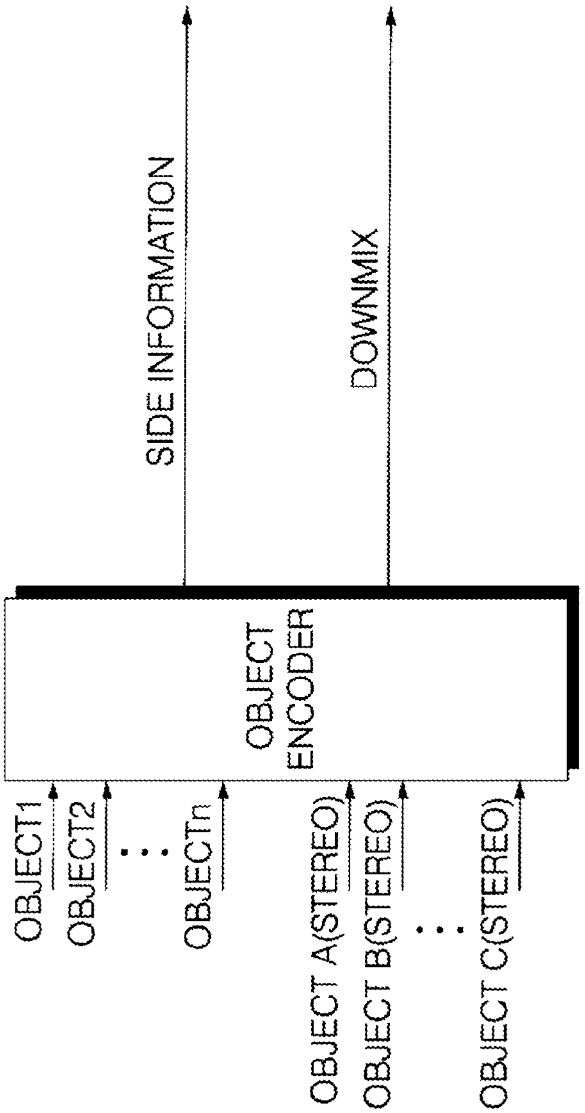

FIG. 12 illustrates a diagram for explaining how a plurality of object signals are included in a downmix signal. In the embodiment of FIG. 11, an OTT box structure of multi-channel coding is adopted as it is. However, in the embodiment of FIG. 12, a variation of the OTT box structure of multi-channel coding is used. That is, referring to FIG. 12, a plurality of object signals are input to each box, and only one downmix signal is generated in the end. Referring to FIG. 12, information regarding each of a plurality of object signals may be represented by the ratio of the energy level of each of the object signals to the total energy level of the object signals. However, as the number of object signals increases, the ratio of the energy level of each of the object signals to the total energy level of the object signals decreases. In order to address this, one of a plurality of object signal (hereinafter referred to as a highest-energy object signal) having a highest energy level in a predetermined parameter band is searched for, and the ratios of the energy levels of the other object signals (hereinafter referred to as non-highest-energy object signals) to the energy level of the highest-energy object signal may be provided as information regarding each of the object signals. In this case, once information indicating a highest-energy object signal and the absolute value of the energy level of the highest-energy object signal is given, the energy levels of other non-highest-energy object signals may be easily determined.

The energy level of a highest-energy object signal is necessary for incorporating a plurality of bitstreams into a single bitstream as performed in a multipoint control unit (MCU). However, in most cases, the energy level of a highest-energy object signal is not necessary because the absolute value of the energy level of a highest-energy object signal can be easily obtained from the ratios of the energy levels of other non-highest-energy object signals to the energy level of the highest-energy object signal.

For example, assume that there are four object signals A, B, C and D belonging to a predetermined parameter band, and that the object signal A is a highest-energy object signal. Then, the energy $E_P$ of the predetermined parameter band and the absolute value $E_A$ of the energy level of the object signal A satisfy Equation (2):

$$E_P = E_A + (a+b+c)E_A \qquad \text{[Equation 2]}$$

$$E_A = \frac{E_P}{1+a+b+c}$$

Where a, b, and c respectively indicate the ratios of the energy level of the object signals B, C and D to the energy level of the object signal. Referring to Equation (2), it is possible to calculate the absolute value $E_A$ of the energy level of the object signal A based on the ratios a, b, and c and the energy $E_P$ of the predetermined parameter band. Therefore, unless there is the need to incorporate a plurality of bitstreams into a single bitstream with the use of an MCU, the absolute value $E_A$ of the energy level of the object signal A may not need to be included in a bitstream. Information indicating whether the absolute value $E_A$ of the energy level of the object signal A is included in a bitstream may be included in a header of the bitstream, thereby reducing the size of the bitstream.

On the other hand, if there is the need to incorporate a plurality of bitstreams into a signal bitstream with the use of an MCU, the energy level of a highest-energy object signal is necessary. In this case, the sum of energy levels calculated based on the ratios of the energy levels of non-highest-energy object signals to the energy level of a highest-energy object signal may not be the same as the energy level of a downmix signal obtained by downmixing all the object signals. For example, when the energy level of the downmix signal is 100, the sum of the calculated energy levels may be 98 or 103 due to, for example, errors caused during quantization and dequantization operations. In order to address this, the difference between the energy level of the downmix signal and the sum of the calculated energy levels may be appropriately compensated for by multiplying each of the calculated energy levels by a predetermined coefficient. If the energy level of the downmix signal is X and the sum of the calculated energy levels is Y, each of the calculated energy levels may be multiplied by X/Y. If the difference between the energy level of the downmix signal and the sum of the calculated energy levels is not compensated for, such quantization errors may be included in parameter bands and frames, thereby causing signal distortions.

Therefore, information indicating which of a plurality of object signals has a greatest absolute value of energy in a predetermined parameter band is necessary. Such information may be represented by a number of bits. The number of bits necessary for indicating which of a plurality of object signals has a greatest absolute value of energy in a predetermined parameter band vary according to the number of object signals. As the number of object signals increases, the number of bits necessary for indicating which of a plurality of object signals has a greatest absolute value of energy in a predetermined parameter band increases. On the other hand, as the number of object signals decreases, the number of bits necessary for indicating which of a plurality of object signals has a greatest absolute value of energy in a predetermined parameter band decreases. A predetermined number of bits may be allocated in advance for indicating which of a plurality of object signals has a greatest absolute value of energy in a predetermined parameter band increases. Alternatively, the number of bits for indicating which of a plurality of object signals has a greatest absolute value of energy in a predetermined parameter band may be determined based on certain information.

The size of information indicating which of a plurality of object signals has a greatest absolute value of energy in each parameter band can be reduced by using the same method used to reduce the size of CLD, ICC, and CPC information for use in OTT and/or TTT boxes of a multi-channel codec, for example, by using a time differential method, a frequency differential method, or a pilot coding method.

In order to indicate which of a plurality of object signals has a greatest absolute value of energy in each parameter band, an optimized Huffman table may be used. In this case, information indicating in what order the energy levels of the object signals are compared with the energy level of whichever of the object signals has the greatest absolute energy may be required. For example, if there are five object signals (i.e., first through fifth object signals) and the third object signal is a highest-energy object signal, information regarding the third object signal may be provided. Then, the ratios of the energy levels of the first, second, fourth and fifth object signals to the energy level of the third object signal may be provided in various manners, and this will hereinafter be described in further detail.

The ratios of the energy levels of the first, second, fourth and fifth object signals to the energy level of the third object signal may be sequentially provided. Alternatively, the ratios of the energy levels of the fourth, fifth, first and second object signals to the energy level of the third object signal may be sequentially provided in a circular manner. Then, information indicating the order in which the ratios of the energy levels of the first, second, fourth and fifth object signals to the energy level of the third object signal are provided may be included in a file header or may be transmitted at intervals of a number of frames. A multi-channel codec may determine CLD and ICC information based on the serial numbers of OTT boxes. Likewise, information indicating how each object signal is mapped to a bitstream is necessary.

In the case of a multi-channel codec, information regarding signals corresponding to each channel may be identified by the serial numbers of OTT or TTT boxes. According to an object-based audio encoding method, if there are N object signals, the N object signals may need to be appropriately numbered. However, it is necessary sometimes for an end user to control the N object signals using an object decoder. In this case, the end user may have need of not only the serial numbers of the N object signals but also descriptions of the N object signals such as descriptions indicating that the first object signal corresponds to the voice of a woman and that the second object signal corresponds to the sound of a piano. The descriptions of the N object signals may be included in a header of a bitstream as metadata and then transmitted along with the bitstream. More specifically, the descriptions of the N object signals may be provided as text or may be provided by using a code table or codewords.

Correlation information regarding the correlations between object signals is necessary sometimes. For this, the correlations between a highest-energy object signal and other non-highest-energy object signals may be calculated. In this case, a single correlation value may be designated for all the object signals, which is comparable to the use of a single ICC value in all OTT boxes.

If object signals are stereo signals, the left channel energy-to-right channel energy ratios of the object signals and ICC information is necessary. The left channel energy-to-right channel energy ratios of the object signals may be calculated using the same method used to calculate the energy levels of a plurality of object signals based on the absolute value of the energy level of whichever of the object signals is a highest-energy object signal and the ratios of the energy levels of the other non-highest-energy object signals to the energy level of the highest-energy object signal. For example, if the absolute values of the energy levels of left and right channels of a highest-energy object signal are A and B, respectively, and the ratio of the energy level of the left channel of a non-highest-energy object signal to A and the ratio of the energy level of the right channel of the non-highest-energy object signal to B are x and y, respectively, the energy levels of the left and right channels of the non-highest-energy object signal may be calculated as A*x and B*y. In this manner, the left channel energy-to-right channel energy ratio of a stereo object signal can be calculated.

The absolute value of the energy level of a highest-energy object signal and the ratios of the energy levels of other non-highest-energy object signals to the energy level of the highest-energy object signal may also be used when the object signals are mono signals, a downmix signal obtained by the mono object signals is a stereo signal, and the mono object signals are included in both channels of the stereo downmix signal. In this case, the ratio of the energy of part of each mono object signal included in the left channel of a stereo downmix signal and the energy of part of a corresponding mono object signal included in the right channel of the stereo downmix signal and correlation information is necessary, and this directly applies to stereo object signals. If a mono object signal is included in both L and R channels of a stereo downmix signal, L- and R-channel components of the mono object signal may only have a level difference, and the mono object signal may have a correlation value of 1 throughout whole parameter bands. In this case, in order to reduce the amount of data, information indicating that the mono object signal has a correlation value of 1 throughout the whole parameter bands may be additionally provided. Then, there is no need to indicate the correlation value of 1 for each of the parameter bands. Instead, the correlation value of 1 may be indicated for the whole parameter bands.

During the generation of a downmix signal through the summation of a plurality of object signals, clipping may occur. In order to address this, a downmix signal may be multiplied by a predefined gain so that the maximum level of the downmix signal can exceed a clipping threshold. The predefined gain may vary over time. Therefore, information regarding the predefined gain is necessary. If the downmix signal is a stereo signal, different gain values may be provided for L- and R-channels of the downmix signal in order to prevent clipping. In order to reduce the amount of data transmission, the different gain values may not be transmitted separately. Instead, the sum of the different gain values and the ratio of the different gain values may be transmitted. Then, it is possible to reduce a dynamic range and reduce the amount of data transmission, compared to the case of transmitting the different gain values separately.

In order to further reduce the amount of data transmission, a bit indicating whether clipping has occurred during the generation of a downmix signal through the summation of a plurality of object signals may be provided. Then, only if it is determined that clipping has occurred, gain values may be transmitted. Such clipping information may be necessary for preventing clipping during the summation of a plurality of downmix signals in order to incorporate a plurality of bitstreams. In order to prevent clipping, the sum of a plurality of downmix signals may be multiplied by the inverse number of a predefined gain value for preventing clipping.

FIGS. 13 through 16 illustrate diagrams for explaining various methods of configuring object-based side information. The embodiments of FIGS. 13 through 16 can be applied not only mono or stereo object signals but also to multi-channel object signals.

Figure 13:
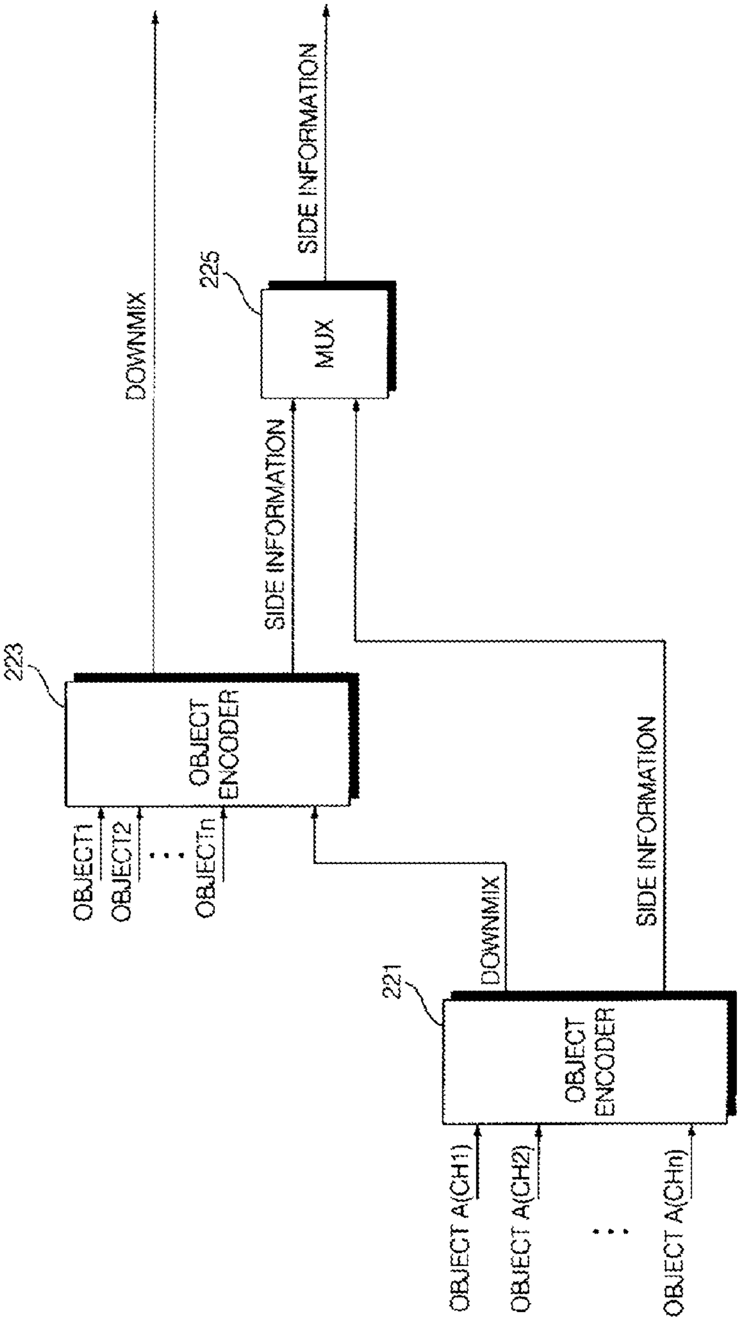
FIGS. 13 through 16 illustrate diagrams for explaining the configuration of object-based side information.

Referring to FIG. 13, a multi-channel object signal (OBJECT A(CH1) through OBJECT A(CHn)) is input to an object encoder 221. Then, the object encoder 221 generates a downmix signal and side information based on the multi-channel object signal (OBJECT A(CH1) through OBJECT A(CHn)). An object encoder 223 receives a plurality of object signals OBJECT1 through OBJECTn and the downmix signal generated by the object encoder 221 and generates another downmix signal and another side information based on the object signals OBJ.1 through OBJ.N and the received downmix signal. A multiplexer 225 incorporates the side information generated by the object encoder 221 and the side information generated by the object encoder 223.

Figure 14:
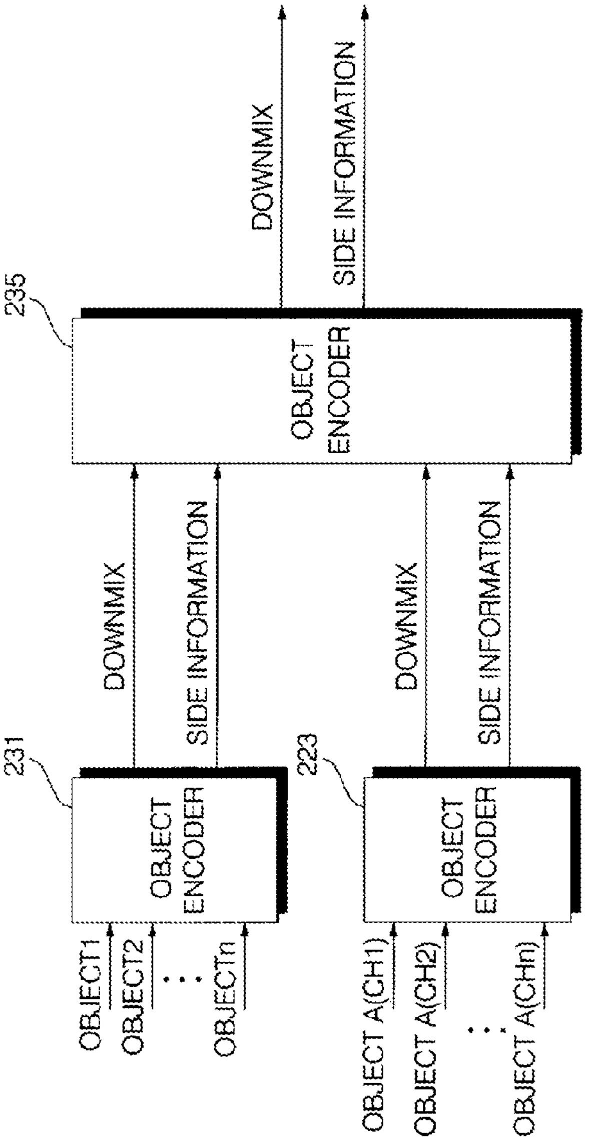

Referring to FIG. 14, an object encoder 233 generates a first bitstream based on a multi-channel object signal (OBJECT A(CH1) through OBJECT A(CHn)). Then, an object encoder 231 generates a second bitstream based on a plurality of non-multi-channel object signals OBJECT1 through OBJECTn. Then, an object encoder 235 combines the first and second bitstreams into a single bitstream by using almost the same method used to incorporate a plurality of bitstreams into a single bitstream with the aid of an MCU.

Figure 15:
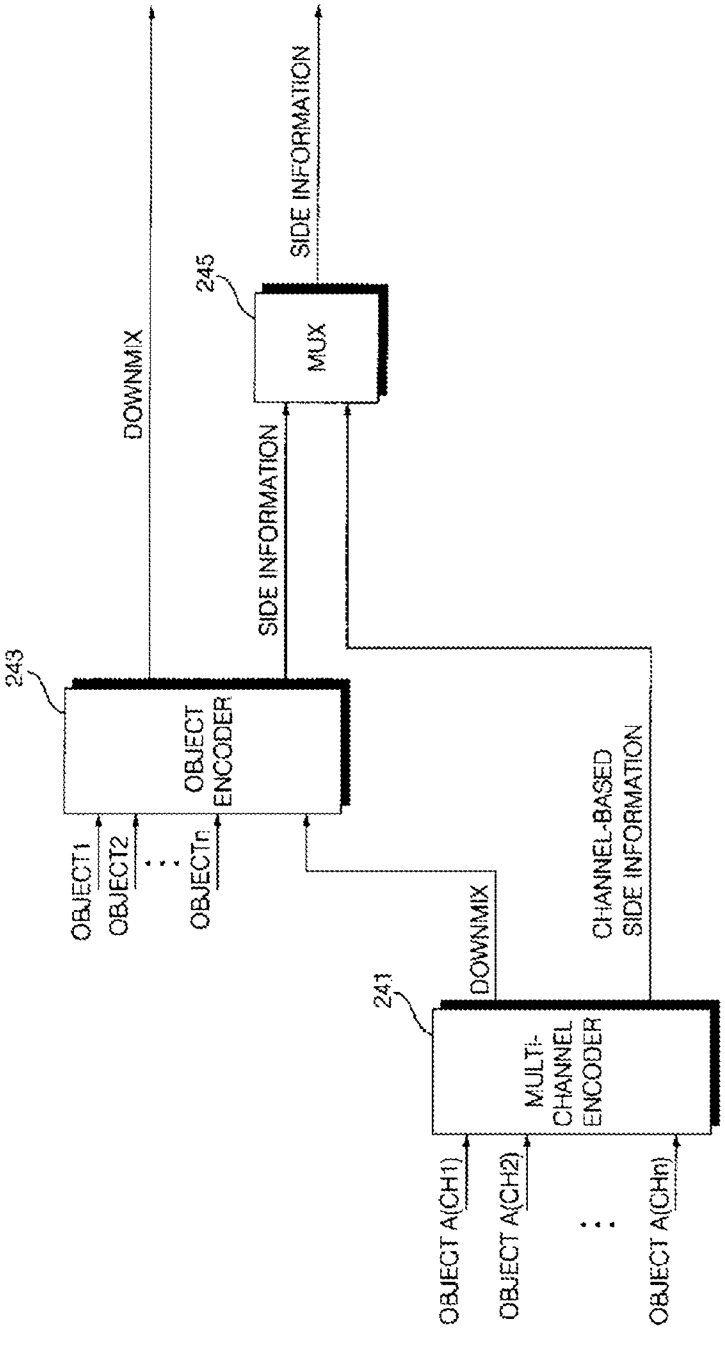

Referring to FIG. 15, a multi-channel encoder 241 generates a downmix signal and channel-based side information based on a multi-channel object signal (OBJECT A(CH1) through OBJECT A(CHn)). An object encoder 243 receives the downmix signal generated by the multi-channel encoder 241 and a plurality of non-multi-channel object signals OBJECT1 through OBJECTn and generates an object bitstream and side information based on the received downmix signal and the object signals OBJECT1 through OBJECTn. A multiplexer 245 combines the channel-based side information generated by the multi-channel encoder 241 and the side information generated by the object encoder 243 and outputs the result of the combination.

Figure 16:
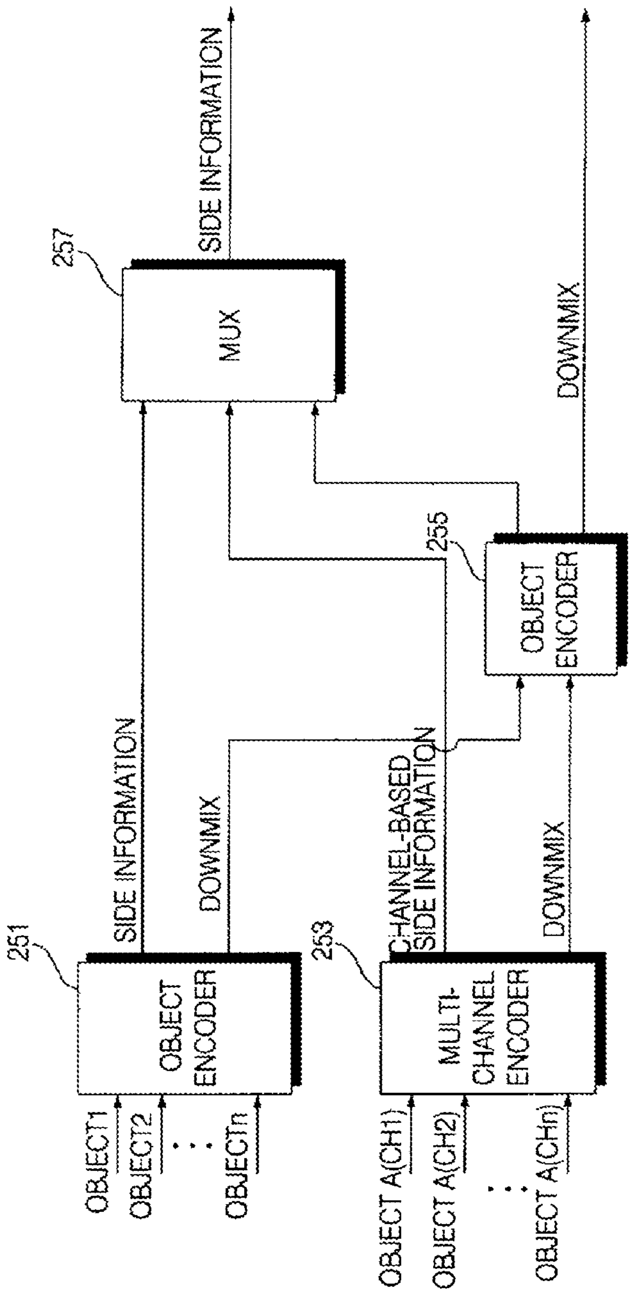

Referring to FIG. 16, a multi-channel encoder 253 generates a downmix signal and channel-based side information based on a multi-channel object signal (OBJECT A(CH1) through OBJECT A(CHn)). An object encoder 251 generates a downmix signal and side information based on a plurality of non-multi-channel object signals OBJECT1 through OBJECTn. An object encoder 255 receives the downmix signal generated by the multi-channel encoder 253 and the downmix signal generated by the object encoder 251 and combines the received downmix signals. A multiplexer 257 combines the side information generated by the object encoder 251 and the channel-based side information generated by the multi-channel encoder 253 and outputs the result of the combination.

In the case of using object-based audio encoding in teleconferencing, it is necessary sometimes to incorporate a plurality of object bitstreams into a single bitstream. The incorporation of a plurality of object bitstreams into a single object bitstream will hereinafter be described in detail.

Figure 17:
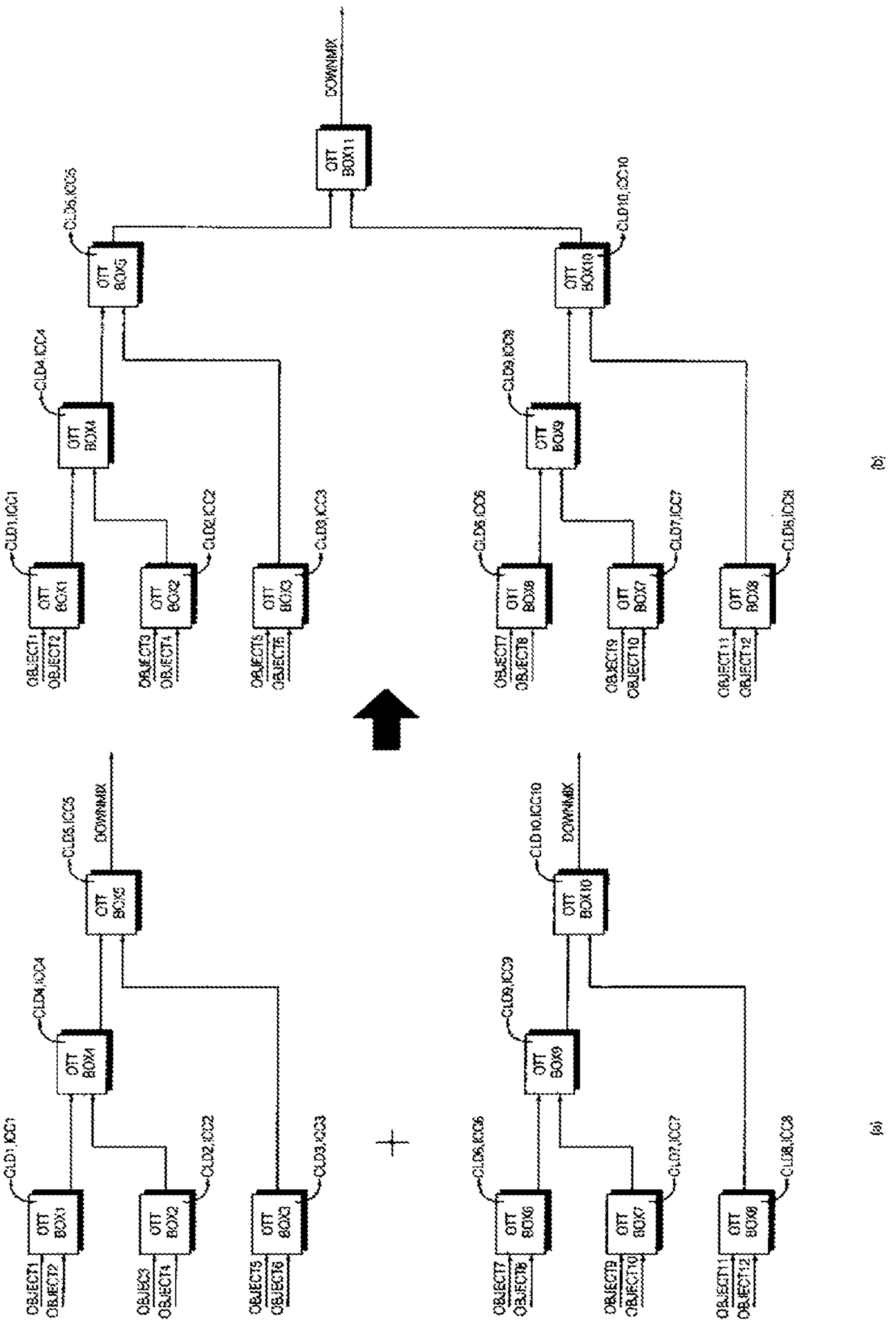
FIGS. 17 through 22 illustrate diagrams for explaining the incorporation of a plurality of pieces of object-based side information into a single piece of side information.

FIG. 17 illustrates a diagram for explaining the incorporation of two object bitstreams. Referring to FIG. 17, when two object bitstreams are incorporated into a single object bitstream, side information such as CLD and ICC information present in the two object bitstreams, respectively, needs to be modified. The two object bitstreams may be incorporated into a single object bitstream simply by using an additional OTT box, i.e., an eleventh OTT box, and using side information such as CLD and ICC information provided by the eleventh OTT box.

Tree configuration information of each of the two object bitstreams must be incorporated into integrated tree configuration information in order to incorporate the two object bitstreams into a single object bitstream. For this, additional configuration information, if any, generated by the incorporation of the two object bitstreams may be modified, the indexes of a number of OTT boxes used to generate the two object bitstreams may be modified, and only a few additional processes such as a computation process performed by the eleventh OTT box and the downmixing of two downmix signals of the two object bitstreams may be performed. In this manner, the two object bitstreams can be easily incorporated into a single object bitstream without the need to modify information regarding each of a plurality of object signals from which the two object signals originate.

Referring to FIG. 17, the eleventh OTT box may be optional. In this case, the two downmix signals of the two object bitstreams may be used as they are as a two-channel downmix signal. Thus, the two object bitstreams can be incorporated into a single object bitstream without a requirement of additional computation.

Figure 18:
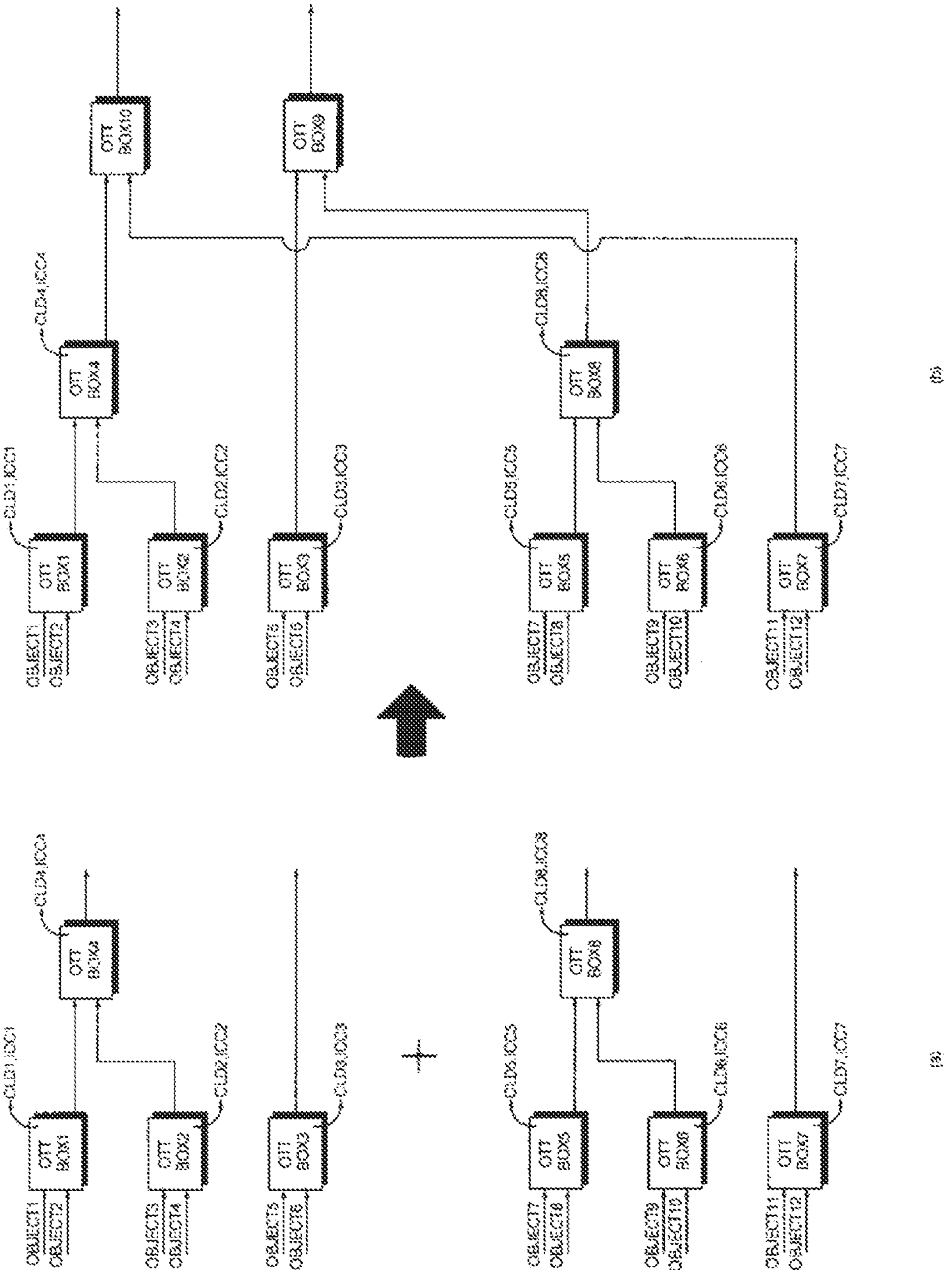

FIG. 18 illustrates a diagram for explaining the incorporation of two or more independent object bitstreams into a single object bitstream having a stereo downmix signal. Referring to FIG. 18, if two or more independent object bitstreams have different numbers of parameter bands, parameter band mapping may be performed on the object bitstreams so that the number of parameter bands of one of the object bitstreams having fewer parameter bands can be increased to be the same as the number of parameter bands of the other object bitstream.

More specifically, parameter band mapping may be performed using a predetermined mapping table. In this case, parameter band mapping may be performed using a simple linear formula.

If there are overlapping parameter bands, parameter values may be appropriately mixed in consideration of the amount by which the overlapping parameter bands overlap each other. In the situations when low complexity is prioritized, parameter band mapping may be performed on two object bitstreams so that the number of parameter bands of one of the two object bitstreams having more parameter bands can be reduced to be the same as the number of parameter bands of the other object bitstream.

In the embodiments of FIGS. 17 and 18, two or more independent object bitstreams can be incorporated into an integrated object bitstream without a requirement of the computation of existing parameters of the independent object bitstreams. However, in the case of incorporating a plurality of downmix signals, parameters regarding the downmix signals may need to be calculated again through QMF/hybrid analysis. However, this computation requires a large amount of computation, thereby compromising the benefits of the embodiments of FIGS. 17 and 18. Therefore, it is necessary to come up with methods of extracting parameters without a requirement of QMF/hybrid analysis or synthesis even when downmix signals are downmixed. For this, energy information regarding the energy of each parameter band of each downmix signal may be included in an object bitstream. Then, when downmix signals are downmixed, information such as CLD information may be easily calculated based on such energy information without a requirement of QMF/hybrid analysis or synthesis. Such energy information may represent a highest energy level for each parameter band or the absolute value of the energy level of a highest-energy object signal for each parameter band. The amount of computation may be further reduced by using ICC values obtained from a time domain for an entire parameter band.

During the downmix of a plurality of downmix signals, clipping may occur. In order to address this, the levels of downmix signals may be reduced. If the levels of downmix signals are reduced, level information regarding the reduced levels of the downmix signals may need to be included in an object bitstream. The level information for preventing clipping may be applied to each frame of an object bitstream or may be applied only to some frames in which clipping occurs. The levels of the original downmix signals may be calculated by inversely applying the level information for preventing clipping during a decoding operation. The level information for preventing clipping may be calculated in a time domain and thus does not need to be subjected to QMF/hybrid synthesis or analysis. The incorporation of a plurality of object signals into a single object bitstream may be performed using the structure illustrated in FIG. 12, and this will hereinafter be described in detail with reference to FIG. 19.

Figure 19:
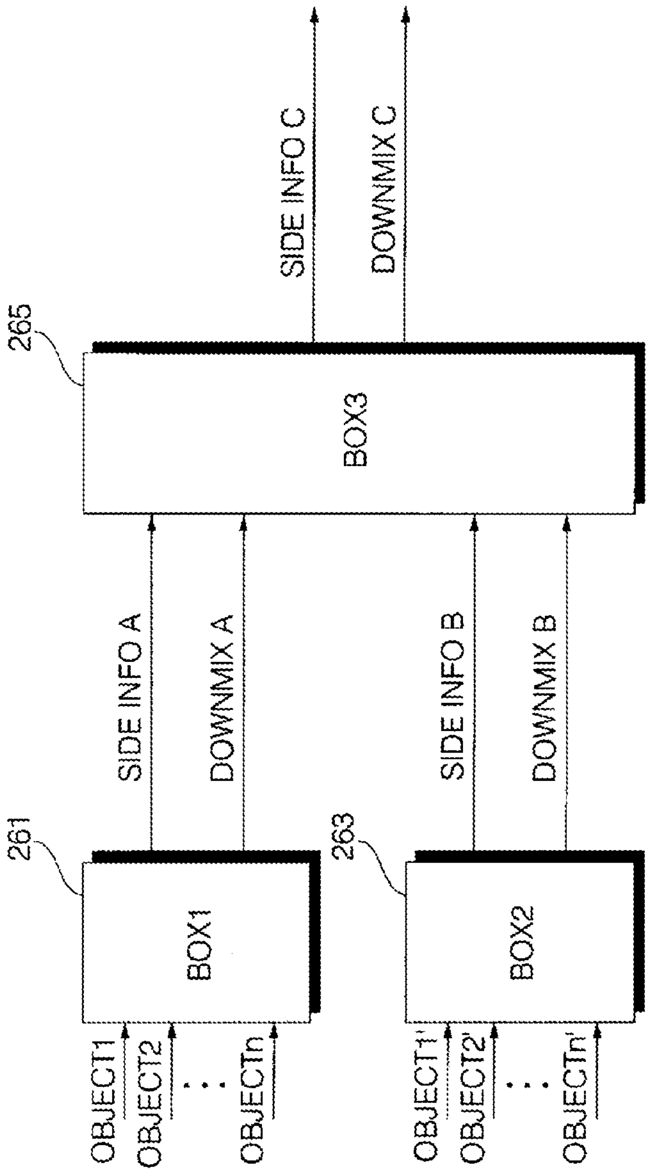

FIG. 19 illustrates a diagram for explaining the incorporation of two independent object bitstreams into a single object bitstream. Referring to FIG. 19, a first box 261 generates a first object bitstream, and a second box 263 generates a second object bitstream. Then, a third box 265 generates a third object bitstream by combining the first and second bitstreams. In this case, if the first and second object bitstreams include information the absolute value of the energy level of a highest-energy object signal for each parameter band and the ratios of the energy levels of other non-highest-energy object signals to the energy level of the highest-energy object signal and gain information regarding gain values, which are multiplied by downmix signals by the first and second boxes 261 and 263, the third box 265 may generate the third object bitstream simply by incorporating the first and second bitstreams without a requirement of additional parameter computation or extraction.

The third box 265 receives a plurality of downmix signals DOWNMIX_A and DOWNMIX_B. The third box 265 converts the downmix signals DOWNMIX_A and DOWNMIX_B into PCM signals and adds up the PCM signals, thereby generating a single downmix signal. During this process, however, clipping may occur. In order to address this, the downmix signals DOWNMIX_A and DOWNMIX_B may be multiplied by a predefined gain value. Information regarding the predefined gain value may be included in the third object bitstream and transmitted along with the third object bitstream.

The incorporation of a plurality of object bitstreams into a single object bitstream will hereinafter be described in further detail. Referring to FIG. 19, SIDE INFO A may include absolute object energy information regarding energy level of a highest-energy object signal among a plurality of object signals OBJECT1 through OBJECTn and object energy ratio information indicating the ratios of the energy levels of the other non-highest-energy object signals to the energy level of the highest-energy object signal. Likewise, SIDE INFO B may include absolute object energy information regarding energy level of a highest-energy object signal among a plurality of object signals OBJECT1' through OBJECTn' and object energy ratio information indicating the ratios of the energy levels of the other non-highest-energy object signals to the energy level of the highest-energy object signal.

Figure 20:
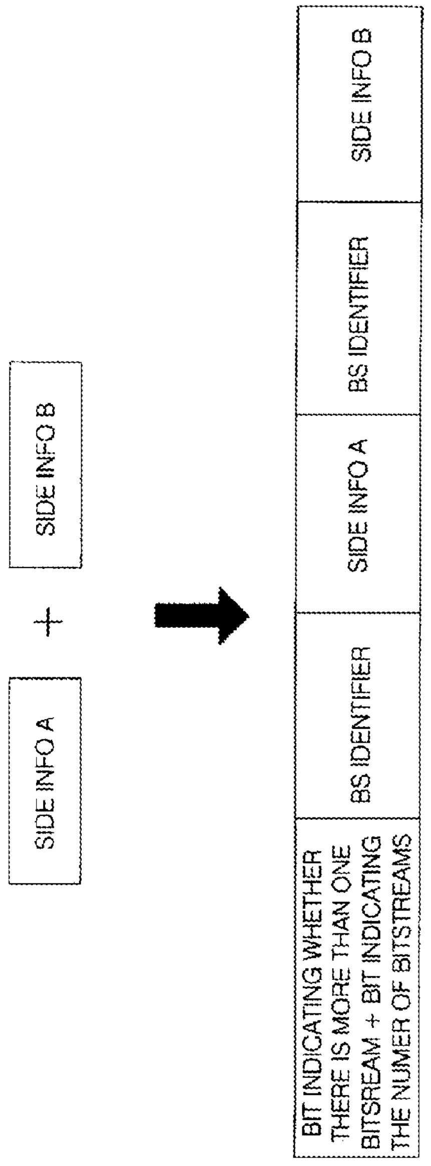

SIDE_INFO_A and SIDE_INFO_B may be included in parallel in one bitstream, as illustrated in FIG. 20. In this case, a bit indicating whether more than one bitstream exists in parallel may be additionally provided.

Referring to FIG. 20, in order to indicate whether a predetermined bitstream is an integrated bitstream including more than one bitstream therein or not, information indicating whether the predetermined bitstream is an integrated bitstream, information regarding the number of bitstreams, if any, included in the predetermined bitstream, and information regarding the original positions of bitstreams, if any, included in the predetermined bitstream may be provided at the head of the predetermined bitstream and followed by more than one bitstream, if any, in the predetermined bitstream. In this case, a decoder may determine whether the predetermined bitstream is an integrated bitstream including more than one bitstream by analyzing the information at the head of the predetermined bitstream. This type of bitstream incorporation method does not require additional processes, other than the addition of a few identifiers to a bitstream. However, such identifiers need to be provided at intervals of a number of frames. In addition, this type of bitstream incorporation method requires a decoder to determine whether every bitstream that the decoder receives is an integrated bitstream or not.

As an alternative to the above-mentioned bitstream incorporation method, a plurality of bitstreams may be incorporated into a single bitstream in such a manner that a decoder cannot recognize that the single bitstream is an integrated bitstream or not. This will hereinafter be described in detail with reference to FIG. 21.

Figure 21:
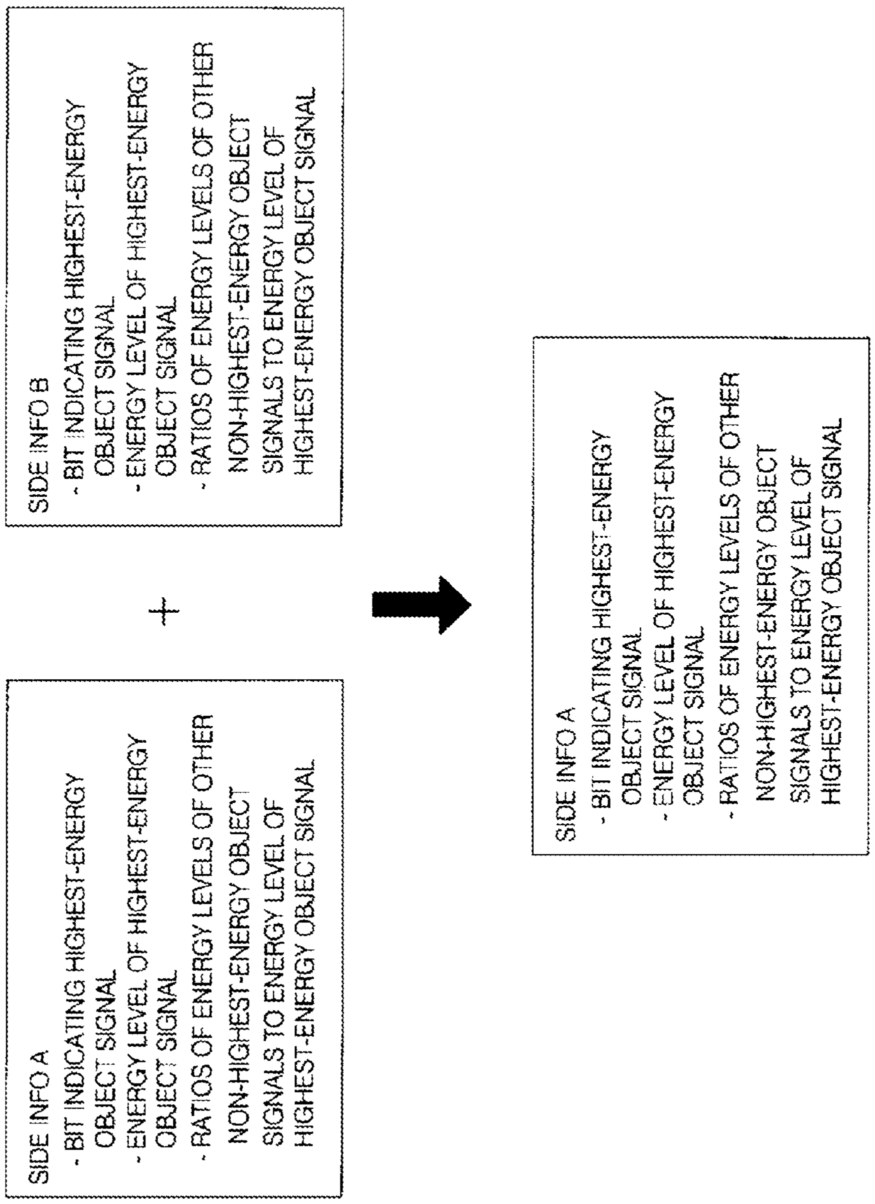

Referring to FIG. 21, the energy level of a highest-energy object signal represented by SIDE_INFO_A and the energy level of a highest-energy object signal represented by SIDE_INFO_B are compared. Then, whichever of the two object signals has a higher energy level is determined to be a highest-energy object signal of an integrated bitstream. For example, if the energy level of the highest-energy object signal represented by SIDE_INFO_ A is higher than the energy level of the highest-energy object signal represented by SIDE_INFO_B, the highest-energy object signal represented by SIDE_INFO_A may become a highest-energy object signal of an integrated bitstream. Then, energy ratio information of SIDE_INFO_A may be used in the integrated bitstream as it is, whereas energy ratio information of SIDE_INFO_B may be multiplied by the ratio of the energy levels of the highest-energy object signal among object signals represented by SIDE_INFO_B to the highest-energy object signal among object signals represented by SIDE_INFO_A.

Then, energy ratio information of whichever of SIDE_INFO_A and SIDE_INFO_B includes information regarding the highest-energy object signal of the integrated bitstream may be used in the integrated bitstream, and energy ratio information of the highest-energy object signal represented by Param A and the highest-energy object signal represented by SIDE_INFO_B. This method involves the recalculation of energy ratio information of SIDE_INFO_B. However, the recalculation of energy ratio information of SIDE_INFO_B is relatively not complicated. In this method, a decoder may not be able to determine whether a bitstream that it receives is an integrated bitstream including more than one bitstream or not, and thus, a typical decoding method may be used.

Two object bitstreams including stereo downmix signals may be easily incorporated into a single object bitstream without a requirement of the recalculation of information regarding object signals by using almost the same method used to incorporate bitstreams including mono downmix signals. In an object bitstream, information regarding a tree structure that downmixes object signals is followed by object signal information obtained from each branch (i.e., each box) of the tree structure.

Object bitstreams have been described above, assuming that certain object are only distributed to a left channel or a right channel of a stereo downmix signal. However, object signals are generally distributed between both channels of a stereo downmix signal. Therefore, it will hereinafter be described in detail how to generate an object bitstream based on object bitstreams that are distributed between two channels of a stereo downmix signal.

Figure 22:
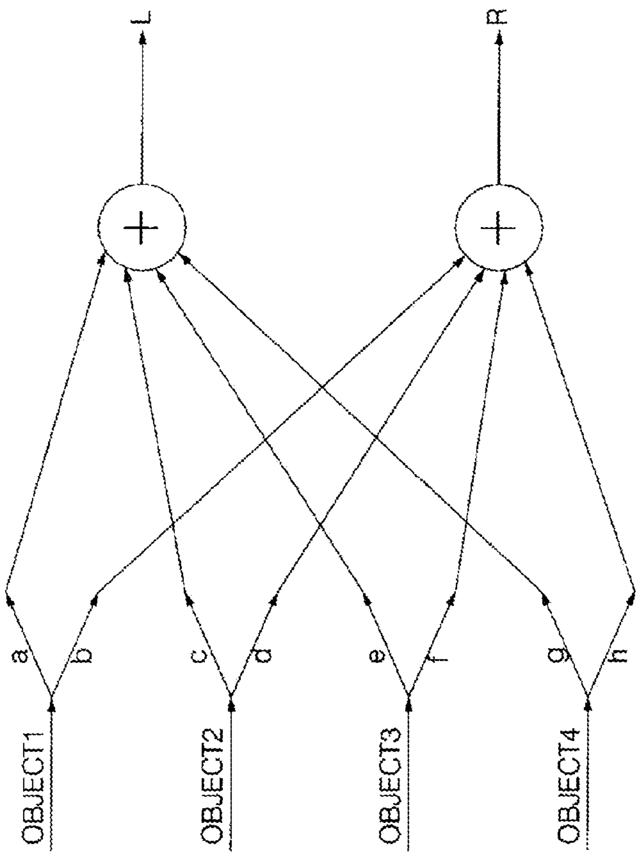

FIG. 22 illustrates a diagram for explaining a method of generating a stereo downmix signal by mixing a plurality of object signals, and more particularly, a method of downmixing four object signals OBJECT1 through OBJECT4 into L and R stereo signals. Referring to FIG. 22, some of the four object signals OBJECT1 through OBJECT4 belong to both L and R channels of a downmix signal. For example, the first object signal OBJECT1 is distributed between the L and R channels at a ratio of a:b, as indicated by Equation (3):

[Equation 3]

$$Eng_{Obj1_L} = \frac{a}{a+b} Eng_{Obj1}$$

$$Eng_{Obj1_R} = \frac{b}{a+b} Eng_{Obj1}$$

If an object signal is distributed between the L and R channels of a stereo downmix signal, channel distribution ratio information regarding the ratio (a:b) at which the object signal is distributed between the L and R channels may be additionally required. Then, information regarding the object signal such as CLD and ICC information may be calculated by performing downmixing using OTT boxes for the L and R channels of a stereo downmix signal, and this will hereinafter be described in further detail with reference to FIG. 23.

Figure 23:
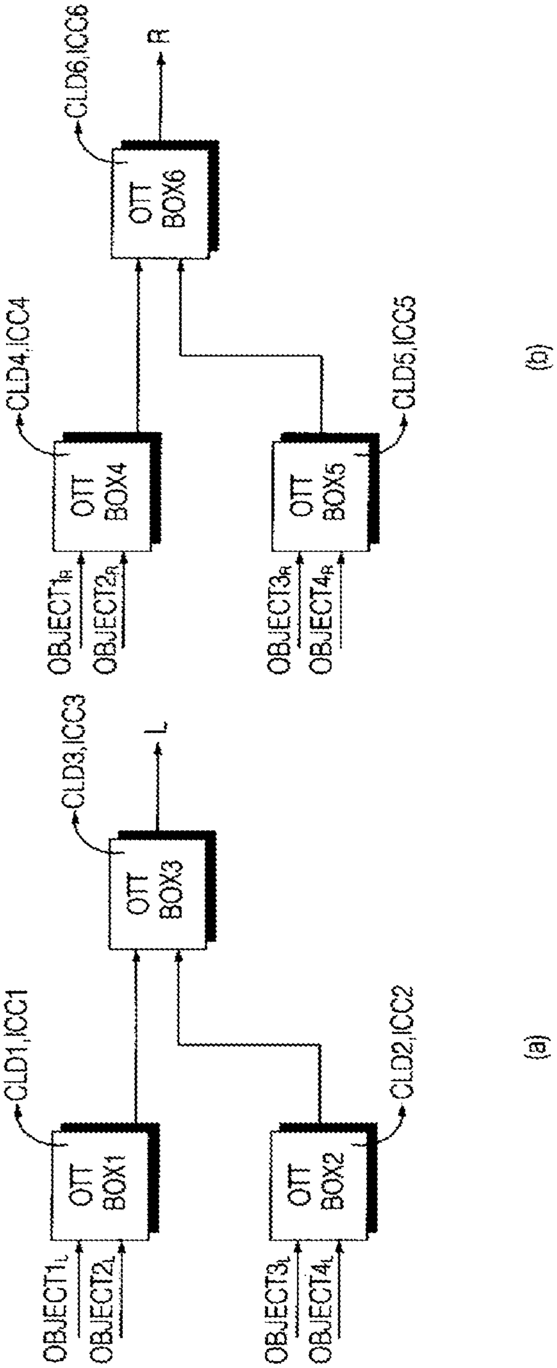
FIGS. 23 through 27 illustrate diagrams for explaining a preprocessing operation.

Referring to FIG. 23, once CLD and ICC information obtained from a plurality of OTT boxes during a downmixing operation and channel distribution ratio information of each of a plurality of object signals is provided, it is possible to calculate a multi-channel bitstream that varies adaptively to any modification made to object position information and playback configuration information by an end user. In addition, if a stereo downmix signal needs to be processed through downmix preprocessing, it is possible to obtain information regarding how the stereo downmix signal is processed through downmix preprocessing and to transmit the obtained information to a preprocessor. That is, if there is no channel distribution ratio information of each of a plurality of object signals provided, there is no way to calculate a multi-channel bitstream and obtain information necessary for the operation of a preprocessor. Channel distribution ratio information of an object signal may be represented as a ratio of two integers or a scalar (unit:dB).

As described above, if an object signal is distributed between two channels of a stereo downmix signal, channel distribution ratio information of the object signal may be required. Channel distribution ratio information may have a fixed value indicating the ratio at which an object signal is distributed between two channels of a stereo downmix signal. Alternatively, channel distribution ratio information of an object signal may vary from one frequency band to another frequency band of the object signal especially when the channel distribution ratio information is used as ICC information. If a stereo downmix signal is obtained by a complicated downmix operation, i.e., if an object signal belongs to two channels of a stereo downmix signal and is downmixed by varying ICC information from one frequency band to another frequency band of the object signal, a detailed description of the downmixing of the object signal may be additionally required in order to decode a finally-rendered object signal. This embodiment may be applied to all possible object structures that have already been described.

Thereafter, preprocessing will hereinafter be described in detail with reference to FIGS. 24 through 27. If a downmix signal input to an object decoder is a stereo signal, the input downmix signal may need to be preprocessed before being input to a multi-channel decoder of the object decoder because the multi-channel decoder cannot map a signal belonging to a left channel of the input downmix signal to a right channel. Therefore, in order for an end user to shift the position of an object signal belonging to the left channel of the input downmix signal to a right channel, the input downmix signal may need to be preprocessed, and the preprocessed downmix signal may be input to the multi-channel decoder.

The preprocessing of a stereo downmix signal may be performed by obtaining preprocessing information from an object bitstream and from a rendering matrix and appropriately processing the stereo downmix signal according to the preprocessing information, and this will hereinafter be described in detail.

Figure 24:
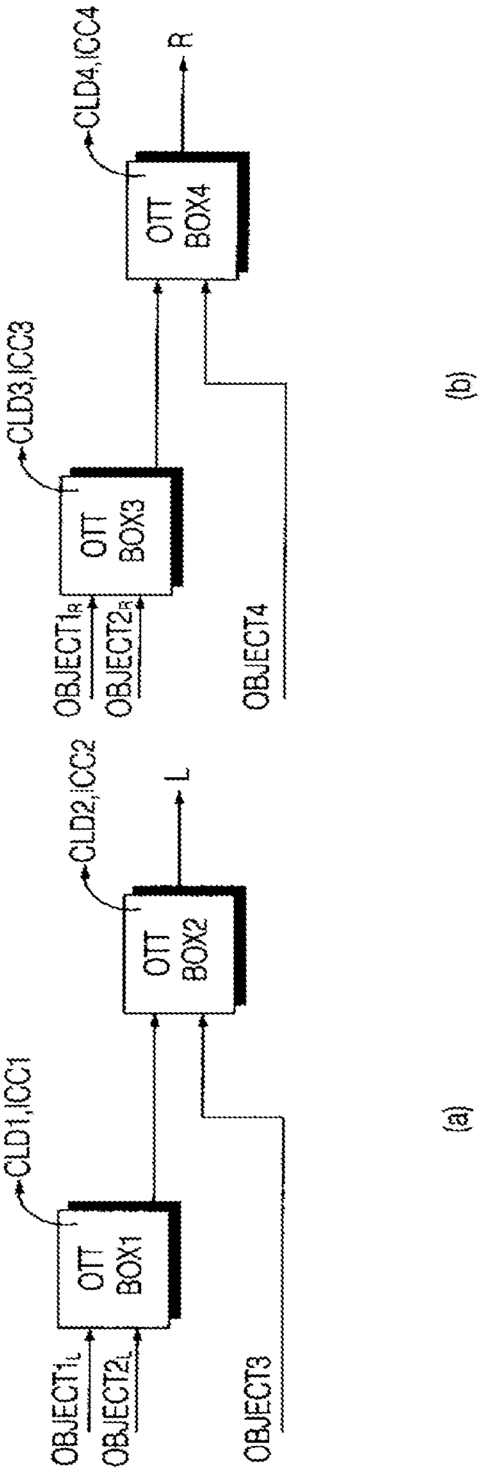

FIG. 24 illustrates a diagram for explaining how to configure a stereo downmix signal based on four object signals OBJECT1 through OBJECT4. Referring to FIG. 24, the first object signal OBJECT1 is distributed between L and R channels at a ratio of a:b, the second object signal OBJECT2 is distributed between the L and R channels at a ratio of c:d, the third object signal OBJECT3 is distributed only to the L channel, and the fourth object signal OBJECT4 is distributed only to the R channel. Information such as CLD and ICC may be generated by passing each of the first through fourth object signals OBJECT1 through OBJECT4 through a number of OTT, and a downmix signal may be generated based on the generated information.

Assume that an end user obtains a rendering matrix by appropriately setting the positions and the levels of the first through fourth object signals OBJECT1 through OBJECT4, and that there are five channels. The rendering matrix may be represented by Equation (4):

$$\begin{bmatrix} 30 & 10 & 20 & 30 & 10 \\ 10 & 30 & 20 & 10 & 30 \\ 22 & 22 & 22 & 22 & 22 \\ 21 & 21 & 31 & 11 & 11 \end{bmatrix} \quad \text{[Equation 4]}$$

Referring to Equation (4), when the sum of five coefficients in each of the four rows is equal to a predefined reference value, i.e., 100, it is determined that the level of a corresponding object signal has not been varied. The amount by which the sum of the five coefficients in each of the four rows is discrepant from the predefined reference value may be the amount (unit: dB) by which the level of a corresponding object signal has been varied. The first, second, third, fourth and fifth columns of the rendering matrix of Equation (4) represent FL, FR, C, RL, and RR channels, respectively.

The first row of the rendering matrix of Equation (4) corresponds to the first object signal OBJECT1 and has a total of five coefficients, i.e., 30, 10, 20, 30, and 10. Since the sum of the five coefficients of the first row is 100, it is determined that the level of the first object signal OBJECT1 has not been varied, and that only the spatial position of the first object signal OBJECT1 has changed. Even though the five coefficients of the first row represent different channel directions, they may be largely classified into two channels: L and R channels. Then, the ratio at which the first object signal OBJECT1 is distributed between the L and R channels may be calculated as 70% (=(30+30+20)*0.5):30% (=(10+10+20)*0.5). Therefore, the rendering matrix of Equation (4) indicates that the level of the first object signal OBJECT1 has not been varied, and that the first object signal OBJECT1 is distributed between the L and R channels at a ratio of 70%:30%. If the sum of five coefficients of any one of the rows of the rendering matrix of Equation (4) is less than or greater than 100, it may be determined that the level of a corresponding object signal has changed, and then, the corresponding object signal may be processed through preprocessing or may be converted into and transmitted as ADG.

In order to preprocess downmix signals, the ratio at which the downmix signals are distributed between parameter bands, from which parameters are extracted from signals obtained by performing QMF/hybrid conversion on the downmix signals, may be calculated, and the downmix signals may be redistributed between the parameter bands according to the setting of a rendering matrix. Various methods of redistributing downmix signals between parameter bands will hereinafter be described in detail.

In a first redistribution method, L- and R-channel downmix signals are decoded separately using their respective side information (such as CLD and ICC information) and using almost the same method used by a multi-channel codec. Then, object signals distributed between the L- and R-channel downmix signals are restored. In order to reduce the amount of computation, the L- and R-channel downmix signals may be decoded only using CLD information. The ratio at which each of the restored object signals is distributed between the L- and R-channel downmix signals may be determined based on side information.

Each of the restored object signals may be redistributed between the L- and R-channel downmix signals according to a rendering matrix. Then, the redistributed object signals are downmixed on a channel-by-channel basis by OTT boxes, thereby completing preprocessing. In short, the first redistribution method adopts the same method used by a multi-channel codec. However, the first redistribution method requires as many decoding processes as there are object signals for each channel, and requires a redistribution process and a channel-based downmix process.

Figure 25:
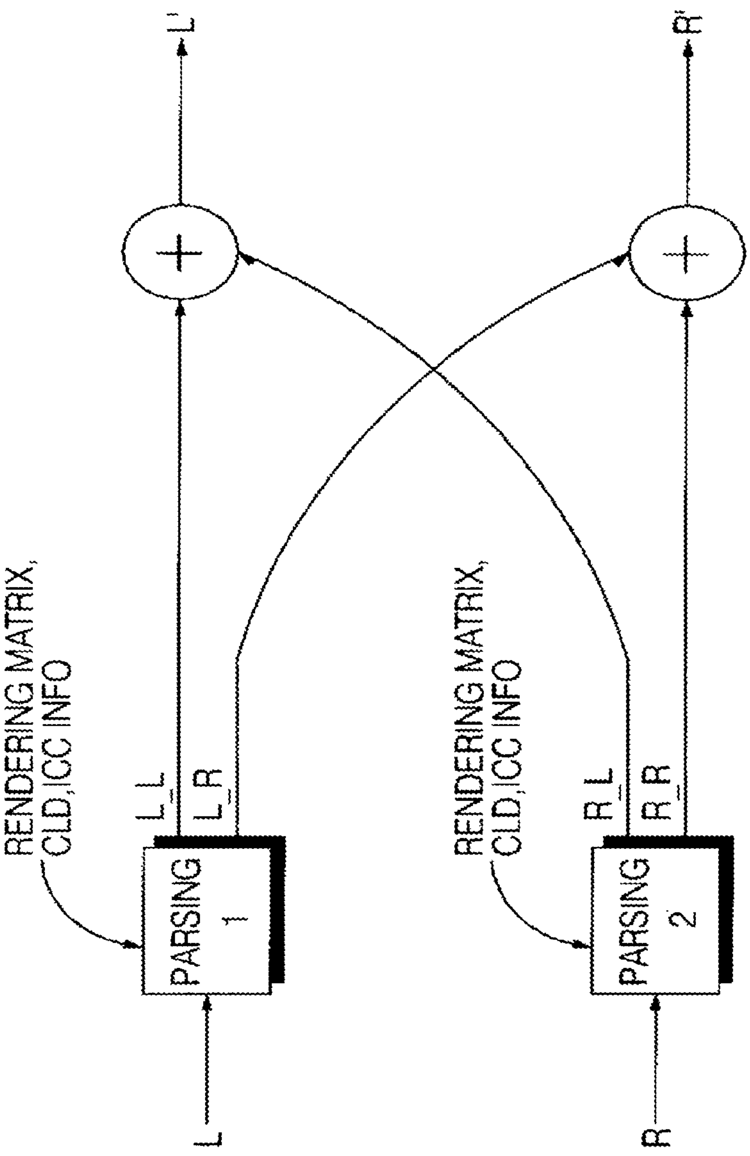

In a second redistribution method, unlike in the first redistribution method, object signals are not restored from L- and R-downmix signals. Instead, each of the L- and R-downmix signals is divided into two portions: one portion L_L or R_R that should be left in a corresponding channel and the other portion L_R or R_L that should be redistributed, as illustrated in FIG. 25. Referring to FIG. 25, L_L indicates a portion of the L-channel downmix signal that should be left in an L channel, and L_R indicates a portion of the L-channel downmix signal that should be added to an R channel. Likewise, R_R indicates a portion of the R-channel downmix signal that should be left in the R channel, and R_L indicates a portion of the R-channel downmix signal that should be added to the L channel. Each of the L- and R-channel downmix signals may be divided into two portions (L_L and L_R or R_R and R_L) according to the ratio at which each object signal is distributed between the L- and R-downmix signals, as defined by Equation (2), and the ratio at which each object signal should be distributed between preprocessed L' and R' channels as defined by Equation (3). Therefore, it may be determined how the L- and R-channel downmix signals should be redistributed between the preprocessed L' and R' channels by comparing the ratio at which each object signal is distributed between the L- and R-downmix signals and the ratio at which each object signal should be distributed between preprocessed L' and R' channels.

The division of an L-channel signal into signals L_L and L_R according to a predefined energy ratio has been described above. Once the L-channel signal is divided into signals L_L and L_R, an ICC between the signals L_L and L_R may need to be determined. The ICC between the signals L_L and L_R may be easily determined based on ICC information regarding object signals. That is, the ICC between the signals L_L and L_R may be determined based on the ratio at which each object signal is distributed between the signals L_L and L_R.

The second downmix redistribution method will hereinafter be described in further detail. Assume that L- and R-channel downmix signals L and R are obtained by the method illustrated in FIG. 24, and that first, second, third and fourth object signals OBJECT1, OBJECT2, OBJECT3, and OBJECT4 are distributed between the L- and R-channel downmix signals L and R at ratios of 1:2, 2:3, 1:0, and 0:1, respectively. A plurality of object signals may be downmixed by a number of OTT boxes, and information such as CLD and ICC information may be obtained from the downmixing of the object signals.

An example of a rendering matrix established for the first through fourth object signals OBJECT1 through OBJECT4 is as represented by Equation (4). The rendering matrix includes position information of the first through fourth object signals OBJECT1 through OBJECT4. Thus, preprocessed L' and R' channel downmix signals may be obtained by performing preprocessing using the rendering matrix. How to establish and interpret the rendering matrix has already been described above with reference to Equation (3).

The ratio at which each of the first through fourth object signals OBJECT1 through OBJECT4 is distributed between the preprocessed L' and R' channel downmix signals may be calculated as indicated by Equation (5):

$$\text{Object1}:Eng_{Obj1_{L'}}=30+30+20*0.5=70,\ Eng_{Obj1_{R'}}=10+10+20*0.5=30\ Eng_{Obj1_{L'}}:Eng_{Obj1_{R'}}=70:30$$

$$\text{Object2}:Eng_{Obj2_{L'}}=10+10+20*0.5=30,\ Eng_{Obj2_{R'}}=30+30+20*0.5=70\ Eng_{Obj2_{L'}}:Eng_{Obj2_{R'}}=30:70$$

$$\text{Object3}:Eng_{Obj3_{L'}}=22+22+22*0.5=55,\ Eng_{Obj3_{R'}}=22+22+22*0.5=55\ Eng_{Obj3_{L'}}:Eng_{Obj3_{R'}}=55:55$$

$$\text{Object4}:Eng_{Obj4_{L'}}=21+11+31*0.5=47.5,\ Eng_{Obj4_{R'}}=21+11+31*0.5=47.5\ Eng_{Obj4_{L'}}:Eng_{Obj4_{R'}}=47.5:47.5\ *195 \quad \text{[Equation 5]}$$

The ratio at which each of the first through fourth object signals OBJECT1 through OBJECT4 is distributed between the L- and R-channel downmix signals L and R may be calculated as indicated by Equation (6):

$$\text{Object1}:\text{Eng}_{Obj1_L}:\text{Eng}_{Obj1_R}=1:2.$$

$$\text{Object2}:\text{Eng}_{Obj2_L}:\text{Eng}_{Obj2_R}=2:3$$

$$\text{Object3}:\text{Eng}_{Obj3_L}:\text{Eng}_{Obj3_R}=1:0$$

$$\text{Object4}:\text{Eng}_{Obj4_L}:\text{Eng}_{Obj4_R}=0:1 \quad \text{[Equation 6]}$$

Referring to Equation (5), the sum of part of the third object signal OBJECT3 distributed to the preprocessed L-channel downmix signal (L') and part of the third object signal OBJECT3 distributed to the R-channel downmix signal (R') is 110, and thus, it is determined that the level of the third object signal OBJECT3 has been increased by 10. On the other hand, the sum of part of the fourth object signal OBJECT4 distributed to the preprocessed L-channel downmix signal (L') and part of the fourth object signal OBJECT4 distributed to the R-channel downmix signal (R') is 95, and thus, it is determined that the level of the fourth object signal OBJECT4 has been reduced by 5. If the rendering matrix for the first through fourth object signals OBJECT1 through OBJECT4 has a reference value of 100 and the amount by which the sum of the coefficients in each of the rows of the rendering matrix is discrepant from the reference value of 100 represents the amount (unit: dB) by which the level of a corresponding object signal has been varied, it may be determined that the level of the third object signal OBJECT3 has been increased by 10 dB, and that the level of the fourth object signal OBJECT4 has been reduced by 5 dB.

Equations (5) and (6) may be rearranged into Equation (7):

$$\text{Object1}:\text{Eng}_{Obj1_L}:\text{Eng}_{Obj1_R}=33.3:66.7\ \text{Eng}_{Obj1_{L'}}:\text{Eng}_{Obj1_{R'}}=70:30$$

$$\text{Object2}:\text{Eng}_{Obj2_L}:\text{Eng}_{Obj2_R}=40:60\ \text{Eng}_{Obj2_{L'}}:\text{Eng}_{Obj2_{R'}}=30:70$$

$$\text{Object3}:\text{Eng}_{Obj3_L}:\text{Eng}_{Obj3_R}=100:0\ \text{Eng}_{Obj3_{L'}}:\text{Eng}_{Obj3_{R'}}=50:50$$

$$\text{Object4}:\text{Eng}_{Obj4_L}:\text{Eng}_{Obj4_R}=0:100\ \text{Eng}_{Obj4_{L'}}:\text{Eng}_{Obj4_{R'}}=50:50 \quad \text{[Equation 7]}$$

Equation (7) compares the ratio at which each of the first through fourth object signals OBJECT1 through OBJECT4 is distributed between L- and R-channel downmix signals before being preprocessed and the ratio at which each of the first through fourth object signals OBJECT1 through OBJECT4 is distributed between the L- and R-channel downmix signals after being preprocessed. Therefore, by using Equation (7), it is possible to easily determine how much of each of the first through fourth object signals OBJECT1 through OBJECT4 should be redistributed through preprocessing. For example, referring to Equation (7), the ratio at which the second object signal OBJECT2 is distributed between the L- and R-channel downmix signals changes from 40:60 to 30:70, and thus, it may be determined that one fourth (25%) of part of the second object signal OBJECT2 previously distributed to the L-channel downmix signal needs to be shifted to the R-channel downmix signal. This may become more apparent by referencing Equation (8):

OBJECT1:55% of part of OBJECT1 previously distributed to R needs to be shifted to L OBJECT2:25% of part of OBJECT1 previously distributed to L needs to be shifted to R OBJECT3:50% of part of OBJECT1 previously distributed to L needs to be shifted to R OBJECT4:50% of part of OBJECT1 previously distributed to R needs to be shifted to L. [Equation 8]

By using Equation (8), signals L_L, L_R, R_L and R_R of FIG. 25 may be represented, as indicated by Equation (9):

$$Eng_{L\_L}=Eng_{Obj1_L}+0.75\cdot Eng_{Obj2_L}+0.5\cdot Eng_{Obj3}$$

$$Eng_{L\_R}=0.25\cdot Eng_{Obj2_L}+0.5\cdot Eng_{Obj3}$$

$$Eng_{R\_L}=0.55\cdot Eng_{Obj1_R}+0.5\cdot Eng_{Obj4}$$

$$Eng_{R\_R}=0.45\cdot Eng_{Obj1_R}+Eng_{Obj2_R}+0.5\cdot Eng_{Obj4} \quad \text{[Equation 9]}$$

The value of each object signal in Equation (9) may be represented as the ratio at which a corresponding object signal is distributed between L and R channels by using dequantized CLD information provided by an OTT box, as indicated by Equation (10):

[Equation 10]

$$Eng_{Obj1_L}=\frac{10^{\frac{CLD2}{10}}}{1+10^{\frac{CLD2}{10}}}\cdot\frac{10^{\frac{CLD1}{10}}}{1+10^{\frac{CLD1}{10}}}\cdot Eng_L,$$

$$Eng_{Obj2_L}=\frac{10^{\frac{CLD2}{10}}}{1+10^{\frac{CLD2}{10}}}\cdot\frac{1}{1+10^{\frac{CLD1}{10}}}\cdot Eng_L$$

$$Eng_{Obj1_R}=\frac{10^{\frac{CLD4}{10}}}{1+10^{\frac{CLD4}{10}}}\cdot\frac{10^{\frac{CLD3}{10}}}{1+10^{\frac{CLD3}{10}}}\cdot Eng_R,$$

$$Eng_{Obj2_R}=\frac{10^{\frac{CLD4}{10}}}{1+10^{\frac{CLD4}{10}}}\cdot\frac{1}{1+10^{\frac{CLD3}{10}}}\cdot Eng_R$$

$$Eng_{Obj3}=\sqrt{\frac{1}{1+10^{\frac{CLD2}{10}}}}\cdot Eng_L,$$

$$Eng_{Obj4}=\frac{1}{1+10^{\frac{CLD4}{10}}}\cdot Eng_R$$

*225 CLD information used in each parsing block of FIG. 25 may be determined, as indicated by Equation (11):

[Equation 11]

$$CLD_{pars1}=10\log_{10}\left(\frac{L\_L+\varepsilon}{L\_R+\varepsilon}\right)$$

$$CLD_{pars2}=10\log_{10}\left(\frac{R\_L+\varepsilon}{R\_R+\varepsilon}\right)$$

$\varepsilon$: A constant to avoid division by zero, e.g. 96 dB below maximum signal input.

Figure 26:
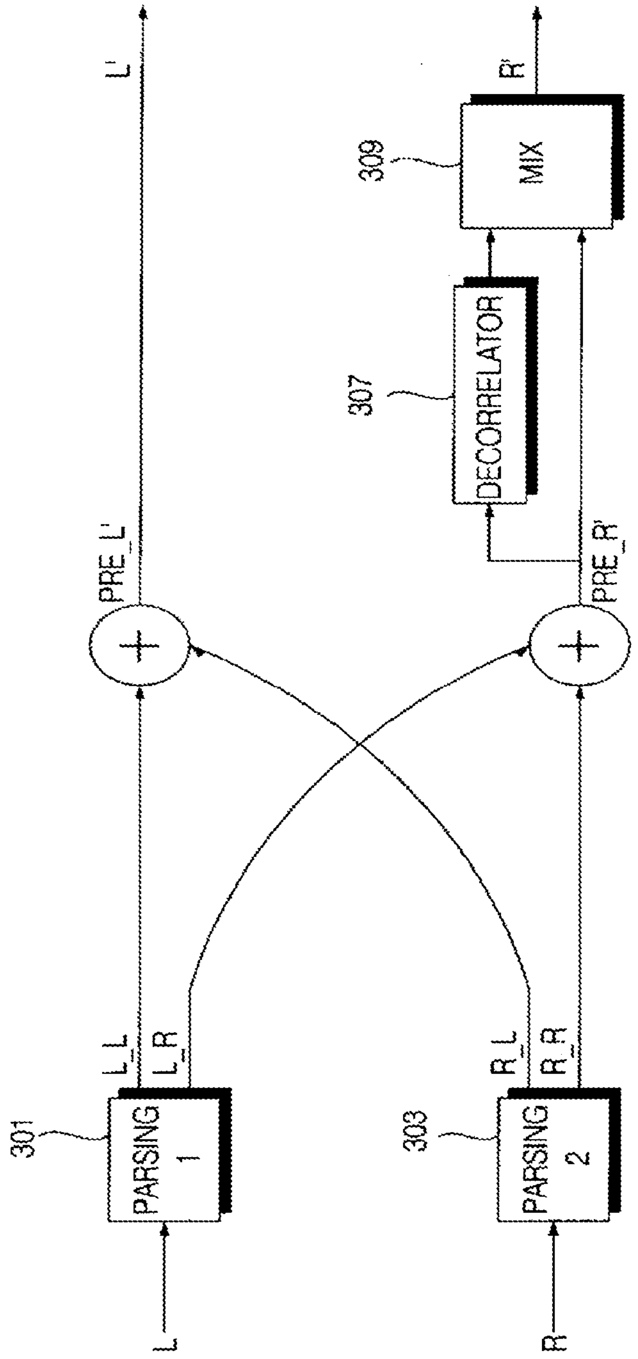

In this manner, CLD and ICC information used in a parsing block for generating the signals L_L and L_R based on an L-channel downmix signal may be determined, and CLD and ICC information used in a parsing block for generating the signals R_L and R_R signals based on an R-channel downmix signal may also be determined. Once the signals L_L, L_R, R_L, and R_R are obtained, as illustrated in FIG. 25, the signals L_R and R_R may be added, thereby obtaining a preprocessed stereo downmix signal. If a final channel is a stereo channel, L- and R-channel downmix signals obtained by preprocessing may be output. In this case, a variation, if any, in the level of each object signal is yet to be adjusted. For this, a predetermined module which performs the functions of an ADG module may be additionally provided. Information for adjusting the level of each object signal may be calculated using the same method used to calculate ADG information, and this will be described later in further detail. Alternatively, the level of each object signal may be adjusted during a preprocessing operation. In this case, the adjustment of the level of each object signal may be performed using the same method used to process ADG. Alternatively to the embodiment of FIG. 25, a decorrelation operation may be performed by a decorrelator and a mixer, rather than by parsing modules PARSING 1 and PARSING 2, as illustrated in FIG. 26, in order to adjust the correlation between signals L' and R' obtained by mixing. Referring to FIG. 26, Pre_L' and Pre_R' indicate L- and R-channel signals obtained by level adjustment. One of the signals Pre_L' and Pre_R' may be input to the decorrelator, and then subjected to a mixing operation performed by the mixer, thereby obtaining a correlation-adjusted signal.

A preprocessed stereo downmix signal may be input to a multi-channel decoder. In order to provide multi-channel output compatible with object position information and playback configuration information set by an end user, not only a preprocessed downmix signal but also channel-based side information for performing multi-channel decoding is necessary. It will hereinafter be described in detail how to obtain channel-based side information by taking the above-mentioned example again. Preprocessed downmix signals L' and R' which are input to a multi-channel decoder, may be defined based on Equation (5), as indicated by Equation (12):

$$Eng_{L'}=Eng_{L\_L}+Eng_{R\_L}=0.7Eng_{Obj1}+0.3Eng_{Obj2}+0.5Eng_{Obj3}+0.5\,Eng_{Obj4}$$

$$Eng_{R'}=Eng_{L\_R}+Eng_{R\_R}=0.3Eng_{Obj1}+0.7Eng_{Ojb2}+0.5Eng_{Obj3}+0.5Eng_{Obj4} \quad \text{[Equation 12]}$$

The ratio at which each of first through fourth object signals OBJECT1 through OBJECT4 is distributed among FL, RL, C, FR and RR channels may be determined as indicated by Equation (13):

$$Eng_{FL}=0.3Eng_{Obj1}+0.1Eng_{Obj2}+0.2Eng_{Obj3}+0.21\cdot 100/95\cdot Eng_{Obj4}$$

$$Eng_{RL}=0.3Eng_{Obj1}+0.1Eng_{Obj2}+0.2Eng_{Obj3}+0.11\cdot 100/95\cdot Eng_{Obj4}$$

$$Eng_{C}=0.2Eng_{Obj1}+0.2Eng_{Obj2}+0.2Eng_{Obj3}+0.31\cdot 100/95\cdot Eng_{Obj4}$$

$$Eng_{FR}=0.1Eng_{Obj1}+0.3Eng_{Obj2}+0.2Eng_{Obj3}+0.21\cdot 100/95\cdot Eng_{Obj4}$$

$$Eng_{RR}=0.1Eng_{Obj1}+0.3Eng_{Obj2}+0.2Eng_{Obj3}0.11\cdot 100/95\cdot Eng_{Obj4} \quad \text{[Equation 13]}$$

Figure 27:
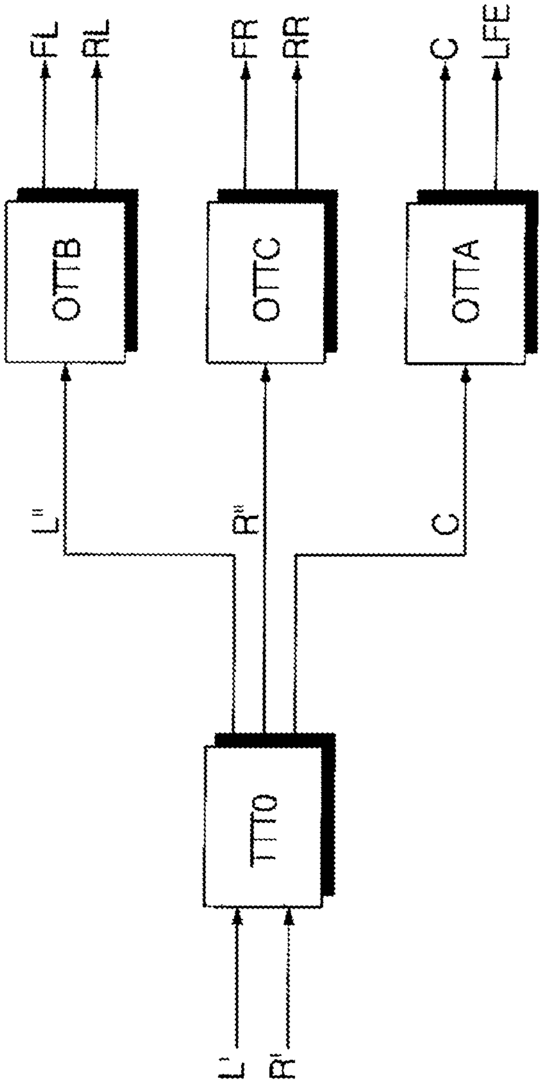

The preprocessed downmix signals L' and R' may be expanded to 5.1 channels through MPS, as illustrated in FIG. 27. Referring to FIG. 27, parameters of a TTT box TTT0 and OTT boxes OTTA, OTTB and OTTC may need to be calculated in units of parameter bands even though the parameter bands are not illustrated for convenience.

The TTT box TTT0 may be used in two different modes: an energy-based mode and a prediction mode. When used in the energy-based mode, the TTT box TTT0 needs two pieces of CLD information. When used in the prediction mode, the TTT box TTT0 needs two pieces of CPC information and a piece of ICC information.

In order to calculate CLD information in the energy-based mode, the energy ratio of signals L", R" and C of FIG. 27 may be calculated using Equations (6), (10), and (13). The energy level of the signal L" may be calculated as indicated by Equation (14):

$$
\begin{aligned}
Eng_{L''} &= Eng_{FL} + Eng_{RL} \\
&= 0.6Eng_{Obj1} + 0.2Eng_{Obj2} + 0.4Eng_{Obj3} + \\
&\quad 0.32 \cdot 100/95 \cdot Eng_{Obj4} \\
&= 0.6 \cdot \frac{1}{3} \cdot \frac{10^{\frac{CLD2}{10}}}{1 + 10^{\frac{CLD2}{10}}} \cdot \frac{10^{\frac{CLD1}{10}}}{1 + 10^{\frac{CLD1}{10}}} \cdot Eng_L + \\
&\quad 0.2 \cdot \frac{2}{5} \cdot \frac{10^{\frac{CLD2}{10}}}{1 + 10^{\frac{CLD2}{10}}} \cdot \frac{1}{1 + 10^{\frac{CLD1}{10}}} \cdot Eng_L + \\
&\quad 0.4 \cdot \frac{1}{1 + 10^{\frac{CLD2}{10}}} \cdot Eng_L + \\
&\quad 0.32 \cdot 100/95 \cdot \frac{1}{1 + 10^{\frac{CLD4}{10}}} \cdot Eng_R
\end{aligned}
\qquad \text{[Equation 14]}
$$

Equation (14) may also be used to calculate the energy level of R" or C. Thereafter, CLD information used in the TTT box TTT0 may be calculated based on the energy levels of signals L", R" and C, as indicated by Equation (15):

$$
\begin{aligned}
TTT_{CLD1} &= 10\log_{10}\left(\frac{Eng_{L''} + Eng_{R''}}{Eng_{C''}}\right) \\
TTT_{CLD2} &= 10\log_{10}\left(\frac{Eng_{C''}}{Eng_{R''}}\right)
\end{aligned}
\qquad \text{[Equation 15]}
$$

Equation (14) may be established based on Equation (10). Even though Equation (10) only defines how to calculate energy values for an L channel, energy values for an R channel can be calculated using Equation (10). In this manner, CLD and ICC values of third and fourth OTT boxes can be calculated based on CLD and ICC values of first and second OTT boxes. This, however, may not necessarily apply to all tree structures but only to certain tree structures for decoding object signals. Information included in an object bitstream may be transmitted to each OTT box. Alternatively, Information included in an object bitstream may be transmitted only to some OTT boxes, and information indicating OTT boxes that have not received the information may be obtained through computation.

Parameters such as CLD and ICC information may be calculated for the OTT boxes OTTA, OTTB and OTTC by using the above-mentioned method. Such multi-channel parameters may be input to a multi-channel decoder and then subjected to multi-channel decoding, thereby obtaining a multi-channel signal that is appropriately rendered according to object position information and playback configuration information desired by an end user.

The multi-channel parameters may include ADG parameter if the level of object signals have not yet been adjusted by preprocessing. The calculation of an ADG parameter will hereinafter be described in detail by taking the above-mentioned example again.

When a rendering matrix is established so that the level of a third object signal can be increased by 10 dB, that the level of a fourth object signal can be reduced by 5 dB, that the level of a third object signal component in L' can be increased by 10 dB, and that the level of a fourth object signal component in L' can be reduced by 5 dB, a ratio RatioADG, L' of energy levels before and after the adjustment of the levels of the third and fourth object signals may be calculated using Equation (16):

$$
Ratio_{ADG,L'} = \frac{Eng_{L'\_after}}{Eng_{L'\_before}} = \frac{\begin{array}{c} 0.7Eng_{Obj1} + 0.3Eng_{Obj2} + \\ 0.5 \cdot 10^{\frac{\boxed{5}}{10}} \cdot Eng_{Obj3} + 0.5 \cdot 10^{\frac{\boxed{-2.5}}{10}} \cdot Eng_{Obj4} \end{array}}{\begin{array}{c} 0.7Eng_{Obj1} + 0.3Eng_{Obj2} + \\ 0.5Eng_{Obj3} + 0.5Eng_{Obj4} \end{array}}
\qquad \text{[Equation 16]}
$$

The ratio $Ratio_{ADG,L}56$ may be determined by substituting Equation (10) into Equation (16). A ratio $Ratio_{ADG,R}56$ for an R channel may also be calculated using Equation (16). Each of the ratios $Ratio_{ADG,L}56$ and $Ratio_{ADG,R}56$ represents a variation in the energy of a corresponding parameter band due to the adjustment of the levels of object signals. Thus, ADG values ADG(L') and ADG(R') can be calculated using the ratios $Ratio_{ADG,L}56$ and $Ratio_{ADG,R}56$, as indicated by Equation (17):

$$
\begin{aligned}
ADG(L') &= 10\log_{10}(Ratio_{ADG,L'}) \\
ADG(R') &= 10\log_{10}(Ratio_{ADG,R'})
\end{aligned}
\qquad \text{[Equation 17]}
$$

Once the ADG parameters ADG(L') and ADG(R') are determined, the ADG parameters ADG(L') and ADG(R') are quantized by using an ADG quantization table, and the quantized ADG values are transmitted. If there is the need to further precisely adjust the ADG values ADG(L') and ADG (R'), the adjustment of the ADG values ADG(L') and ADG (R') may be performed by a preprocessor, rather than by an MPS decoder.

The number and interval of parameter bands for representing object signals in an object bitstream may be different from the number and interval of parameter bands used in a multi-channel decoder. In this case, the parameter bands of the object bitstream may be linearly mapped to the parameter bands of the multi-channel decoder. More specifically, if a certain parameter band of an object bitstream ranges over two parameter bands of a multi-channel decoder, linear mapping may be performed so that the certain parameter band of the object bitstream can be divided according to the ratio at which the corresponding parameter band is distributed between the two parameter bands of the multi-channel decoder. On the other hand, if more than one parameter band of an object bitstream is included in a certain parameter band of a multi-channel decoder, the values of parameters of the object bitstream may be averaged. Alternatively, parameter band mapping may be performed using an existing parameter band mapping table of the multi-channel standard.

When object coding is used for teleconferencing, the voices of various people correspond to object signals. An object decoder outputs the voices respectively corresponding to the object signals to certain speakers. However, when more than one person talks at the same time, it is difficult for an object decoder to appropriately distribute the voices of the people to different speakers through decoding, and the rendering of the voices of the people may cause sound distortions and deteriorate the quality of sound. In order to address this, information indicating whether more than one person talks at the same time may be included in a bitstream. Then, if it is determined based on the information that more than one person talks at the same time, a channel-based bitstream may be modified so that barely-decoded signals almost like downmix signals can be output to each speaker.

For example, assume that there are three people a, b and c and the voices of the three people a, b and c need to be decoded and thus to be output to speakers A, B and C, respectively. When the three people a, b and c talk at the same time, the voices of the three people a, b and c may all be included in a downmix signal, which is obtained by downmixing object signals respectively representing the voices of the three people a, b and c. In this case, information regarding parts of the downmix signal respectively corresponding to the voices of the three people a, b and c may be configured as a multi-channel bitstream. Then, the downmix signal may be decoded using a typical object decoding method so that the voices of the three people a, b and c can be output to the speakers A, B and C, respectively. The output of each of the speakers A, B and C, however, may be distorted and may thus have lower recognition rates than the original downmix signal. In addition, the voices of the three people a, b and c may not be properly isolated from one another. In order to address this, information indicating that the simultaneous utterances of the three people a, b and c talk may be included in a bitstream. Then, a transcoder may generate a multi-channel bitstream so that the downmix signal obtained by downmixing the object signals respectively corresponding to the voices of the three people a, b and c can be output to each of the speakers A, B and C as it is. In this manner, it is possible to prevent signal distortions.

In reality, when more than one person talks at the same time, it is hard to isolate the voice of each person. Therefore, the quality of sound may be higher when a downmix signal is output as it is than when the downmix signal is rendered so that the voices of different people can be isolated from one another and output to different speakers. For this, a transcoder may generate a multi-channel bitstream so that a downmix signal obtained from the simultaneous utterances of more than one person can be output to all speakers, or that the downmix signal can be amplified and then output to the speakers.

In order to indicate whether a downmix signal of an object bitstream originates from the simultaneous utterances of one or more persons, an object encoder may appropriately modify the object bitstream, instead of providing additional information, as described above. In this case, an object decoder may perform a typical decoding operation on the object bitstream so that the downmix signal can be output to speakers as it is, or that the downmix signal can be amplified, but not to the extent that signal distortions occur, and then output to the speakers.

3D information such as an HTRF, which is provided to a multi-channel decoder, will hereinafter be described in detail.

When an object decoder operates in a binaural mode, a multi-channel decoder in the object decoder also operates in the binaural mode. An end user may transmit 3D information such as an HRTF that is optimized based on the spatial positions of object signals to the multi-channel decoder.

More specifically, when there are two object signals, i.e., OBJECT 1 and OBJECT2, and the two object signals OBJECT 1 and OBJECT2 are disposed at positions 1 and 2, respectively, a rendering matrix generator or transcoder may have 3D information indicating the positions of the object signals OBJECT 1 and OBJECT2. If the rendering matrix generator has the 3D information indicating the positions of the object signals OBJECT 1 and OBJECT2, the rendering matrix generator may transmit the 3D information indicating the positions of the object signals OBJECT 1 and OBJECT2 to the transcoder. On the other hand, if the transcoder has the 3D information indicating the positions of the object signals OBJECT 1 and OBJECT2, the rendering matrix generator may only transmit index information corresponding to 3D information to the transcoder.

In this case, a binaural signal may be generated based on the 3D information specifying positions 1 and 2, as indicated by Equation (18):

$$L=Obj1*HRTF_{L,Pos1}+Obj2*HRTF_{L,Pos2}$$

$$R=Obj1*HRTF_{R,Pos1}+Obj2*HRTF_{R,Pos2} \quad \text{[Equation 18]}$$

A multi-channel binaural decoder obtains binaural sound by performing decoding on the assumption that a 5.1-channel speaker system will be used to reproduce sound, and the binaural sound may be represented by Equation (19):

$$L=FL*HRTF_{L,FL}+C*HRTF_{L,C}+FR*HRTF_{L,FR}+RL*HRTF_{L,RL}+RR*HRTF_{L,RR}$$

$$R=FL*HRTF_{R,FL}+C*HRTF_{R,C}+FR*HRTF_{R,FR}+RL*HRTF_{R,RL}+RR*HRTF_{R,RR} \quad \text{[Equation 19]}$$

An L-channel component of the object signal OBJECT1 may be represented by Equation (20):

$$L_{Obj1}=Obj1*HRTF_{L,Pos1}$$

$$L_{Obj1}=FL_{Obj1}*HRTF_{L,FL}+C_{Obj1}*HRTF_{L,C}+FR_{Obj1}*HRTF_{L,FR}+RL_{Obj1}*HRTF_{L,RL}+RR_{Obj1}*HRTF_{L,RR} \quad \text{[Equation 20]}$$

An R-channel component of the object signal OBJECT1 and L- and R-channel components of the object signal OBJECT2 may all be defined by using Equation (20).

For example, if the ratios of the energy levels of the object signals OBJECT1 and OBJECT2 to a total energy level are a and b, respectively, the ratio of part of the object signal OBJECT1 distributed to an FL channel to the entire object signal OBJECT1 is c and the ratio of part of the object signal OBJECT2 distributed to the FL channel to the entire object signal OBJECT2 is d, the ratio at which the object signals OBJECT1 and OBJECT2 are distributed to the FL channel is ac:bd. In this case, an HRTF of the FL channel may be determined, as indicated by Equation (21):

$$HRTF_{FL,L}=\frac{ac}{ac+bd}\cdot HRTF_{L,Pos1}+\frac{bd}{ac+bd}\cdot HRTF_{L,Pos2} \quad \text{[Equation 21]}$$

$$HRTF_{FL,R}=\frac{ac}{ac+bd}\cdot HRTF_{R,Pos1}+\frac{bd}{ac+bd}\cdot HRTF_{R,Pos2}$$

In this manner, 3D information for use in a multi-channel binaural decoder can be obtained. Since 3D information for use in a multi-channel binaural decoder better represents the actual positions of object signals, it is possible to more vividly reproduce binaural signals through binaural decoding using 3D information for use in a multi-channel binaural decoder than when performing multi-channel decoding using 3D information corresponding to five speaker positions.

As described above, 3D information for use in a multi-channel binaural decoder may be calculated based on 3D information representing the spatial positions of object signals and energy ratio information. Alternatively, 3D information for use in a multi-channel binaural decoder may be generated by appropriately performing decorrelation when adding up 3D information representing the spatial positions of object signals based on ICC information of the object signals.

Effect processing may be performed as part of preprocessing. Alternatively, the result of effect processing may simply be added to the output of a multi-channel decoder. In the former case, in order to perform effect processing on an object signal, the extraction of the object signal may need to be performed in addition to the division of an L-channel signal into L_L and L_R and the division of an R-channel signal into R_R and R_L.

More specifically, an object signal may be extracted from L- and R-channel signals first. Then, the L-channel signal may be divided into L_L and L_R, and the R-channel signal may be divided into R_R and R_L. Effect processing may be performed on the object signal. Then, the effect-processed object signal may be divided into L- and R-channel components according to a rendering matrix. Thereafter, the L-channel component of the effect-processed object signal may be added to L_L and R_L, and the R-channel component of the effect-processed object signal may be added to R_R and L_R.

Alternatively, preprocessed L' and R' channel signals may be generated first. Thereafter, an object signal may be extracted from the preprocessed L' and R' channel signals. Thereafter, effect processing may be performed on the object signal, and the result of effect processing may be added back to the preprocessed L' and R' channel signals.

The spectrum of an object signal may be modified through effect processing. For example, the level of a high-pitch portion or a low-pitch portion of an object signal may be selectively increased. For this, only a spectrum portion corresponding to the high-pitch portion or the low-pitch portion of the object signal may be modified. In this case, object-related information included in an object bitstream may need to be modified accordingly. For example, if the level of a low-pitch portion of a certain object signal is increased, the energy of the low-pitch portion of the certain object signal may also be increased. Thus, energy information included in an object bitstream does not properly represent the energy of the certain object signal any longer. In order to address this, the energy information included in the object bitstream may be directly modified according to a variation in the energy of the certain object signal. Alternatively, spectrum variation information provided by a transcoder may be applied to the formation of a multi-channel bitstream so that the variation in the energy of the certain object signal can be reflected into the multi-channel bitstream.

FIGS. 28 through 33 illustrate diagrams for explaining the incorporation of a plurality of pieces of object-based side information and a plurality of downmix signal into a piece of side information and a downmix signal. In the case of teleconferencing, it is necessary sometimes to combine a plurality of pieces of object-based side information and a plurality of downmix signal into side information and a downmix signal. In this case, a number of factors need to be considered.

Figure 28:
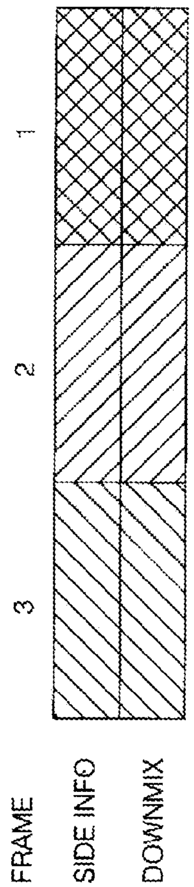
FIGS. 28 to 33 are diagrams illustrating a case of combining a plurality of bitstreams decoded with object-based signals into one bitstream.

FIG. 28 illustrates a diagram of an object-encoded bitstream. Referring to FIG. 28, the object-encoded bitstream includes a downmix signal and side information. The downmix signal is synchronized with the side information. Therefore, the object-encoded bitstream may be readily decoded without consideration of additional factors. However, in the case of incorporating a plurality of bitstreams into a single bitstream, it is necessary to make sure that a downmix signal of the single bitstream is synchronized with side information of the single bitstream.

Figure 29:
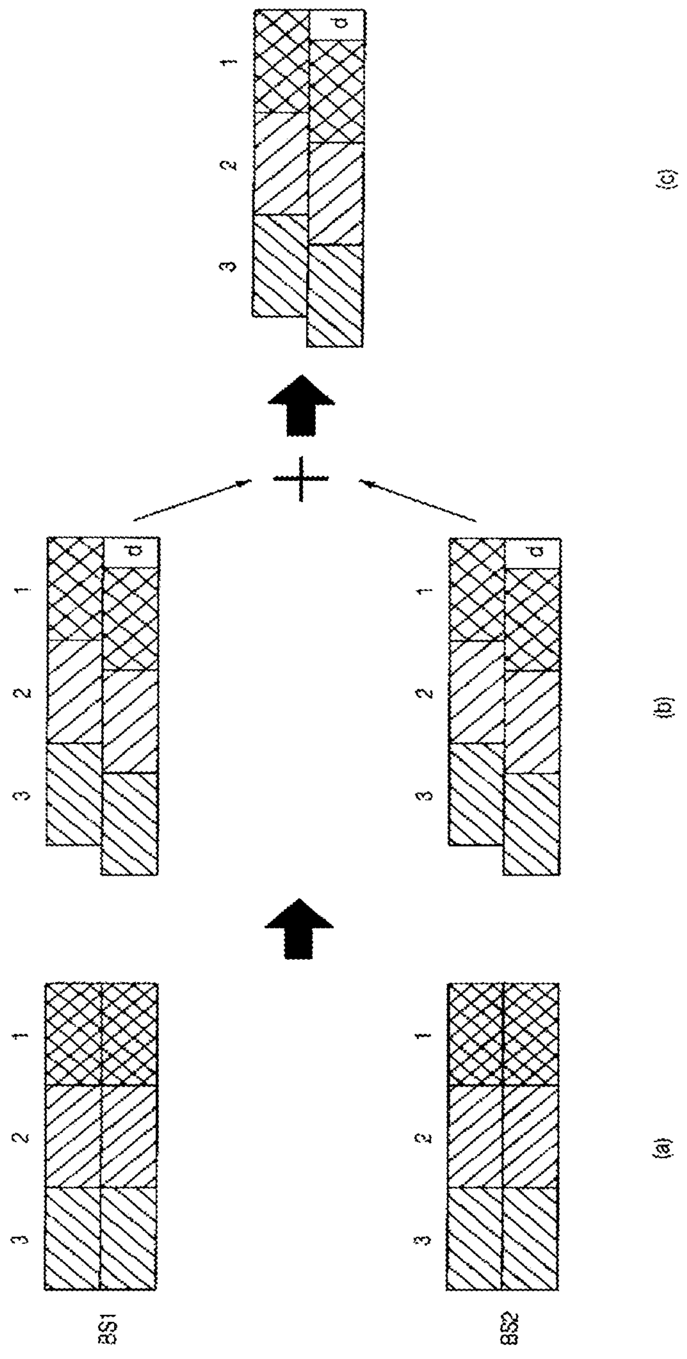

FIG. 29 illustrates a diagram for explaining the incorporation of a plurality of object-encoded bitstreams BS1 and BS2. Referring to FIG. 29, reference numerals 1, 2, and 3 indicate frame numbers. In order to incorporate a plurality of downmix signals into a single downmix signal, the downmix signals may be converted into pulse code modulation (PCM) signals, the PCM signals may be downmixed on a time domain, and the downmixed PCM signal may be converted to a compression codec format. During these processes, a delay d may be generated, as illustrated in FIG. 29(*b*). Therefore, when a bitstream to be decoded is obtained by incorporating a plurality of bitstreams, it is necessary to make sure that a downmix signal of a bitstream to be decoded is properly synchronized with side information of the bitstream to be decoded.

If a delay between a downmix signal and side information of a bitstream is given, the bitstream may be compensated for by a predetermined amount corresponding to the delay. A delay between a downmix signal and side information of a bitstream may vary according to the type of compression codec used for generating the downmix signal. Therefore, a bit indicating a delay, if any, between a downmix signal and side information of a bitstream may be included in the side information.

Figure 30:
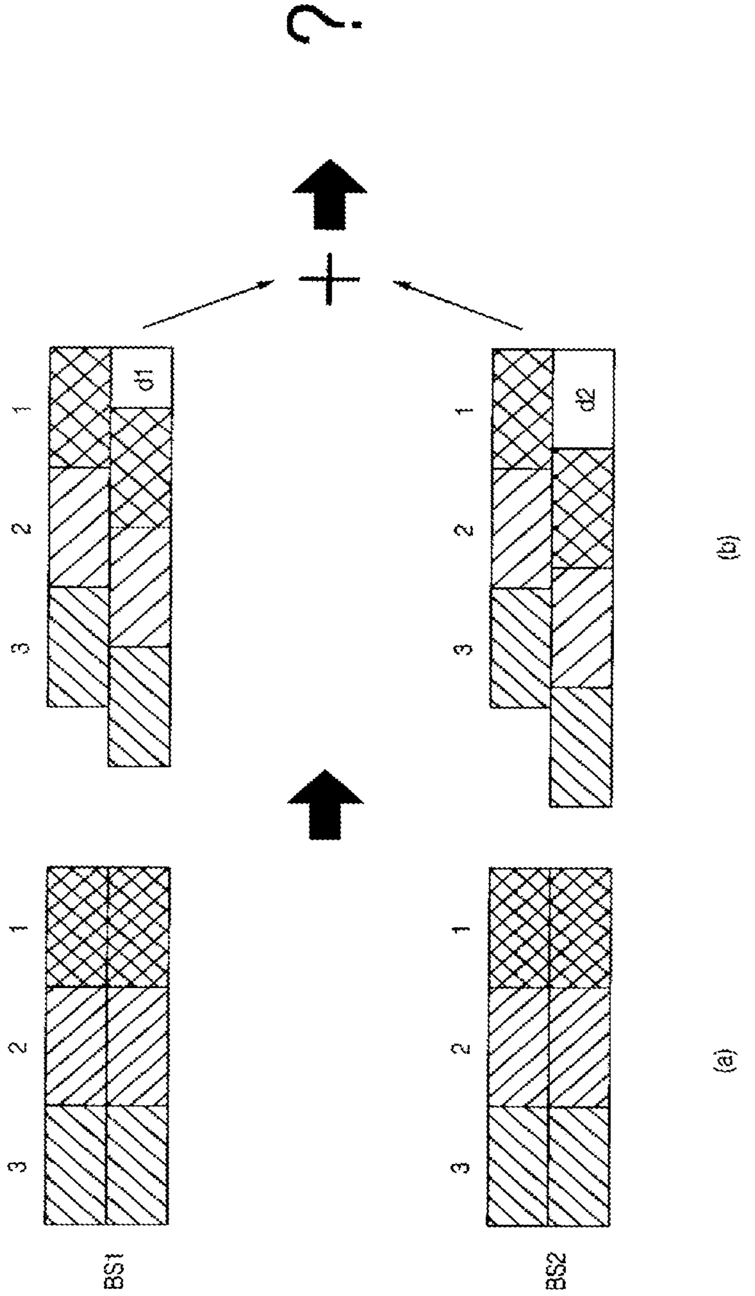
Figure 31:
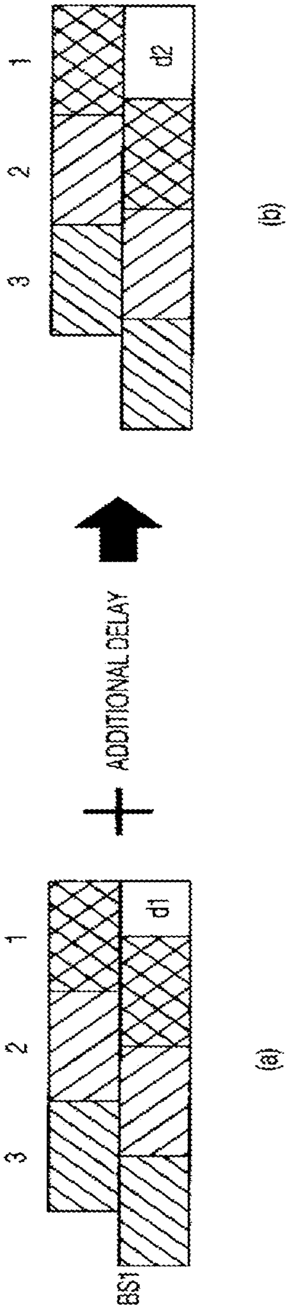

FIG. 30 illustrates the incorporation of two bitstreams BS1 and BS2 into a single bitstream when the downmix signals of the bitstreams BS1 and BS2 are generated by different types of codecs or the configuration of side information of the bitstream BS1 is different from the configuration of side information of the bitstream BS2. Referring to FIG. 30, when the downmix signals of the bitstreams BS1 and BS2 are generated by different types of codecs or the configuration of side information of the bitstream BS1 is different from the configuration of side information of the bitstream BS2, it may be determined that the bitstreams BS1 and BS2 have different signal delays d1 and d2 resulting from the conversion of downmix signals into time-domain signals and the conversion of the time-domain signals with the use of a single compression codec. In this case, if the bitstreams BS1 and BS2 are simply added up without consideration of the different signal delays, the downmix signal of the bitstream BS1 may be misaligned with the downmix signal of the bitstream BS2 and the side information of the bitstream BS1 may be misaligned with the side information of the bitstream BS2. In order to address this, the downmix signal of the bitstream BS1, which is delayed by d1, may be further delayed so as to be synchronized with the downmix signal of the bitstream BS2, which is delayed by d2. Then, the bitstreams BS1 and BS2 may be combined using the same method of the embodiment of FIG. 30. If there is more than one bitstream to be incorporated, whichever of the bitstreams has a greatest delay may be used as a reference bitstream, and then, the other bitstreams may be further delayed so to be synchronized with the reference bitstream. A bit indicating a delay between a downmix signal and side information may be included in an object bitstream.

Bit indicating whether there is a signal delay in a bitstream may be provided. Only if the bit information indicates that there is a signal delay in a bitstream, information specifying the signal delay may be additionally provided. In this manner, it is possible to minimize the amount of information required for indicating a signal delay, if any, in a bitstream.

Figure 32:
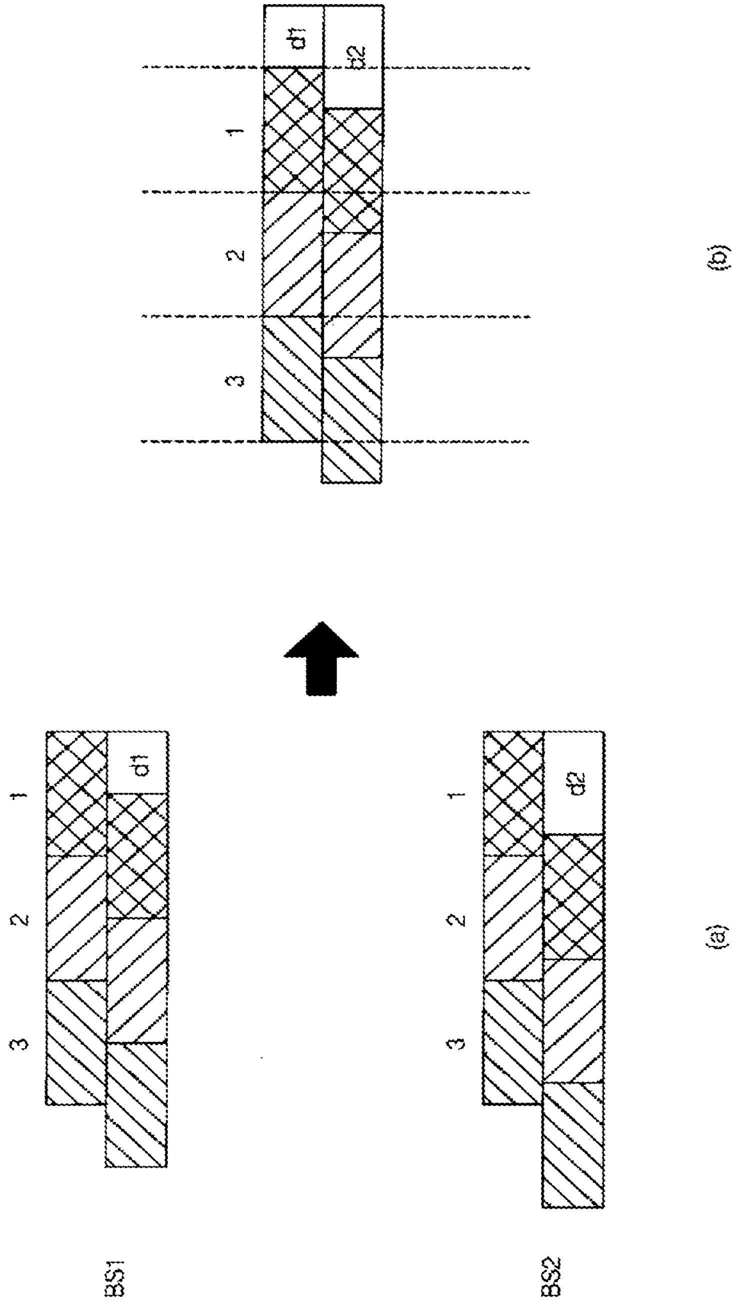

FIG. 32 illustrates a diagram for explaining how to compensate for one of two bitstreams BS1 and BS2 having different signal delays by the difference between the different signal delays, and particularly, how to compensate for the bitstream BS2, which has a longer signal delay than the bitstream BS1. Referring to FIG. 32, first through third frames of side information of the bitstream BS1 may all be used as they are. On the other hand, first through third frames of side information of the bitstream BS2 may not be used as they are because the first through third frames of the side information of the bitstream BS2 are not respectively synchronized with the first through third frames of the side information of the bitstream BS1. For example, the second frame of the side information of the bitstream BS1 corresponds not only to part of the first frame of the side information of the bitstream BS2 but also to part of the second frame of the side information of the bitstream BS2. The proportion of part of the second frame of the side information of the bitstream BS2 corresponding to the second frame of the side information of the bitstream BS1 to the whole second frame of the side information of the bitstream BS2 and the proportion of part of the first frame of the side information of the bitstream BS2 corresponding to the second frame of the side information of the bitstream BS1 to the whole first frame of the side information of the bitstream BS2 may be calculated, and the first and second frames of the side information of the bitstream BS2 may be averaged or interpolated based on the results of the calculation. In this manner, the first through third frames of the side information of the bitstream BS2 can be respectively synchronized with the first through third frames of the side information of the bitstream BS1, as illustrated in FIG. 32(*b*). Then, the side information of the bitstream BS1 and the side information of the bitstream BS2 may be incorporated using the method of the embodiment of FIG. 29. Downmix signals of the bitstreams BS1 and BS2 may be incorporated into a single downmix signal without a requirement of delay compensation. In this case, delay information corresponding to the signal delay d1 may be stored in an incorporated bitstream obtained by incorporating the bitstreams BS1 and BS2.

Figure 33:
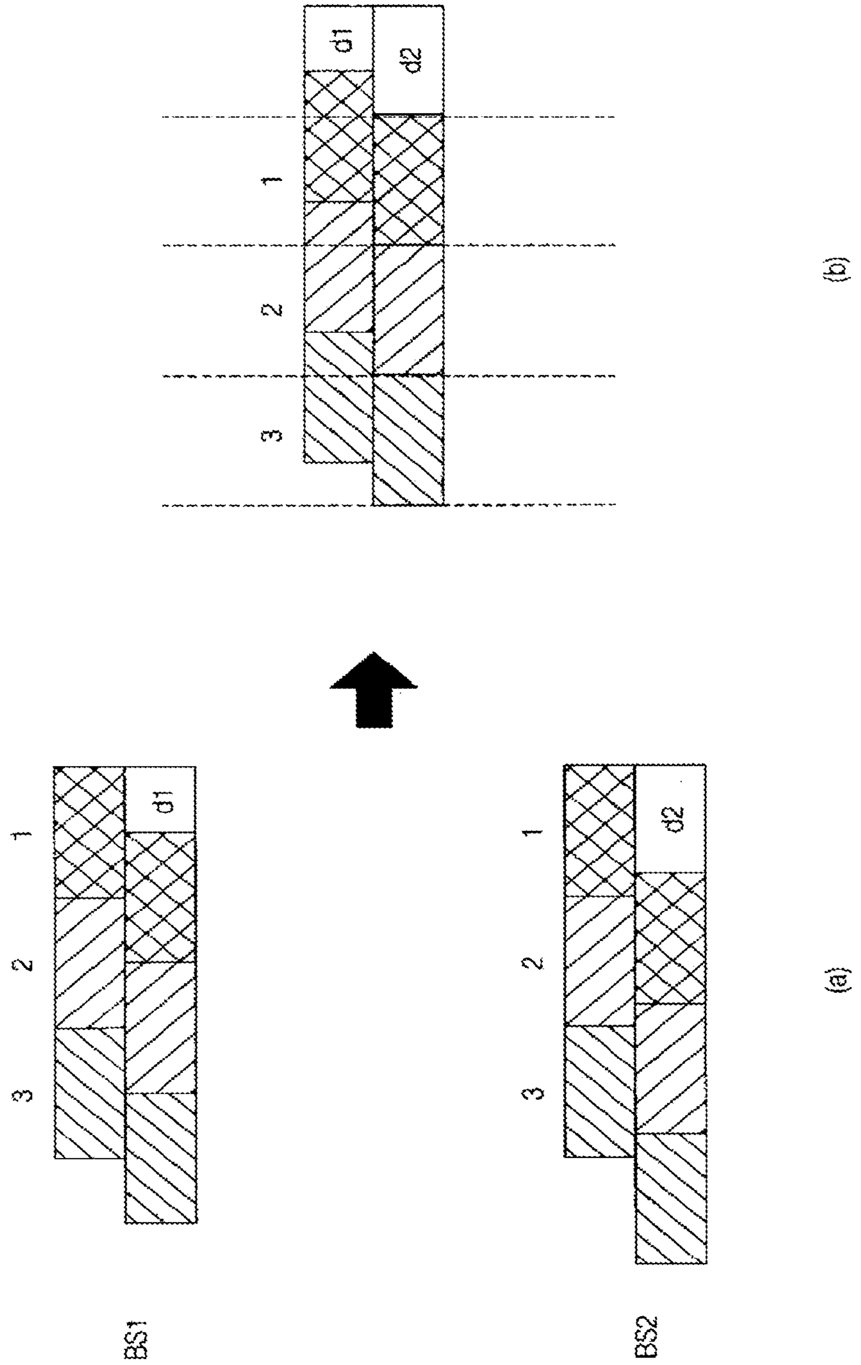

FIG. 33 illustrates a diagram for explaining how to compensate for whichever of two bitstreams having different signal delays has a shorter signal delay. Referring to FIG. 33, first through third frames of side information of the bitstream BS2 may all be used as they are. On the other hand, first through third frames of side information of the bitstream BS1 may not be used as they are because the first through third frames of the side information of the bitstream BS1 are not respectively synchronized with the first through third frames of the side information of the bitstream BS2. For example, the first frame of the side information of the bitstream BS2 corresponds not only to part of the first frame of the side information of the bitstream BS1 but also to part of the second frame of the side information of the bitstream BS1. The proportion of part of the first frame of the side information of the bitstream BS1 corresponding to the first frame of the side information of the bitstream BS2 to the whole first frame of the side information of the bitstream BS1 and the proportion of part of the second frame of the side information of the bitstream BS1 corresponding to the first frame of the side information of the bitstream BS2 to the whole second frame of the side information of the bitstream BS1 may be calculated, and the first and second frames of the side information of the bitstream BS1 may be averaged or interpolated based on the results of the calculation. In this manner, the first through third frames of the side information of the bitstream BS1 can be respectively synchronized with the first through third frames of the side information of the bitstream BS2, as illustrated in FIG. 33(*b*). Then, the side information of the bitstream BS1 and the side information of the bitstream BS2 may be incorporated using the method of the embodiment of FIG. 29. Downmix signals of the bitstreams BS1 and BS2 may be incorporated into a single downmix signal without a requirement of delay compensation, even if the downmix signals have different signal delays. In this case, delay information corresponding to the signal delay d2 may be stored in an incorporated bitstream obtained by incorporating the bitstreams BS1 and BS2.

If a plurality of object-encoded bitstreams are incorporated into a single bitstream, the downmix signals of the object-encoded bitstreams may need to be incorporated into a single downmix signal. In order to incorporate a plurality of downmix signals corresponding to different compression codecs into a single downmix signals, the downmix signals may be converted into PCM signals or frequency-domain signals, and the PCM signals or the frequency-domain signals may be added up in a corresponding domain. Thereafter, the result of the addition may be converted using a predetermined compression codec. Various signal delays may occur according to whether to the downmix signals are added up during a PCM operation or added up in a frequency domain and according to the type of compression codec. Since a decoder cannot readily recognize the various signal delays from a bitstream to be decoded, delay information specifying the various signal delays may need to be included in the bitstream. Such delay information may represent the number of delay samples in a PCM signal or the number of delay samples in a frequency domain.

The present invention can be realized as computer-readable code written on a computer-readable recording medium. The computer-readable recording medium may be any type of recording device in which data is stored in a computer-readable manner. Examples of the computer-readable recording medium include a ROM, a RAM, a CD-ROM, a magnetic tape, a floppy disc, an optical data storage, and a carrier wave (e.g., data transmission through the Internet). The computer-readable recording medium can be distributed over a plurality of computer systems connected to a network so that computer-readable code is written thereto and executed therefrom in a decentralized manner. Functional programs, code, and code segments needed for realizing the present invention can be easily construed by one of ordinary skill in the art.

As described above, according to the present invention, sound images are localized for each object signal by benefiting from the advantages of object-based audio encoding and decoding methods. Thus, it is possible to offer more realistic sounds during the playback object signals. In addition, the present invention may be applied to interactive games, and may thus provide a user with a more realistic virtual reality experience.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of decoding an audio signal, comprising:

receiving a downmix signal including at least two object signals, and object-based side information, wherein the object-based side information includes channel distribution ratio information indicating a gain ratio of the object signal contributing to each channel of the downmix signal;

calculating effect parameter for modifying a part of the at least two object signals being included in the downmix signal;

receiving control information indicating position or level of the object signal being included in the downmix signal;

generating preprocessing information for controlling position or level of the at least two object signals by using the channel distribution ratio information and the control information;

modifying spectrum of the part of the at least two object signals by applying the effect parameter to the part of the at least two object signal included in the downmix signal; and modifying the downmix signal by applying the preprocessing information to the downmix signal including the part of the at least two object signal.

2. The method of claim 1, further comprising:

generating channel-based side information based on the object-based side information and the control information; and generating a multi-channel audio signal based on the channel-based side information and the modified downmix signal, wherein the object-based side information includes at least one of object level difference information, inter object correlation information, and downmix gain information.

3. A non-transitory processor readable recording medium on which a program for executing the method cited in claim 1 in the processor is recorded.

4. An apparatus for decoding an audio signal, comprising:

a demultiplexer configured to extract a downmix signal and object-based side information from an input audio signal, the downmix signal comprising at least two downmix channel signals, wherein the object-based side information includes channel distribution ratio information indicating a gain ratio of the object signal contributing to each channel of the downmix signal;

a parameter converter configured to calculate effect parameter for modifying a part of the at least two object signals being included in the downmix signal, to receive control information being usable to control position and level of the at least one object signal in the downmix signal, and to generate modification information for modifying the at least one object signal in the downmix channel signals based on channel distribution ratio information and the control information; and a preprocessor configured to modify spectrum of the part of the at least two object signals by applying the effect parameter to the part of the at least two object signal included in the downmix signal and to modify the downmix signal by applying the preprocessing information to the downmix signal including the part of the at least two object signals.

5. The apparatus of claim 4, wherein the parameter converter further generates channel-based side information based on the object-based side information and the control information, and the apparatus further comprising:

a multi-channel decoder configured to generate a multi-channel audio signal based on the channel-based side information and the modified downmix signal, wherein the object-based side information includes at least one of object level difference information, inter object correlation information, and downmix gain information.

6. A non-transitory computer-readable recording medium having recorded thereon a computer program for executing an audio decoding method, the audio decoding method comprising:

receiving a downmix signal including at least two object signals, object-based side information, wherein the object-based side information includes channel distribution ratio information indicating a gain ratio of the object signal contributing to each channel of the downmix signal;

calculating effect parameter for modifying a part of the at least two object signals being included in the downmix signal;

receiving control information indicating position or level of the object signal being included in the downmix signal;

generating preprocessing information for controlling position or level of the at least two object signals by using the channel distribution ratio information and the control information;

modifying spectrum of the part of the at least two object signals by applying the effect parameter to the part of the at least two object signal included in the downmix signal; and modifying the downmix signal by applying the preprocessing information to the downmix signal including the part of the at least two object signals.

7. The non-transitory computer-readable medium of claim 6, further comprising:

generating channel-based side information based on the object-based side information and the control information; and generating a multi-channel audio signal based on the channel-based side information and the modified downmix signal, wherein the object-based side information includes at least one of object level difference information, inter object correlation information, and downmix gain information.

* * * * *